United States Patent
Langer et al.

(10) Patent No.: US 12,098,455 B2
(45) Date of Patent: Sep. 24, 2024

(54) METHODS, DEVICES, AND CODE FOR CONTROLLING A COATING PROCESS

(71) Applicant: VON ARDENNE Asset GmbH & Co. KG, Dresden (DE)

(72) Inventors: Martin Langer, Dresden (DE); Ralf Biedermann, Dresden (DE); Damir Muchamedjarow, Bannewitz OT Haenichen (DE)

(73) Assignee: VON ARDENNE Asser GmbH &Co. KG, Dresden (DE)

(*) Notice: Subject to any disclaimer, the term of this patent is extended or adjusted under 35 U.S.C. 154(b) by 383 days.

(21) Appl. No.: 17/480,156

(22) Filed: Sep. 21, 2021

(65) Prior Publication Data

US 2022/0090254 A1 Mar. 24, 2022

(30) Foreign Application Priority Data

Sep. 24, 2020 (DE) ...................... 10 2020 124 936.5

(51) Int. Cl.
*C23C 14/00* (2006.01)
*C23C 14/54* (2006.01)

(52) U.S. Cl.
CPC .......... *C23C 14/0042* (2013.01); *C23C 14/54* (2013.01)

(58) Field of Classification Search
CPC . C23C 14/0036; C23C 14/0042; C23C 14/54; C23C 16/52; G05B 17/00;
(Continued)

(56) References Cited

U.S. PATENT DOCUMENTS

2002/0017238 A1* 2/2002 Shinozaki ............. B05C 5/0258
118/668
2002/0088393 A1* 7/2002 Kitano .................. B05C 5/0291
118/305
(Continued)

FOREIGN PATENT DOCUMENTS

CN 103930972 A 7/2014
CN 208949399 U 6/2019
(Continued)

OTHER PUBLICATIONS

Chinese Office Action for corresponding Chinese patent application No. CN 202111043737.8, dated Sep. 28, 2023, 12 pages (for informational purpose only).
(Continued)

*Primary Examiner* — Kidest Bahta
(74) *Attorney, Agent, or Firm* — VIERING, JENTSCHURA & PARTNER mbB

(57) ABSTRACT

The instant disclosure relates to methods, devices, and code for controlling a coating process and, in particular, for controlling a coating process of a substrate. According to various embodiments, the method may include driving a first actuator that supplies the coating process, which is based on monitored process variables that are detected in parallel with one another. The control variables may be considered when driving the first actuator. The method may also include driving a second actuator that supplies the coating process, which is based on the detected monitored process variables. The detected monitored process variables may also be considered when driving the second actuator.

19 Claims, 23 Drawing Sheets

(58) Field of Classification Search
CPC ...... G05B 19/042; G06N 20/00; G06N 3/045; G06N 3/084; H01J 37/3299
See application file for complete search history.

(56) References Cited

U.S. PATENT DOCUMENTS

| | | | |
|---|---|---|---|
| 2004/0097063 A1* | 5/2004 | Sakuma | C23C 16/52 438/616 |
| 2012/0193219 A1 | 8/2012 | Linss | |
| 2012/0276282 A1* | 11/2012 | Hoffmann | C23C 14/12 118/712 |
| 2013/0068622 A1* | 3/2013 | Schertzer | G01N 27/04 204/600 |
| 2013/0092243 A1 | 4/2013 | Mohammed et al. | |
| 2018/0065186 A1* | 3/2018 | Cullinan | H01L 23/4985 |
| 2018/0185848 A1* | 7/2018 | Norton | B01L 3/502792 |
| 2019/0093213 A1 | 3/2019 | Pollack et al. | |
| 2019/0155158 A1* | 5/2019 | Kiyotomi | G03F 7/42 |
| 2019/0226092 A1 | 7/2019 | Mosshammer | |
| 2020/0090968 A1 | 3/2020 | Van Selow | |
| 2020/0201290 A1 | 6/2020 | Bischoff et al. | |
| 2020/0392617 A1 | 12/2020 | Faucillon et al. | |
| 2021/0062327 A1 | 3/2021 | Biedermann et al. | |
| 2021/0072731 A1 | 3/2021 | Lauffer | |
| 2022/0045312 A1* | 2/2022 | Sauer | H01M 4/0435 |

FOREIGN PATENT DOCUMENTS

| | | |
|---|---|---|
| CN | 110055510 A | 7/2019 |
| CN | 111670264 A | 9/2020 |
| CN | 111684104 A | 9/2020 |
| DE | 102011017583 A1 | 8/2012 |
| DE | 102013109973 A1 | 3/2015 |
| DE | 102019123410 A1 | 3/2021 |
| WO | 2019002349 A1 | 1/2019 |

OTHER PUBLICATIONS

German Search Report based on application No. 10 2020 124 936.5 (8 pages) dated Apr. 30, 2021 (for Reference Purpose Only).

* cited by examiner

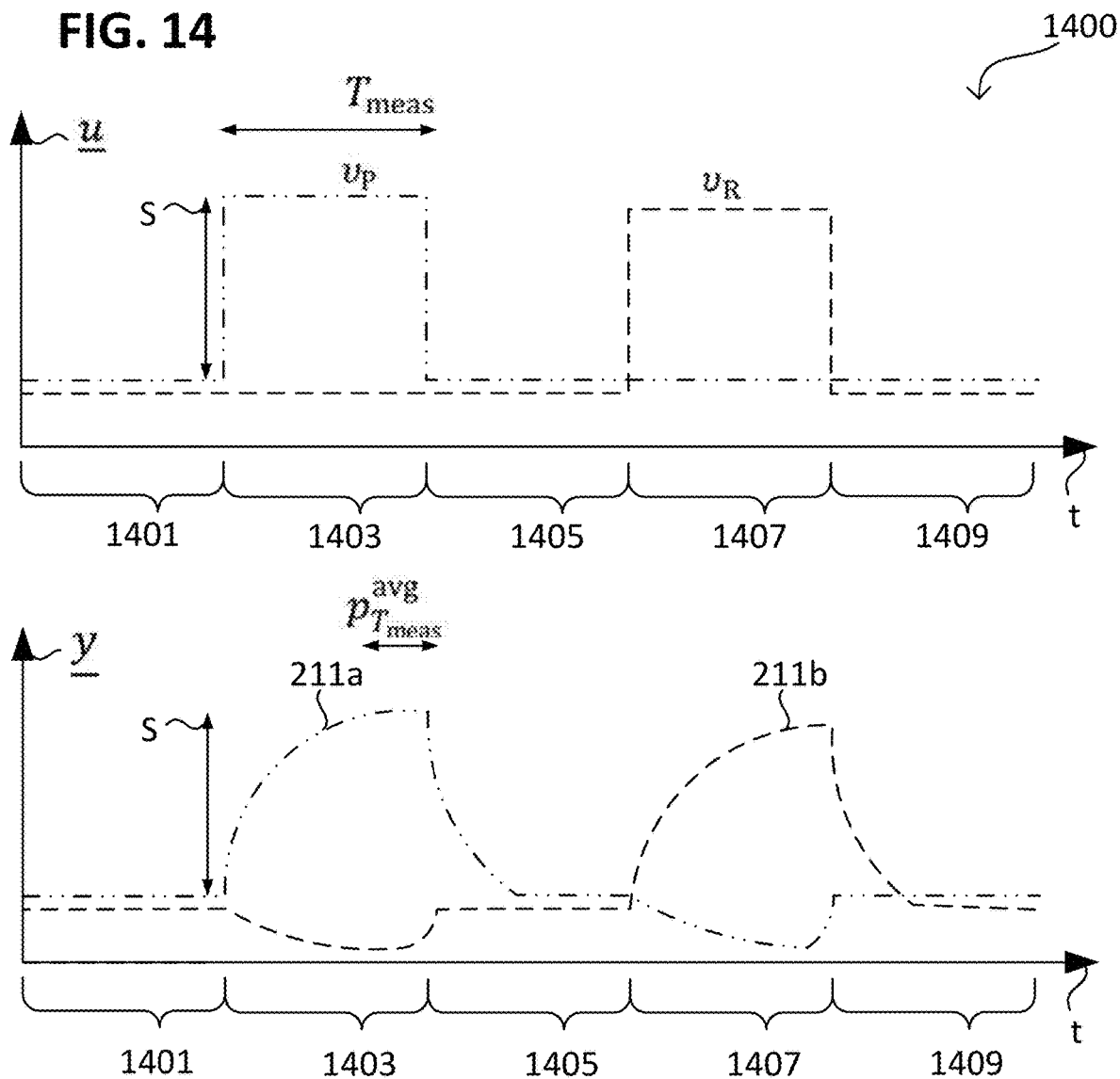

FIG. 19
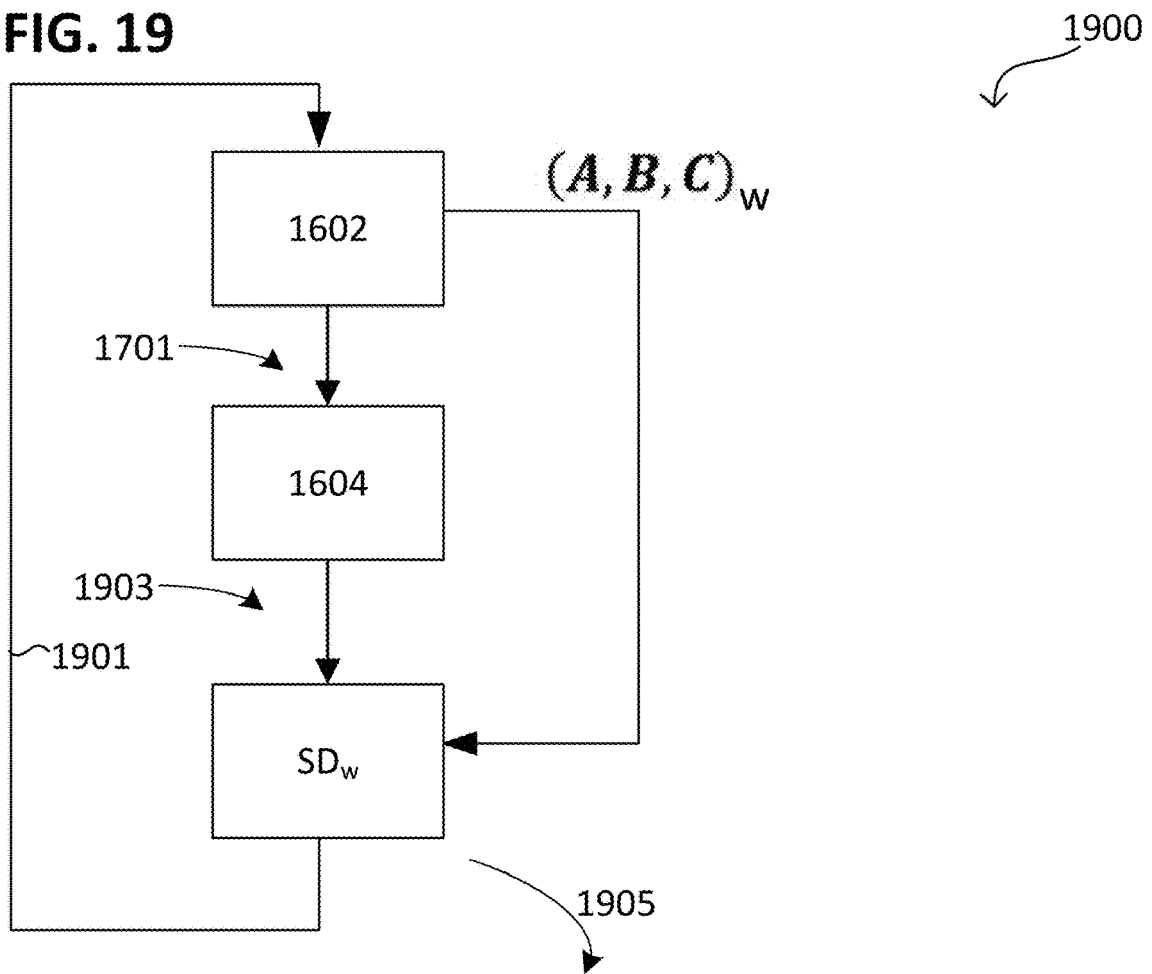
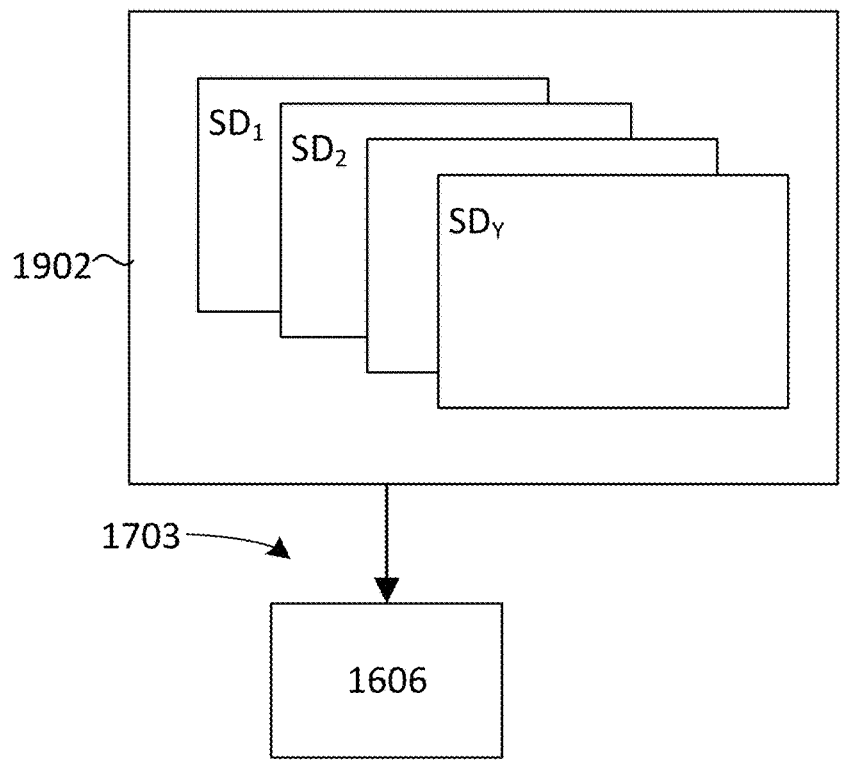

METHODS, DEVICES, AND CODE FOR CONTROLLING A COATING PROCESS

PRIORITY

This application claims priority to provisional German patent application number 10 2020 124 936.5, filed Sep. 24, 2020, which is incorporated herein by reference in its entirety.

TECHNICAL FIELD

The present disclosure relates to methods, devices, and code for controlling deposition of layers onto a substrate.

BACKGROUND

In general, a coating process may be used to deposit a layer onto a substrate. The coating process may be carried out, for example, by means of a physical vapor deposition, such as by cathode sputtering. Variations of cathode sputtering include, for example, reactive sputtering and reactive magnetron sputtering. In reactive sputtering, a working gas (e.g., Argon) is first used to atomize the cathode (the target material), and the working gas is not incorporated into the layer deposited on the substrate. Next, at least one reactive gas is added with which the atomized target material (also referred to as the coating material) chemically reacts so that the product of the reaction is then deposited on the substrate.

In sputtering, coating a substrate with a layer may be accomplished by bringing and/or maintaining the sputtering assembly at an operating point in order to obtain a layer with the desired properties. The operating point may define a set of operating parameters of the sputtering arrangement, the interaction of which affects the properties of the layer.

In contrast to sputtering without a reactive gas, which generally operates in a predictable and relatively stable manner (for example, without the need for further control mechanisms or with only minor intervention), sputtering that involves a reactive gas (also referred to as reactive magnetron sputtering) may require appropriate control techniques and control equipment in order to govern the complex interplay of operating parameters. For some coating materials, this interplay is particularly sensitive because, for example, on the one hand, the desired coating properties are only achieved within a narrow range of stoichiometry and, on the other hand, the reaction dynamics are often unstable (e.g. bistable). Unstable reaction dynamics may, for example, tend to deviate from the desired operating point independently and/or oscillate between two self-regulated (stable) reaction modes.

However, controlling the reaction dynamics becomes more difficult as the coating process becomes more complex, as it interacts more with other aspects of the coating processes, and as the level of acceptable variation becomes smaller. For example, for each coating process, it may be necessary to simultaneously control multiple monitored process variables and multiple actuator controlling variables, while counteracting multiple disturbance variables. These variables span a multidimensional state space, which becomes increasingly difficult to access analytically as the number of independent dimensions increases. In addition, there is a high degree of implicit interactions that are difficult to break down experimentally, so this state space is nearly impossible to simplify.

For a highly productive coating system, for example, multiple identical coating processes may be carried out in succession so that the substrate is coated faster and/or with a thicker layer. If the space requirement needs to be reduced, the gas separation between the coating processes may be reduced. The lower the gas separation, the more the coating processes may influence each other, so that their control loops act on each other as disturbance variables, which makes it difficult to control the reaction dynamics, despite a closed-loop control.

In the simplest case, this complexity may be overcome by using an individual control loop for each monitored process variable (e.g., each being a sensed process variable, detected process variable, controlled process variable, and/or a measured process variable). Such individual control loops operate completely independently of each other, i.e. their input and output span disjoint hypersurfaces in the state space. This approach illustratively decomposes the state space into individual two-dimensional subspaces that are easier to control, and may therefore be easily predicted based on the fact that the input/output of multiple control loops is completely independent of each other. As a consequence, all process-related interactions are treated as disturbance variables, so that multiple control loops may work against each other, i.e. try to compensate for their influence on each other.

An individual control loop may be implemented with a programmable logic controller (PLC), and a PLC may even be able to implement multiple such control loops. A so-called "PID" controller (proportional-integral-derivative controller) used for this purpose feeds back the control deviation by means of a P control element (proportional control element), an I control element (integral control element) and a D control element (derivative control element). However, the configuration of the individual control elements is often done by trial and error and often requires consolidated empirical values.

Alternatively, this complexity may be addressed by adding boundary conditions that prune the state space or simply merge multiple degrees of freedom.

SUMMARY OF THE INVENTION

The methods, devices, and code discussed below for controlling deposition of layers onto a substrate improves on the above-described conventional approaches. In contrast to conventional approaches that may be inaccurate and/or prone to over/under control of the process the methods, devices, and code discussed below, according to various embodiments, improve the control of one or more coating processes, e.g., by making the control more accurate, less prone to over/under control, requiring less computing power, and easier to calibrate (e.g., automated). A corresponding controller may be implemented and/or calibrated by means of the methods, devices, and code discussed below.

According to various embodiments, multiple actuators, used to supply the same coating, are controlled in parallel to one another, based on a group of monitored process variables (the group having multiple monitored process variables) of the reactive coating process. In various embodiments, the controller may map a multi-dimensional vector as input variable, whose vector components have, or at least (e.g. uniquely) represent, the monitored process variables, onto a multi-dimensional vector as output variables, whose vector components have, or at least (e.g. uniquely) represent, the actuator controlling variables. Each of the actuator controlling variables determined in this way is then fed to a corresponding actuator from a group of actuators that supply the coating process, so that the group of actuators may influence the coating process. This ensures that each monitored process variable is considered when controlling each actuator and/or that the interaction of the multiple monitored process variables with each other is also considered.

According to various embodiments, the methods, devices, and code discussed below provide control of one monitored process variable (single-in single-out, "SISO") or multiple monitored process variables (multiple-in multiple-out, "MIMO"), e.g., process voltage and/or total pressure that is provided in one or more vacuum-based (e.g., reactive) sputtering processes, e.g., with the aid of a method for automatically calibrating the controller to allow for automatic adjustment of the controller.

The controller provided in this way may be used, for example, to control a group of coating processes (also referred to as a process group), taking into account that these coating processes are coupled to each other, e.g. gas flows in adjacent chambers and any possible upswing effects. As a further aspect, also disclosed is the integration of the controller for the total pressure per vacuum chamber.

The disclosed controller is also more easily scalable, e.g., by extending this to more input variables, e.g., to one working gas and two reactive gases, and/or to more coating processes.

The disclosed controller may, but does not necessarily have to, be implemented by means of only one controller hardware (e.g. having only one power supply) for a group of coating processes in multiple processing chambers. The coupling of multiple coating processes among each other is considered according to various embodiments. Automated calibration without expert knowledge is possible, whereby the dynamics of the resulting controller may be robust and efficient. The controller is future-proof or expandable, e.g. by means of an extension to additional reactive gases or the introduction of a state observer.

A model of the controlled system (also referred to as a controlled system model) for one or more vacuum chambers or the coating process carried out per vacuum chamber is disclosed. Based on the controlled system model, controller matrices of a PI-output controller (proportional-integral controller) are calculated by means of the detection of one or more step responses (e.g. a series of step responses) within the framework of systematic individual experiments and by means of numerical methods and implemented by means of corresponding controller hardware. An autotuning algorithm with preset parameters may provide a robust and efficient controller, using automated experiments and numerical methods and taking into account the hardware cycle time.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the disclosed aspect of the disclosure. In the following description, various embodiments are described with reference to the following drawings, in which:

FIG. 14 shows a time sequence according to the process according to various embodiments in a schematic diagram;

FIGS. 19 and 20 each show a process according to different embodiments in a schematic flowchart;

DESCRIPTION

Figure 1:
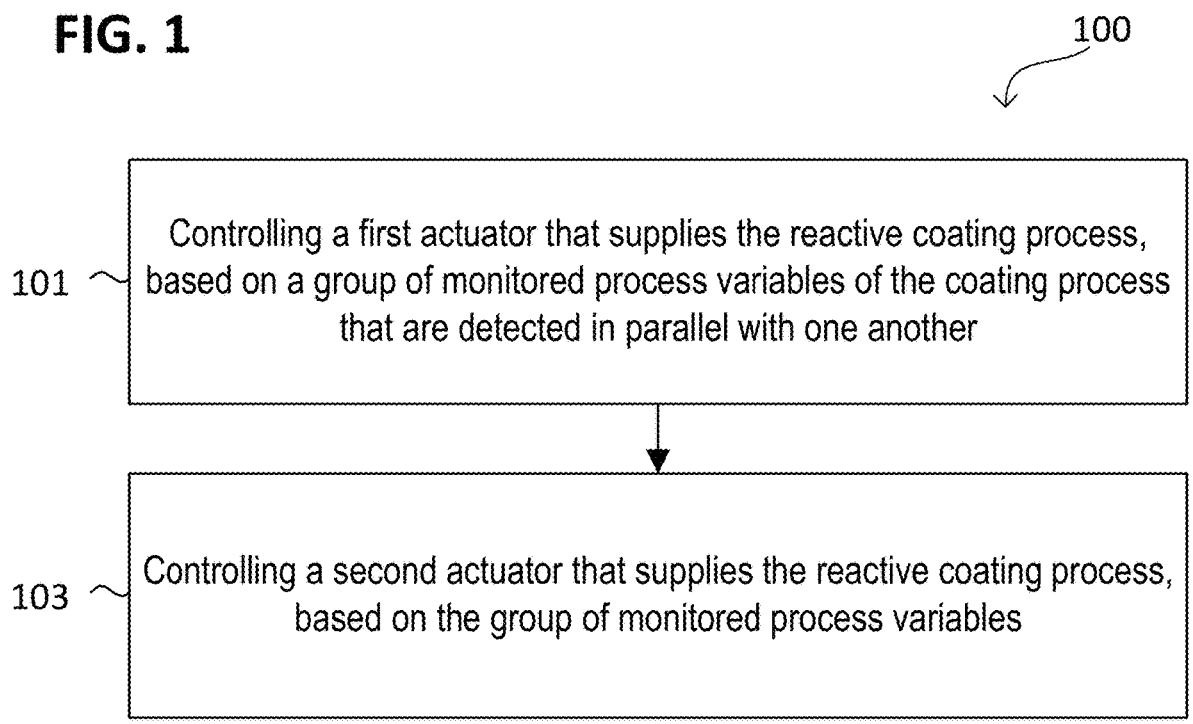
FIG. 1 depicts a process according to various embodiments in a schematic flowchart.

In the following detailed description, reference is made to the accompanying drawings which form a part thereof and in which are shown, for illustrative purposes, specific embodiments in which the invention may be practiced. In this regard, directional terminology such as "top," "bottom," "front," "rear," etc. is used with reference to the orientation of the figure(s) described. Since components of embodiments may be positioned in a number of different orientations, the directional terminology is for illustrative purposes and is not limiting in any way. It is understood that other embodiments may be used and structural or logical changes may be made without departing from the scope of protection of the present disclosure. It is understood that the features of the various exemplary embodiments described herein may be combined, unless otherwise specifically indicated. Therefore, the following detailed description is not to be construed as limiting, and the scope of protection of the present disclosure is defined by the appended claims.

In the context of this description, the terms "connected," "attached," and "coupled" are used to describe both a direct and an indirect connection (e.g. ohmic and/or electrically conductive, e.g. an electrically conductive connection), a direct or indirect attachment, as well as a direct or indirect coupling. In the figures, identical or similar elements are given identical reference signs where appropriate.

According to various embodiments, the term "coupled" or "coupling" may be understood in the sense of a (e.g. mechanical, hydrostatic, thermal and/or electrical), e.g. direct or indirect, connection and/or interaction. For example, multiple elements may be coupled together along an interaction chain along which the interaction (e.g., a signal) may be transmitted. For example, two coupled elements may interact with each other, such as by a mechanical, hydrostatic, thermal, and/or electrical interaction. According to various embodiments, "coupled" may be understood in the sense of a mechanical (e.g., physical or physical) coupling, e.g., by means of direct physical contact.

A coupling may be configured to transmit a mechanical interaction (e.g., force, torque, etc.).

Control should be understood as an intended influencing of a system. The current state of the system (also referred to as the actual state) may be changed in accordance with a target (also referred to as the target state). Control should be understood as steering (or driving), where additionally a change of state of the system is counteracted by disturbances. To be clear, the control system may have a forward control path (e.g., feed-forward control) and thus implement a sequence control that converts an input variable (e.g., the target) into an output variable. However, the control path may also be part of a control loop, so as to implement a closed-loop control. In contrast to a purely feed-forward control, the closed-loop control has an output variable that has continuous influence on the input variable, which is created by the closed-loop control (also called feedback or a feedback loop). The state of the system (also called operating point) may be represented by one or more monitored process variables of the system, whose actual value represents the actual state of the system and whose setpoint value (also called command value, target value, or desired value) represents the setpoint state (also called the desired state) of the system. In a closed-loop control system, an actual state of the system (e.g. determined based on a measurement) is compared with the desired state of the system and the one or more monitored process variables are influenced by means of one or more corresponding actuator controlling variables or using one or more actuators so as to minimize the deviation of the actual state from the desired state of the system.

For example, the system to be controlled may have one or more coating processes. The state of the system may thus represent the state of each coating process of the system and vice versa. The actual state of each coating process may be sensed using a sensing element (e.g., having one or more sensors). One or more sensors may be used per monitored process variable, which is configured to detect a variable (also referred to as a measured variable) that represents the monitored process variable or that is the monitored process variable.

A sensor (also referred to as a measurer or detector) should be understood as a transducer which is configured to detect as a measured variable a property of its environment (e.g. a physical property, a chemical property and/or a material property) corresponding to the sensor type (e.g. qualitative or quantitative). The measured variable is the physical quantity of that which the sensor is designed to measure. Depending on the complexity of the environment to be measured by the sensor, the sensor may be configured to be able to distinguish only between two states of the measured variable (also referred to as a measurement switch), to be able to distinguish between more than two states of the measured variable, or to detect the measured variable quantitatively. An example of a quantitatively detected measured variable is, for example, a fluid flow rate (e.g., flow rate) whose actual state may be detected as a value by means of the sensor.

A sensor may be part of a measurement chain, which has a corresponding infrastructure (e.g. including a processor, a storage medium, and/or a communications bus, etc.). The measurement chain may be configured to control the corresponding sensor (e.g. a gas sensor, a pressure sensor, and/or a voltage sensor), to process its detected measured variable as an input variable and, based on this, to provide an electrical signal as an output variable which represents the input variable. The measurement chain may be or is implemented by means of a control device, for example.

According to various embodiments, a multivariable control may be provided that controls one coating process or a process group of multiple (e.g., N) coating processes collectively and interrelatedly (where, for example, N>1, N>5, or N>10). The multiple coating processes may, for example, match in their coating material, their reactive gas, and/or their type of coating device (e.g., thermal or atomizing). Each coating process may be configured to coat at least one substrate (i.e., one substrate or multiple substrates) according to various embodiments.

In the following, reference is made to, among other things, a reactive coating processes in which a chemical reaction occurs. For example, one or more of the coating processes may include a reactive sputtering process that is provided with one or more reactive gases (e.g., m reactive gases) that forms a chemical bond with the target material that is deposited on a substrate (where, for example, m=1, m>1, or m>2). It should be understood that the coating process does not necessarily have to be reactive. The quantities, which, for a reactive coating process, may incorporate materials involved in the chemical reaction, and, for a non-reactive coating process, may incorporate other materials not involved in the corresponding chemical reaction. Accordingly, what is described for the reactive coating process may apply by analogy to a non-reactive coating process.

According to various embodiments, reference is made to a physical vapor deposition (PVD) as an exemplary coating process, e.g., including a sputtering process. It may be understood that what is described for PVD may apply by analogy to a chemical vapor deposition (CVD). In contrast to CVD, in PVD a solid material is first transferred to the gas phase (also referred to as a gaseous phase or a vapor) and a layer is formed by means of this gas phase. The gaseous phase of the target material in PVD may optionally be chemically reacted with a reactive gas to form a chemical compound, which is incorporated into or forms the layer. Thus, in the chemical reaction of PVD, two or more materials are combined to form the chemical compound.

In chemical vapor deposition, a gaseous starting compound (also referred to as precursor or reactant) is split into at least two reaction products, of which at least one reaction product is incorporated into the layer and, optionally, one reaction product is withdrawn as excess from the coating process (e.g. by means of a pump). Optionally, the CVD may be carried out by means of a plasma in which the precursor is broken down.

A plasma may be formed by means of a working gas. According to various embodiments, the working gas may include a gaseous material that is inert, in other words one that participates in few or no chemical reactions. For example, a working gas may be or become defined by and adapted to the target material used. For example, a working gas may include a gas or gas mixture that does not react with the target material to form a solid. For example, the working gas may include a noble gas (e.g., helium, neon, argon, krypton, xenon, radon) or a plurality of noble gases. The working gas may be used to form the plasma, which, for example, essentially causes the target material to be atomized. If a reactive gas is used, it may have a higher chemical reactivity than the working gas, for example with respect to the target material. In other words, the atomized target material may react faster together with the reactive gas (i.e., form more reaction product per time) than together with the working gas (e.g., if it reacts chemically with the working gas at all). The reactive gas and the working gas may be supplied together or separately as a process gas (e.g., as a gas mixture), for example, by means of the gas supply device.

The reactive gas may include a gaseous material that may react with the target material (e.g., the atomized target material) and/or be incorporated into the deposited layer by means of a chemical reaction. For example, if a target material that may form a nitride (e.g., aluminum nitride) is used, or if a nitride of the target material is to be deposited, the reactive gas may include or be formed from nitrogen. For example, if a target material capable of forming an oxide (e.g., aluminum oxide) is used, or if an oxide of the target material is to be deposited, the reactive gas may include or be formed from oxygen. For example, the reactive gas may include or be formed from a gas mixture (reactive gas mixture) of a plurality of gases that react with the target material and/or the deposited layer, e.g., oxygen and nitrogen, e.g., if an oxynitride (e.g., aluminum oxynitride) is to be deposited. For example, the reactive gas mixture may include predominantly (i.e., more than 50%) oxygen, e.g., for depositing an oxide or oxynitride. Examples of the reactive gas include: molecular oxygen, molecular nitrogen, nitrogen oxide, carbon oxide, hydrogen sulfide, methane, gaseous hydrocarbon, molecular fluorine, molecular chlorine, ozone, or other gaseous material.

The reactive sputtering process may include sputtering (atomizing) the target material by means of the working gas and forming a chemical compound (in other words, the reaction product) with the supplied reactive gas, e.g., a metal compound or a semimetal compound, which may be deposited on a substrate, for example.

Basically, coating processes may be divided into two types with regard to their reaction dynamics, namely coating processes of the stable type (also referred to as stable coating processes) and coating processes of the unstable type (also referred to as unstable coating processes). In a stable coating process, the monitored process variable always assumes that the actual state of the coating process will respond with the same variation as compared to a reference state. In other words, the actual state of the monitored process variable (also referred to as the actual monitored process variable) is a function of the reference state and the magnitude of the deviation. In an unstable coating process, in response to a variation from the reference state, the actual state of the monitored process variable either (i) depends on influencing factors, such as the history of the coating process or along which trajectory the deviation occurs, or (ii) always assumes an actual state from the same finite set of states (also referred to as stable operating points), regardless of the deviation or the reference state.

In the following, reference is made to a method including the control of one or more actuators. In this context, reference is also made to a control device or code segments. The control device may be configured to implement one or more of the methods described herein. To this end, the control device may include a processor configured to implement the respective method. For example, the processor may be configured to issue corresponding instructions. Alternatively or additionally, the processor may be configured to receive and process corresponding instructions. These instructions may be implemented, for example, by means of code segments stored on a non-volatile data memory. For example, the code segments may include instructions which, when executed by the processor, cause the processor to perform one of the methods.

The term "control device" should be understood as any type of logic implementing entity that may, for example, have circuitry and/or a processor that may, for example, execute software stored in a storage medium, in firmware, or in a combination thereof, and issue instructions based thereon. For example, the control device may be configured using code segments (e.g., software and/or code). For example, the control device may include or be formed from a programmable logic controller (PLC).

According to various embodiments, a data storage device (more commonly referred to as a storage medium) may be a non-volatile data storage device. For example, the data storage may include or be formed from a hard disk and/or at least one semiconductor memory (such as read-only memory, random access memory, and/or flash memory). The read-only memory may be, for example, an erasable programmable read-only memory (EPROM). The random access memory may be a non-volatile random access memory (NVRAM). For example, the data memory may store one or more of the following: code segments representing the method, one or more control elements, one or more tuning parameters, one or more model parameters, and/or one or more calibration parameters.

The term "processor" may be understood as any type of entity that allows processing of data or signals. For example, the data or signals may be handled according to at least one (i.e., one or more than one) specific function performed by the processor. A processor may include or be formed from an analog circuit, a digital circuit, a mixed signal circuit, a logic circuit, a microprocessor, a central processing unit (CPU), a graphics processing unit (GPU), a digital signal processor (DSP), a programmable gate array (FPGA), an integrated circuit, or any combination thereof. Any other type of implementation of the respective functions, described in more detail below, may also be understood as a processor or logic circuit, for example including virtual processors (or a virtual machine) or a plurality of decentralized processors interconnected, for example, by means of a network, distributed arbitrarily spatially and/or having arbitrary shares in the implementation of the respective functions (e.g., computational load sharing among the processors). The same generally applies to differently implemented logic for implementing the respective functions. It is understood that one or more of the method steps described in detail herein may be executed (e.g., implemented) by a processor, by one or more specific functions executed by the processor.

A "controller" should be understood here as a processor which implements the functions for controlling, e.g. by converting information about an actual state of a coating process into signals for controlling the coating process. The signals may be used, for example, to control one or more actuators that are involved in the coating process. The processor may, for example, be configured as a controller by means of a control model (e.g. by software) or provide the control functions, at least partially, in hardware. For example, a control device may have the processor configured as a controller. For example, the controller and the control model denote the implementation of the same functions for performing control, where the controller denotes the physical implementation and the control model denotes the logical implementation. Therefore, it should be understood that what is disclosed with respect to the controller applies by analogy to the control model and vice versa.

The term "actuator" (e.g. an actuator or including an actuator) should be understood as a transducer which is configured to influence a state of an operation (e.g. a coating process) or a device in response to a control of the actuator. The actuator may convert a signal fed to it (called actuation) into mechanical movements or changes in physical quantities such as pressure or temperature. For example, an electromechanical actuator may be configured to convert electrical energy into mechanical energy (e.g., through movement) in response to the actuation.

An actuator may be configured to influence the actual state of one or more monitored process variables of the coating process that is supplied by the actuator. The influence may be direct or indirect. The actuated variables (also called manipulated variables, set variables, tunable variables, or process controlling variables) and the monitored process variables may, for example, differ from each other. The monitored process variables may accordingly be a function of one or more actuated variables.

For example, the actuator may change an electrical voltage as an actuated variable, by means of which a plasma is supplied, so that as a result a sputtering rate is changed as a monitored process variable. For example, the actuator may change an inflow rate of a gas as an actuated variable so that, as a result, a pressure is changed as a monitored process variable. For example, the actuator may change an inflow rate of a working gas as an actuated variable so that, as a result, an atomization rate is changed as a monitored process variable. For example, the actuator may change an inflow rate of a reactive gas as an actuated variable so that, as a result, a chemical composition is changed as a monitored process variable.

Examples of components of an actuator include a voltage source (if present), a valve (e.g., of a pump assembly and/or gas delivery device, a motor (e.g., of a valve or pump), or the like. For example, the voltage source may be configured to generate and supply one or more voltages to the coating process in accordance with the actuation. The pumping arrangement may be configured, for example, to pump out one or more gases in accordance with the control, and thereby withdraw the gas from the coating process. The gas supply device may be configured, for example, to supply one or more gases to the coating process in accordance with the control.

In the following, mathematical relations and various quantities (e.g. input quantities and/or output quantities) are discussed, among other things, using the following notation:

Simple symbols (for example x, y, . . . ) represent scalar quantities;

Underlined symbols (e.g. $\underline{x}$, $\underline{y}$, . . . ) represent vectorial quantities;

bold symbols X, Y, . . . represent matrices;

Symbols with tilde $\tilde{x}$, $\tilde{y}$ . . . represent absolute quantities (e.g. a measured quantity such as the process voltage $\tilde{U}$), Symbols without tilde (e.g. U) represent a difference to a constant in the context of absolute quantities;

Symbols with a bar above them represent (e.g. $\overline{U}$) a constant; and

Symbols or whole expressions in curly brackets (e.g. {X}, {X+Y}, . . . ) are only noted for completeness, but may be ignored (i.e. are removed from the corresponding relationship).

In the following, the mathematical relationship and different quantities of the more easily understandable vectorial notation are noted. In a similar way, tensors are noted as exemplary illustrations in the more easily understandable one-dimensional or two-dimensional notation (e.g. as matrices). It should be understood that the explained relationships, mappings, and quantities may also be transferred to or notated in other mathematical spaces, e.g. by means of an appropriate transformation.

A model should be understood herein as a data-based (e.g. digital and/or virtual) representation of an original, e.g. a process (e.g. a coating process). To form the model (the so-called building of the model, i.e. the mapping of the original to the model), the original may be abstracted, parameterized, and/or simplified. For example, the model may contain physical information (e.g., length, distance, weight, volume, composition, etc.), motion-related information (e.g., position, orientation, direction of motion, acceleration, speed of motion, etc.), logical information (links, order, couplings, interrelationships, dependencies, etc.), time-related information (e.g. time, total duration, frequency, period duration, etc.) and/or functional information (e.g. current intensity, effect, characteristic field or characteristic curve, working point space, force, degree of freedom, etc.) about the original.

FIG. 1 illustrates a method 100 according to various embodiments in a schematic flowchart. The method 100 may be used to control a (e.g., reactive) coating process, e.g., each coating process of a process group.

The method 100 includes, in 101, driving a first actuator that feeds a coating process, based on a group of a plurality of monitored process variables of the reactive coating process that are detected in parallel with each other; and in 103, driving a second actuator that feeds the coating process, based on the group of a plurality of monitored process variables of the reactive coating process that is detected.

According to various embodiments, the group of the plurality of monitored process variables sensed in parallel to each other may have at least one (i.e., one or more than one) monitored process variables per driven actuator. Alternatively or additionally, the group of the plurality of monitored process variables sensed in parallel may have at least two monitored process variables per coating process.

For example, multiple monitored process variables of the group of multiple monitored process variables sensed in parallel to each other (e.g. each monitored process variable) may be considered when controlling the first actuator. For example, multiple monitored process variables of the group of multiple monitored process variables sensed in parallel (e.g. each monitored process variable) may be considered when controlling the second actuator.

The monitored process variables may be acquired (in time) parallel to each other. For example, each monitored process variable may be acquired repeatedly by means of one or more sensors, e.g. according to a clock pulse that defines the repetition of the acquisition. The sensing of different monitored process variables may, but need not necessarily, occur in the same clock cycle. For example, they may be acquired simultaneously or offset from each other. The repeated acquisition of the monitored process variables may take place in parallel, e.g. over corresponding time periods that overlap each other.

The monitored process variables acquired in parallel may, for example, but do not have to be acquired at the same time. If they are not acquired simultaneously, they may be acquired at least within a period of time that lies between two immediately successive events. Each of the two immediately successive events may be, for example, actuating the first actuator and/or actuating the second actuator.

As a result of the detection of a monitored process variable, an indication of the actual state of the monitored process variable is obtained. The group of actual states detected in this way (e.g. an actual pressure and an actual voltage) may be considered when driving the first actuator and the second actuator. In other words, the same monitored process variables (e.g., their actual state) that are considered when driving the first actuator may also be considered when driving the second actuator.

The control 101 of the first actuator and the control 103 of the second actuator may be performed by means of a control model (also referred to as a control algorithm), which implements a mapping of the group of multiple monitored process variables (e.g. their actual states) detected in parallel to an actuator controlling variable and a second actuator controlling variable.

For a more simplified understanding, reference is made herein to a controller that implements the functions of the control model. It may be understood that the controller may be configured to provide the described functions by means of the control model. It may further be understood that the control model may, however, also be separate from performing the method 100, e.g., stored or provided on a data storage device, as will be explained in more detail later.

The first actuator controlling variable may be supplied to the first actuator for actuation and the second actuator controlling variable may be supplied to the second actuator for actuation. The actuator controlling variable denotes the input variable of the actuator and may be transmitted, for example, by means of a (e.g. electrical) signal (e.g. analog or digital). The controller may be or is implemented by means of a control device and/or by means of code segments.

For example, the controller may be configured to map a multi-dimensional control vector whose vector components indicate the monitored process variables sensed with respect to each other (e.g., their actual state) to a multi-dimensional control vector whose vector components indicate the multiple actuator controlling variables. The controller may have at least one (i.e., one or more than one) control element implementing the mapping or at least a portion thereof.

For example, as an actuator controlling variable of a coating process, a variable (e.g., the position) of an actuator of the coating process may be used by means of which the supply (e.g., feeding and/or withdrawing) of a medium (electrical energy, material, thermal energy, etc.) to the coating process is performed (also referred to as medium supply). For example, to control the coating process, one or more of the following quantities of the coating process may be used as an actuated variable of the coating process: an electrical quantity supplied to the coating process, a temperature of the process gas (including the working gas and/or the reactive gas), an inflow (e.g., inflow rate and/or inflow distribution) of the process gas (e.g., the spatial distribution of the inflow), an inflow (e.g., inflow rate and/or inflow distribution) of the working gas (e.g., the spatial distribution of the inflow), an inflow (e.g., inflow rate and/or inflow distribution) of the reactive gas (e.g., the spatial distribution of the inflow), a transport speed of the substrate, an emission rate of the coating material. The electrical quantity may include, for example, an electrical power, an electrical current (which flows through the plasma, for example), and/or an electrical voltage (which is applied across the plasma, for example).

For example, a monitored process variable of a coating process may be a variable of the coating process or its result that occurs in response to the medium supply. For example, to control the coating process, one or more of the following variables of the coating process may be used as a monitored process variable of the coating process: a pressure of the process gas (and/or its spatial distribution), a partial pressure of the working gas (and/or its spatial distribution); a partial pressure of one or more reactive gases (and/or its spatial distribution), a property (e.g. chemical composition) of the reaction product, an electric voltage (which, for example, drops across the plasma), and/or an electric current (which, for example, is supplied to the plasma).

Some coating process variables may be used as actuated variables in some configurations and used as monitored process variables in other configurations. Thus, the actual choice of actuated variable and monitored process variable depends on the configuration of the coating process and the supply infrastructure, and may be or may be adapted to the particular process. For example, a voltage supplying a plasma may be used as the actuated variable and the current drawn by the plasma may be used as the monitored process variable, or vice versa. For example, a power that the plasma consumes may be used as a monitored process variable and the gas inflow with which the plasma is supplied may be used as an actuated variable, or vice versa.

For example, the coating process controlled by the method 100 may be stable or unstable (e.g., bistable). In other words, the coating process may have at least two stable operating points (e.g., an oxide operating point and a metal operating point) and a transition region between the two stable operating points. Control may then be performed according to a balance control, for example, by keeping each of the coating processes in an unstable reaction mode between the stable reaction modes.

Optionally, a transport device may also be controlled, by means of which a substrate is fed to the coating process, which is coated by means of the coating process.

Figure 2:
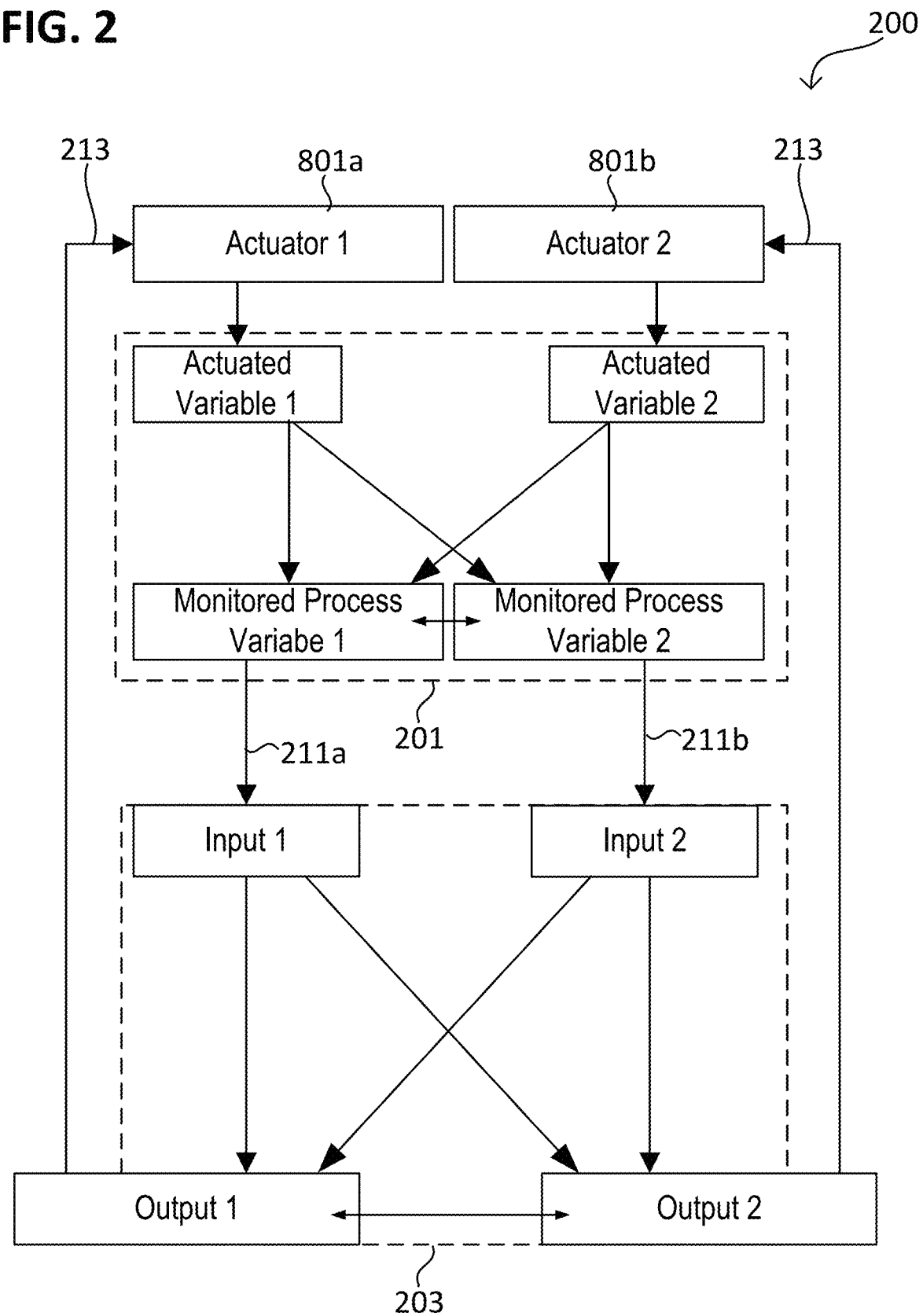
FIGS. 2 to 4 each show the process according to different embodiments in a schematic control diagram.

FIG. 2 illustrates the method 100 according to various embodiments in a schematic control diagram 200.

In the following, for easier understanding, reference is made to two exemplary elements (numbered 1 and 2) of each instance of the control loop, e.g. two actuators, two monitored process variables, two actuated variables, two actuator controlling variables, etc. It should be understood that what is described for the two exemplary elements may apply by analogy to more than two elements of the instance.

The coating process 201 may be supplied by means of a plurality of actuators, for example, by means of the first actuator (actuator 1) and the second actuator (actuator 2). Each actuator of the plurality of actuators may be configured to influence an actuated variable of the coating process 201, for example based on an actuator controlling variable supplied to the actuator. The first actuator may influence a first actuated variable of the coating process 201. The second actuator may influence a second actuated variable of the coating process 201. The actuated variable is the output variable of the actuator used, with the aid of which performs a targeted intervention in the controlled system. The current value of the actuated variable (also referred to as the actual state of the actuated variable) is the so-called control value.

Supplying by means of the actuator may include supplying and/or withdrawing something (e.g., one or more materials) to the coating process 201, wherein the actuator may influence the supplying and/or withdrawing. For example, a material may be supplied to the coating process. In that case, for example, the actuator may affect a rate (i.e., amount per time) at which the material is fed (also referred to as a feed rate). For example, a material may be withdrawn from the coating process. In that case, for example, the actuator may influence a rate (i.e., amount per time) at which the material is withdrawn (also referred to as the withdrawal rate).

For example, if the material is gaseous at standard conditions, the feed rate or the withdrawal rate may be a gas flow rate (also called flow rate) (the feed rate is then also called the inflow rate). In that case, the actuator may, for example, include a valve that influences the flow rate. Alternatively or additionally, the actuator may, for example, include a pump that influences the withdrawal rate.

For example, if the material is solid at standard conditions, the feed rate may be an atomization rate or an evaporation rate. Then, for example, the actuator may have a power supply that influences the feed rate. For example, the electrical power supplied to the atomization or vaporization may be changed by means of the power supply. However, the supply rate of the working gas may also influence the atomization rate.

Reference is made herein, among other things, to the inflow rate as an exemplary supply rate or to the corresponding gas flow (also referred to as flow for short) as an exemplary supply. It may be understood that what is explained may apply by analogy to another supply rates or supplies.

The coating process 201 may further include at least two (i.e., two or more than two) monitored process variables. Of the at least two monitored process variables, a group of monitored process variables, e.g., the first monitored process variable and the second monitored process variable, may be sensed in parallel with each other, e.g., in a clocked and/or repetitive manner. In other words, the actual state 211a, 211b of each monitored process variable of the group of monitored process variables may be sensed in parallel. This may result in an information stream (e.g., clocked) indicating the actual states 211a, 211b of the group of monitored process variables.

The part of the coating process 201 which converts the actuated variable(s) into the two monitored process variable(s) is also referred to as the controlled system. The controlled system thus designates that part of a control loop whose output variable includes the one or more physical variables (monitored process variables) to be controlled, on which the controller is to act by means of the actuated variable. Examples of monitored process variables include temperature, pressure, power, current, voltage, chemical composition, coating rate, spatial position, etc.

The multiple monitored process variables may differ from each other, e.g. in the material they represent. For example, each monitored process variable may represent the presence (e.g., the amount) of the material in the coating process.

The first monitored process variable may, for example, represent a gas, e.g. a working gas or a reactive gas, for example its partial pressure. The second monitored process variable may, for example, represent another gas, e.g. a working gas or a reactive gas, for example its partial pressure.

Alternatively, the second monitored process variable may represent a rate at which the target material is converted from the solid state to the gaseous state (e.g., referred to as the atomization rate or vaporization rate). An example of such a second monitored process variable has an electrical variable by means of which the plasma is supplied. Examples of the electrical quantity include an electrical voltage (e.g., applied to the plasma), an electrical power (e.g., supplied to the plasma), and/or an electrical current (e.g., supplied to the plasma).

The controlled system should be understood as an interaction chain of the coating process 201, whose chain links may often only be partially described analytically or may not be determined experimentally. Each output variable of the controlled system, i.e. each monitored process variable, may be detected by means of the measuring element (e.g. having one or more sensors). Each input variable of the controlled system, i.e. each actuated variable, may be set by means of an actuator. Measuring element and actuator thus form the interfaces between the controlled system and the feedback loop of the control loop.

Mathematically, the controlled system may be regarded as a multidimensional transmission system, as will be described in more detail later. The controlled system may transmit from a multidimensional space of actuated variables back to a multidimensional space of monitored process variables, which is also referred to as a multiple-input multiple-output system (MIMO) controlled system. The transmission system may have linear and/or nonlinear behavior. The linear transmission system (e.g., a linear time-invariant system) may be described by differential equations (DGL), by transfer functions, by numerical discrete-time methods (difference equations), and/or in state space. For this purpose, a model of the controlled system may be determined, for example.

For example, the coating process 201 may be configured such that the first actuated variable influences the first monitored process variable and/or the second monitored process variable. The coating process 201 may, for example, be configured such that the second actuated variable influences the first monitored process variable and/or the second monitored process variable.

Alternatively or additionally, the coating process 201 may be configured such that the first monitored process variable and/or the second monitored process variable influence each other, e.g., are functions of each other. For example, the monitored process variables of the group of multiple monitored process variables acquired in parallel may interact with each other.

The actual state 211a, 211b of each monitored process variable of the group of monitored process variables sensed in parallel with each other may thus be converted into a plurality of actuator controlling variables 213, for example, by means of the controller 203 including at least one (i.e., one or more than one) control element. The controller 203 may be implemented, for example, by means of the control device. Of the plurality of actuator controlling variables 213, a first actuator controlling variable may be provided to the first actuator to drive the first actuator. In other words, the first actuator may be controlled by means of the first actuator controlling variable. Of the plurality of actuator controlling variables 213, a second actuator controlling variable may be provided to the second actuator. In other words, the second actuator may be controlled by means of the second actuator controlling variable.

The controller 203 may be configured in such a way that the actual state 211a, 211b of each monitored process variable of the group of monitored process variables detected in parallel with one another is transferred to the first actuator controlling variable. The controller 203 may be configured in such a way that the actual state 211a, 211b of each monitored process variable of the group of monitored process variables detected in parallel with one another is transferred to the second actuator controlling variable.

For example, controllability and observability of the coating process may be provided to capture the individual monitored process variables. For example, the controller 203 may implement a mathematical model of the controlled system (e.g., a linear DGL system, possibly provided from linearization).

According to various embodiments, feedback of all dynamic quantities important for the coating process may be implemented (e.g., by means of the controller 203) or the use of a state observer may be implemented. According to various embodiments, a feedback of the control deviation for better dynamic properties may be performed (e.g. by means of the controller 203), a compact and uniform mathematical formulation may be implemented.

Compared to a simple PID control, the controller 203 may be configured to control the MIMO controlled system, also taking into account couplings between different input variables of the controlled system and/or within the controlled system.

In the following, an exemplary implementation of the method 100 described above is explained mathematically. The mathematical formulation of the underlying interactions used here should be understood as an example. For ease of understanding, the quantities representing the elements of each instance of the control loop described above are formulated as vectors. However, it should be appreciated that instead of a vector space, any other mathematical space may be suitable to describe the underlying interactions. More generally, tensors and operators may be used, which may also be transformed into systems of linear equations.

In the following example, the controlled system is described in the state space or by means of a state space model in the form of a linear first-order DGL system. Accordingly, it is referred to an internal system state $\underline{x}(t)$ (also called state vector), the output vector $\underline{y}(t)$ and the drive vector $\underline{u}(t)$ (also referred to as the input vector). The output vector $\underline{y}(t)$ represents the actual state of each monitored process variable of the controlled system and may be acquired by means of one or more sensors. The input vector $\underline{u}(t)$ represents the actual state of each actuated variable of the controlled system and may be influenced by means of one or more actuators (also referred to as actuator).

If the controlled system is better described by means of a nonlinear DGL system, linearization may be performed around a point of interest (for example, called the representation of the operating point) of the DGL system (which describes, for example, a coating process), which may represent, for example, the real operating point of the coating process. The linearization then restricts the controller 203 to a subspace of the state space. In any event, this may be sufficient since the controller 203 is configured to keep the system state in this subspace, i.e., to prevent the system state from leaving the subspace. It should be appreciated that a more complex controlled system may also be sectionally linearized and defined, if necessary. For the linearized controlled system, then, what has been described for the linear DGL system applies by analogy.

For example, a general linearization of a DGL system may be done by means of a Taylor expansion, for example a Taylor expansion up to the first order, which then reads:

$$\underline{\dot{\tilde{x}}}(t)=\underline{f}(\underline{\tilde{x}}(t),\underline{\tilde{u}}(t))=\underline{f}(\underline{\bar{x}}+\underline{x}(t),\underline{\bar{u}}+\underline{u}(t))\approx\underline{f}(\underline{\bar{x}},\underline{\bar{u}})+A\underline{x}(t)+B\underline{u}(t)$$

$$\underline{\tilde{y}}(t)=\underline{g}(\underline{\tilde{x}}(t),\underline{\tilde{u}}(t))=\underline{g}(\underline{\bar{x}}+\underline{x}(t),\underline{\bar{u}}+\underline{u}(t))\approx\underline{g}(\underline{\bar{x}},\underline{\bar{u}})+C\underline{x}(t)+D\underline{u}(t)$$

with the model members (A, B, C) and D, which may be written as:

$$A = \left(\frac{\partial \underline{f}}{\partial \underline{\tilde{x}}}\right)_{\underline{\tilde{x}}=\underline{\bar{x}},\underline{\tilde{u}}=\underline{\bar{u}}},$$

$$B = \left(\frac{\partial \underline{f}}{\partial \underline{\tilde{u}}}\right)_{\underline{\tilde{x}}=\underline{\bar{x}},\underline{\tilde{u}}=\underline{\bar{u}}},$$

$$C = \left(\frac{\partial \underline{g}}{\partial \underline{\tilde{x}}}\right)_{\underline{\tilde{x}}=\underline{\bar{x}},\underline{\tilde{u}}=\underline{\bar{u}}},$$

$$D = \left(\frac{\partial \underline{g}}{\partial \underline{\tilde{u}}}\right)_{\underline{\tilde{x}}=\underline{\bar{x}},\underline{\tilde{u}}=\underline{\bar{u}}}$$

and the deviations $\underline{x}(t)$ and $\underline{u}(t)$ from the operating point $\underline{\bar{x}}$, $\underline{\bar{u}}$, which is expressed by:

$$\underline{x}(t)=\underline{\tilde{x}}(t)-\underline{\bar{x}}$$

$$\underline{u}(t)=\underline{\tilde{u}}(t)-\underline{\bar{u}}.$$

For example, the controlled system model may have one or more model members (e.g., two or more, three or more (e.g. model members (A, B, C)), etc.). It may be understood that the model described herein, which has three model members, is exemplary and the underlying relationships may be formulated differently. For example, more or less than three model members may be used. For example, two or more model members may be combined, for example by means of a transformation to a higher dimensional space. For example, one model member may be split, for example by means of a transformation into two lower-dimensional spaces.

The implicitly given operating point $\underline{\bar{y}}=\underline{g}(\underline{\bar{x}}, \underline{\bar{u}})$ with respect to the output vector (for an asymptotically stable coating process) defines the deviation $\underline{y}(t)=\underline{\tilde{y}}(t)-\underline{\bar{y}}$ and is generally given by an unknown relationship $\underline{g}(\underline{\bar{x}}, \underline{\bar{u}})$ but may usually be measured directly.

The choice of an operating point is made in such a way that the controlled system is in equilibrium, which is expressed by:

$$\underline{\dot{\bar{x}}}=\underline{f}(\underline{\bar{x}},\underline{\bar{u}})=0$$

where $\underline{\bar{x}}$ and $\underline{\bar{u}}$ are constant, and causes the deviation $\underline{x}$ from the operating point $\underline{\bar{x}}$ may be described dynamically by the identical DGL system, namely according to the relationship:

$$\underline{\dot{\tilde{x}}}(t) = \frac{d}{dt}\underline{\tilde{x}}(t) = \frac{d}{dt}(\underline{\bar{x}}+\underline{x}(t)) = \frac{d}{dt}\underline{x}(t) = \underline{\dot{x}}(t).$$

The controlled system is approximately in equilibrium when the change in the monitored process variables over time is essentially zero and/or a predefined time period has elapsed, e.g., the multiple half-life of the response to the deviation. In other words, the step response detection (also referred to as step response sensing) may have to switch between multiple desired states of the actuated variable (discrete) once a criterion is met. For example, the criterion may be satisfied when the rate of change of the actual state of the actuated variable satisfies a predefined criterion, such as when the rate of change falls below a predefined threshold. More generally, the step response is implemented so that that the desired state of the actuated variable (also referred to as desired actuated variable or a target actuated variable, e.g., a preset variable) is a discontinuous function of the rate of change of the monitored process variable.

Taken together, this gives an approximate model for the deviations $\underline{x}(t)$, $\underline{y}(t)$ and $\underline{u}(t)$ of the controlled system at a correspondingly defined operating point $\overline{x}$, $\overline{y}$ and $\overline{u}$:

$$\underline{\dot{x}}(t) \approx f(\overline{x},\overline{u}) + A\underline{x}(t) + B\underline{u}(t) = A\underline{x}(t) + B\underline{u}(t)$$

and $$\underline{\tilde{y}}(t) \approx \underline{g}(\overline{x},\overline{u}) + C\underline{x}(t) + D\underline{u}(t) \Rightarrow \underline{\tilde{y}}(t) - \underline{g}(\overline{x},\overline{u}) = \underline{\tilde{y}}(t) - \underline{\overline{y}} = \underline{y} \approx C\underline{x}(t) + D\underline{u}(t)$$

Based on this, the controlled system may be formulated as follows:

$$\underline{\dot{x}}(t) = A\underline{x}(t) + B\underline{u}(t)\{+E\underline{d}(t)\}$$

$$\underline{y}(t) = C\underline{x}(t) + D\underline{u}(t)\{+F\underline{d}(t)\}$$

with the system matrix A the input matrix B the output matrix C the continuity matrix D the perturbation matrices E, F and the disturbance $\underline{d}(t)$. As explained above, the formulation as a matrix is only an example intended to facilitate understanding due to the more intuitive two-dimensional nature of the matrix. As explained above, expressions in curly brackets ($\{+E\underline{d}(t)\}$ and $\{+F\underline{d}(t)\}$) are included for completeness only, but are ignored below.

The equations of motion for the system state and the output vector may then be expressed as:

$$\underline{x}(t) = e^{At}\underline{x}(0) + \int_0^t e^{A(t-\tau)} B\underline{u}(\tau)d\tau$$

$$\underline{y}(t) = Ce^{At}\underline{x}(0) + \int_0^t Ce^{A(t-\tau)} B\underline{u}(\tau)d\tau + D\underline{u}(t)$$

In the following considerations D=0 is set, e.g. if the input vector has no connection or instantaneous influence on the output vector in the controlled system under consideration.

For an asymptotically stable coating process, the final values of the outputs for a constant input may be $\underline{u}(t) = \underline{u}$ may be described by means of the statics matrix, which reads:

$$K_s = \{D\} - CA^{-1}B$$

It is then valid that $K_s\underline{u} = \underline{y}(\infty)$.

The system state $\underline{x}(t)$ is determined within the scope of the state control via the drive vector $$\underline{u}(t) = -K\underline{x}(t)$$

by means of a feedback control element K (e.g. at least one controller matrix), which correlates to the designation as state feedback. Observability and controllability of the coating process facilitate the process. The feedback control element K vividly influences the eigenvalues and thus the dynamics of the overall system (i.e. the control loop).

The feedback control element K for example, may have one or more control elements, e.g., two or more control elements, e.g., three or more control elements, as will be described in more detail later. It may be understood that the feedback control element K is exemplary and the underlying relationships may be formulated differently. The same applies to other control elements described herein.

For example, more or less than three control elements may be used. For example, two or more control elements may be combined, for example by means of a transformation into a higher-dimensional space. For example, one control element may be split, for example by means of a transformation into two lower-dimensional spaces.

The feedback control element K may be determined by means of experimental and/or numerical processes, as will be described in more detail later.

Figure 3:
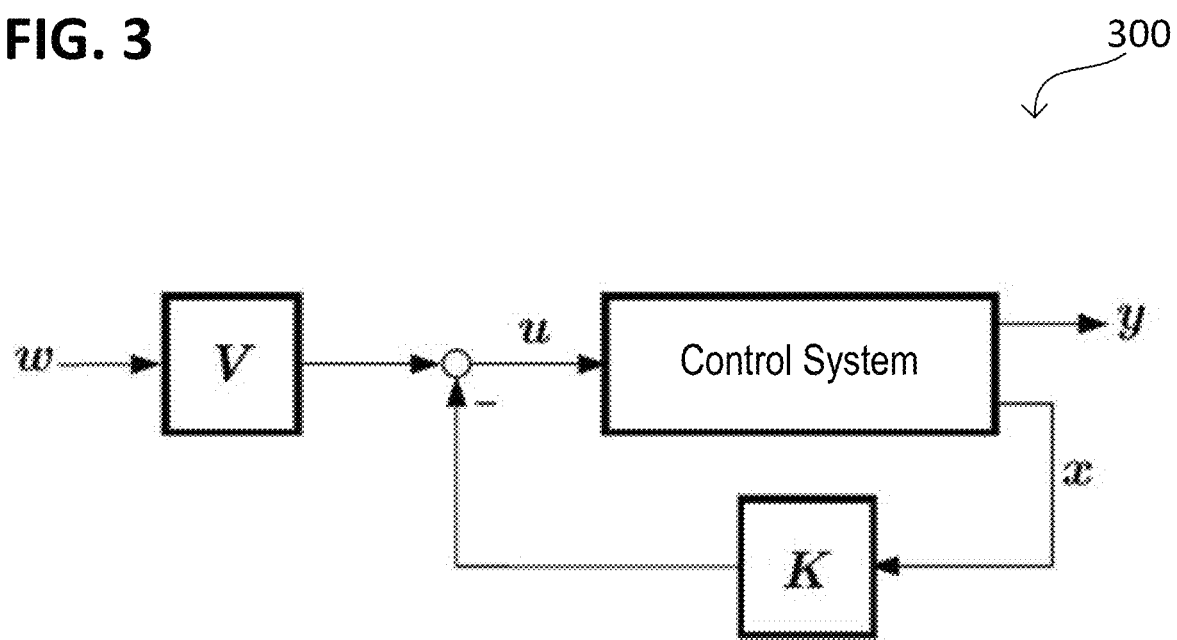

FIG. 3 illustrates the process 100 according to various embodiments in a detailed schematic control diagram 300, which illustrates state feedback with pre-filter.

The prefilter V may implement an interconnection of setpoints or setpoints states $\underline{w}(t)$ which may be written as:

$$\underline{u}(t) = -K\underline{x}(t) + V\underline{w}(t)$$

This causes a static feedforward control and ensures a corresponding setpoint sequence. The homogeneous solution of the DGL system tends toward, for example, $\underline{x}(t \to \infty) = \underline{0}$. The setpoint sequence provides via the particulate solution of the DGL system the transition $\underline{x}(t \to \infty) = \underline{w}$ without changing the dynamics or the eigenvalues of the control loop.

The control loop (i.e. including the controlled system and the controller) may then be formulated as:

$$\underline{\dot{x}}(t) = (A - BK)\overline{x}(t) + BV\underline{w}(t)\{+E\underline{d}(t)\}$$

Using a prefilter for the feedforward control may mean that disturbances or parameter deviations may not be suppressed or are difficult to suppress. Alternatively or in addition to feedforward control, a more flexible PI component may also be used in the state feedback. For this purpose, a vector for the control deviations, formulated for example as a $$\overline{x}_r(t) = \underline{y}(t) - \underline{w}(t) = C\underline{x}(t) - \underline{w}(t),$$

may be or will be introduced as an additional variable in the equations of motion. The so-extended DGL system may also be formulated as integrated system, which may be written for example as:

$$\begin{pmatrix} \underline{\dot{x}}(t) \\ \underline{\dot{x}}_r(t) \end{pmatrix} = \begin{pmatrix} A & 0 \\ C & 0 \end{pmatrix}\begin{pmatrix} \underline{x}(t) \\ \underline{x}_r(t) \end{pmatrix} + \begin{pmatrix} B \\ 0 \end{pmatrix}\underline{u}(t) + \begin{pmatrix} 0 \\ -1 \end{pmatrix}\underline{w}(t)\left\{+\begin{pmatrix} E \\ 0 \end{pmatrix}\underline{d}(t)\right\},$$

$$\underline{y}(t) = (C\ 0)\underline{x}(t)$$

$$\Leftrightarrow$$

$$\underline{\dot{x}}_I(t) = A_I\underline{x}_I(t) + B_I\underline{u}(t) + \begin{pmatrix} 0 \\ -1 \end{pmatrix}\underline{w}(t)\left\{+\begin{pmatrix} E \\ 0 \end{pmatrix}\underline{d}(t)\right\},$$

$$\underline{y}(t) = C_I\underline{x}(t)$$

The new variables may be used as integrators of the setpoint deviation and may be fed back in the controller by means of an integral gain $K_I$ as a control element, which may be written as:

$$\underline{u}(t) = -K\underline{x}(t) - K_I\underline{x}_r(t).$$

An additional P component (which may also be omitted) may improve the dynamic properties of the control loop and introduces design freedoms into the controller. The additional P component (if present) optionally causes the effect of a static feedforward, which may be written as:

$$\underline{u}(t) = -K\underline{x}(t) - K_P(C\underline{x}(t) - w) - K_I\underline{x}_r(t).$$

The design is then performed with the extended system matrix $A_I$, the extended input matrix $B_I$ and the extended output matrix $C_I$.

Figure 4:
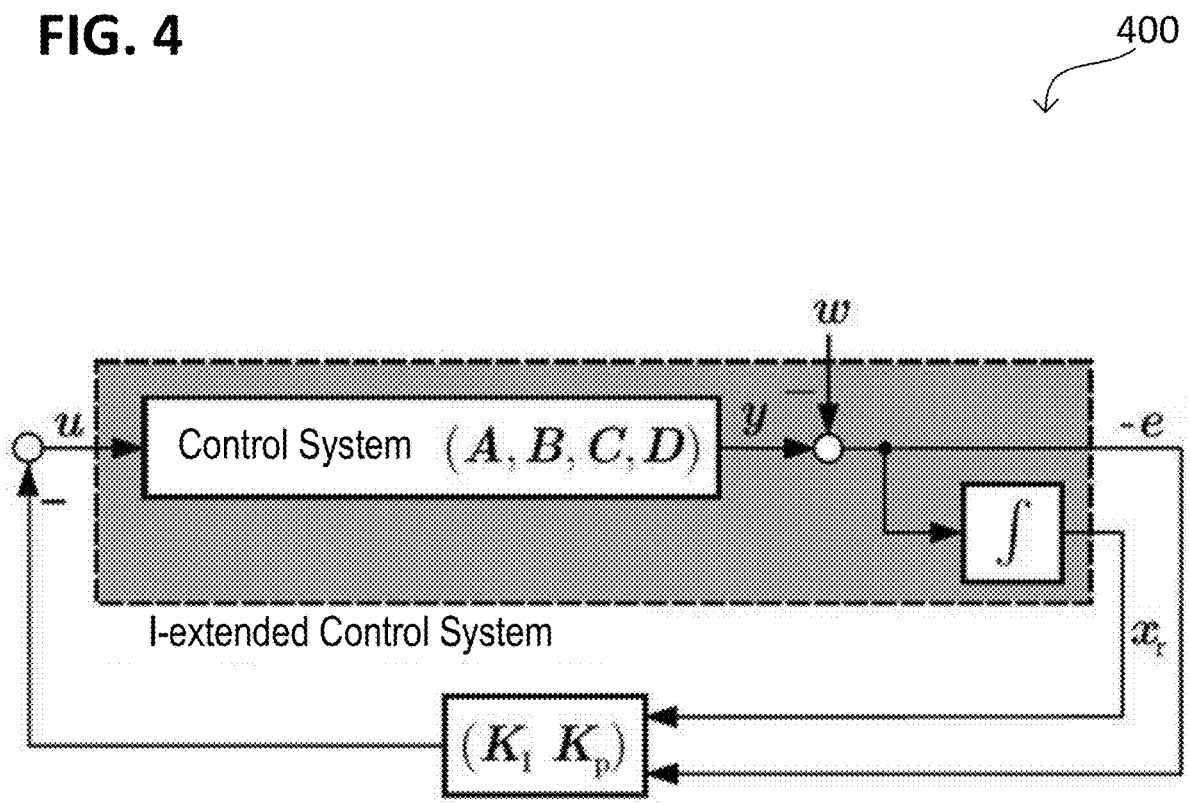

FIG. 4 illustrates the method 100 according to various embodiments in a detailed schematic control diagram 400 (for PI output control), which illustrates a control loop that includes an I-extended control system and output feedback (and optionally does not include direct output feedback).

The transition to an output controller (note $\underline{y}(t) = C\underline{x}(t)$) makes the implementation and technical realization of the controller much easier. This transition to an output controller is possible if the controlled system is clearly benign, i.e. fulfills predefined criteria regarding controllability and observability and is C is invertible.

In this case the output vector $\underline{y}(t)$ may be returned directly (e.g. instead of the system state $\underline{x}(t)$), which may be written as:

$$\underline{u}(t) = -K_y \underline{y}(t) - K_P(\underline{y}(t) - \underline{w}) - K_I \underline{x}_r(t)$$

The feedback controller K (e.g. a feedback matrix) may optionally be linked directly with the feedback control element $K_y$ of the output vector, e.g. according to the relationship $K_y = KC^{-1}$.

A correspondingly extended control element $K_{Integral}$ (e.g. a controller matrix) directly contains the control elements $K_y$, $K_P$ and $K_I$, which may be written as:

$$\begin{aligned}\underline{u}(t) &= -K_y \underline{y}(t) - K_P(\underline{y}(t) - \underline{w}) - K_I \underline{x}_r(t) \\ &= -K_y C \underline{x}(t) - K_P(C\underline{x}(t) - \underline{w}) - K_I \underline{x}_r(t) \\ &= -\underbrace{(K_1 K_2)}_{K_{Integral}} \underbrace{\begin{pmatrix} x \\ x_r \end{pmatrix}}_{\underline{x}_{Integral}} - \begin{pmatrix} 0 \\ K_P \end{pmatrix} \underline{w} \\ &= -K_{Integral} \underline{x}_{Integral} - \begin{pmatrix} 0 \\ K_P \end{pmatrix} \underline{w}\end{aligned}$$

with $$K_1 = (K_y + K_P)C,$$

and $$K_2 = K_I.$$

The state feedback $K_{Integral}$ as a control element of the extended system may be determined by means of a numerical algorithm (e.g. by means of pole assignment or a linear-quadratic controller).

The degrees of freedom of the control elements $K_y$ and $K_P$ (e.g. controller matrices) may be exploited to modify the controller. For example, the proportion $K_y$ in the case of an asymptotically stable coating process may be chosen in such a way that it completely determines the input in the steady state. The accumulated control deviation $\underline{x}_r$ of the I component then only compensates for disturbances and parameter deviations and may even disappear in the optimal case.

For the calculation of $K_y$ for $\underline{w}$=constant (e.g. in steady state) the following relationships may apply:

$$\underline{y}(\infty) = C\underline{x}(\infty) = \underline{w} \Rightarrow \underline{x}(\infty) = C^{-1}\underline{w} \quad \text{a)}$$

$$\underline{\dot{x}}(\infty) = A\underline{x}(\infty) + B\underline{u}(\infty) = 0 \Rightarrow \underline{u}(\infty) = -B^{-1}A\underline{x}(\infty) = B^{-1}AC^{-1}\underline{w} \quad \text{b)}$$

$$\underline{u}(\infty) = -K_y \underline{y}(\infty) - K_P(\underline{y}(\infty) - \underline{w}) - K_I \underline{x}_r(\infty) = -K_y \underline{w} \quad \text{c)}$$

A comparison of b) and c) provides:

$$K_y = B^{-1}AC^{-1}.$$

$K_P$, $K_I$ may be calculated based on $K_1$, $K_2$ e.g. by means of $$K_P = K_1 C^{-1} - K_y, K_I = K_2.$$

It should be noted at this point that this choice is equivalent to $K_y = -K_s^{-1}$.

What follows is a discussion of the determination of the control elements (e.g. in the form of controller matrices), whereby what is described may again be understood as an exemplary implementation.

Figure 5:
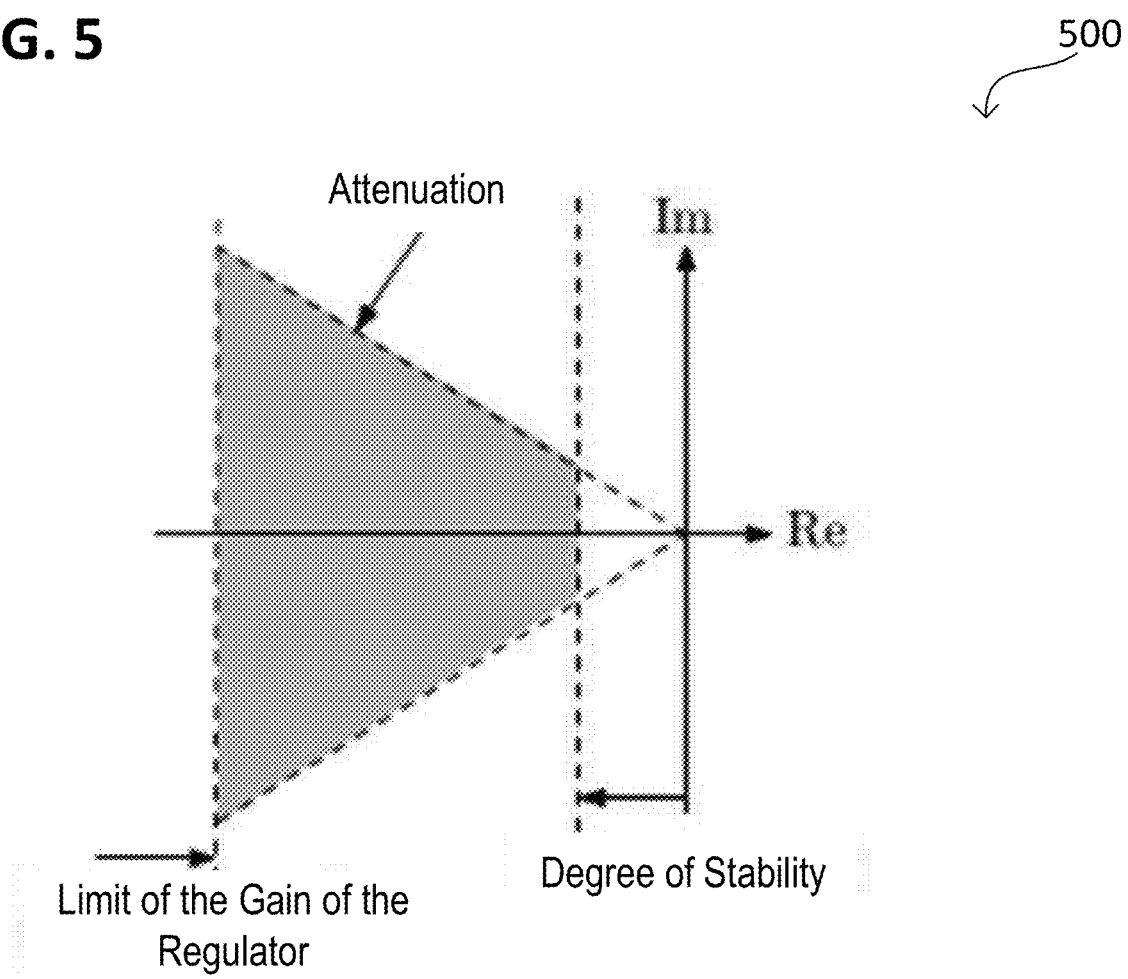
FIG. 5 shows the process according to various embodiments in a detailed schematic diagram.

FIG. 5 illustrates the eigenvalues of the coating process controlled by means of the method 100 according to various embodiments in a schematic diagram 500, where the domain for the eigenvalues is illustrated in complex vector space.

As a first example for a numerical determination of a control element, a pole assignment is explained below.

The pole assignment may be based on a model of the controlled system, e.g. including the model elements (A, B, C).

The model of the controlled system may, for example, implement a linearization around an operating point, as described above. The eigenvalues and thus the dynamics of the control loop are specified. The superposition of all eigenfunctions then vividly describes the dynamics of the control loop. The imaginary part (Im) of an eigenvalue generates an oscillation, while the real part (Re) generates a decay (for example the negative real part) or a growth (for example the positive real part).

The eigenvalues are given in conjugate complex pairs and may be chosen, for example, real and negative (corresponding to stabilizing dynamics without oscillations). This may only involve, for example, the use of a pole assignment. The amounts of the eigenvalues depend on the desired dynamics of the control loop (e.g. quickly reaching the setpoints by physically/technically reasonable progressions of the actuated variables). Sensible eigenvalues for the setpoint may be determined more easily by means of a simulation. In addition, one or more numerical algorithms may be used for pole presets (and thus for determining the feedback matrix of the control loop), e.g. using Python, SciPy or Matlab extended with the System Control Toolbox.

If the eigenvalues for the pole presets are difficult to predict (e.g., due to lack of experience), optimization for linear-quadratic controllers (also referred to as LQR optimization) may be performed, as described below.

As a second example of a numerical determination of a control element, Linear-Quadratic Regulator (LQR) optimization is explained below.

The LQR optimization may be based on a model of the controlled system. (A, B, may be used as a basis. In LQR optimization, the best possible control is determined based on the solution of an optimization problem. For this purpose, by minimizing the quadratic quality function $$J = \int_0^\infty [\underline{x}^T(t)Q\underline{x}(t) + \underline{u}^T(t)R\underline{u}(t)]dt$$

the feedback control element K for the feedback $\underline{u}(t) = -K\underline{x}(t)$ of the control loop is determined. This corresponds to the solution of a Riccati equation. The faster the controlled system is, $\underline{x} = 0$, the less is the contribution of the first summand $\underline{x}^T(t)Q\underline{x}(t)$ of the function. The second summand $\underline{u}^T(t)R\underline{u}(t)$ takes into account the effort of the drive vector $\underline{u}(t)$ which is applied to drive the system appropriately. The symmetric, positive, semidefinite weighting matrix Q and the symmetric, positive, definite weighting matrix R determine the quality requirements and how the closed loop behaves.

The choice of the weighting matrices Q and R however, may be very challenging. An exemplary, but simple and meaningful, choice of Q may be expressed as $$Q = C^T Q_y C \text{ with } Q_y = \text{diag}(q_1, \ldots, q_N)$$

because this expresses the quality function with respect to the course of the components of the output vector $\underline{y}$, which may be written as:

$$J = \int_0^\infty [\underline{x}^T(t)C^T Q_y C\underline{x}(t) + \underline{u}^T(t)R\underline{u}(t)]dt =$$

$$\int_0^\infty [(C\underline{x}(t))^T \text{diag}(q_1, \ldots, q_N)(C\underline{x}(t)) + \underline{u}^T(t)R\underline{u}(t)]dt =$$

-continued $$\int_0^\infty \left[ \sum_{i=1}^N q_i y_i^2(t) + \underline{u}^T(t) R \underline{u}(t) \right] dt.$$

A boundary condition for the optimization may be, for example, that no small variation of the actuated variables takes place while the setpoints of the output variables are reached as quickly as possible.

For this purpose, one or more numerical algorithms for LQR optimization (and thus for determining the feedback matrix of the control loop) may be used, which may be included with various programming languages, e.g. in Python with the library SciPy extension or in Matlab+ System Control Toolbox. The numerical algorithm for LQR optimization may be implemented for example by means of an LQR function, LQR("Argument"), which returns the result of the LQR optimization of the "Argument." Then the result is K=LQR(Q, R, A, B).

Optionally, one of the expressions A−α1 (also called "shift by means of the factor α" or as "shift") instead of the system matrix A may be used in the context of the continuous-time LQR algorithm, which may then be written as:

$$K=LQR(Q,R,A-\alpha 1,B).$$

This achieves improved stability in that it requires a distance of the eigenvalues to the imaginary axis. This shift approach may be applied, for example, by analogy to the scanning system.

As a first example for an experimental determination of a control element, a determination of a static control element (also called static element) is explained below (e.g. in the form of a static matrix).

For the experimental determination of the control element, a model of the controlled system (A, B, C) is not necessarily required. The experimental determination of at least one control element is, in turn, designed to determine the setpoint sequence and ensure stability. The dynamic behavior may only be influenced inaccurately or not at all.

Two parameters (also called tuning parameters) are introduced to define the at least one control element and their value is determined experimentally. This may be done especially well in the case of an asymptotically stable coating process. If this is not present, the final values of the output in the steady state may only be measured with difficulty or not at all.

The static element $K_s$ is obtained by a set of individual experiments. For this purpose, constant, linearly independent input vectors $\underline{u}_i$ may be assumed for the controlled system, whereby after a transition the coating process, the output vector $\underline{y}_i$ (t=∞) is measured. For this, a time $T_{meas}$ (also called transition time) is predefined, after which the coating device is considered to be tuned, i.e. that $\underline{y}_i(t=T_{meas}) \approx \underline{y}_i(t=\infty)$ applies. The input vectors and output vectors are determined in the following by means of the matrices $$U=(\underline{u}_1 \underline{u}_2 \ldots \underline{u}_n), \text{ and}$$

$$Y=(\underline{y}_1(\infty)\underline{y}_2(\infty) \ldots \underline{y}_n(\infty))$$

formally summarized to simplify notation. In the simplest case for each change $\underline{u}_i$ only one component of the input vector may be set non-zero, which is also convenient for the application of an automatic calibration (e.g. by means of a so-called autotuning algorithm), which will be described in more detail later. The static element may then be determined based on the input vectors and output vectors, for example according to the relationship:

$$K_s=YU^{-1}$$

Based on the static element (e.g. its inverse), one or more control elements (e.g. in the form of a control matrix) may be determined, for example according to one or more of the following relationships:

$$K_y=0, K_P=bK_s^{-1}, K_I=aK_s^{-1}$$

with the factors (also called tuning factors) a and b. It is illustrative to start with small tuning factors to facilitate the process. The tuning factors may be increased to speed up the settling process as long as the coating process still has a stability reserve and does not oscillate.

Subsequently, a PI output controller may be formed based on the one or more control elements.

As explained above for PI output control, namely for the selection of $K_y$, instead of $K_y=0$, may also be set here:

$$K_y=-K_s^{-1}$$

This has the effect that when starting procedure 100 (e.g. with zero set integrals of the control deviation) the input is not also set to zero for the start, but is started at a clearly sensible state.

Figure 6:
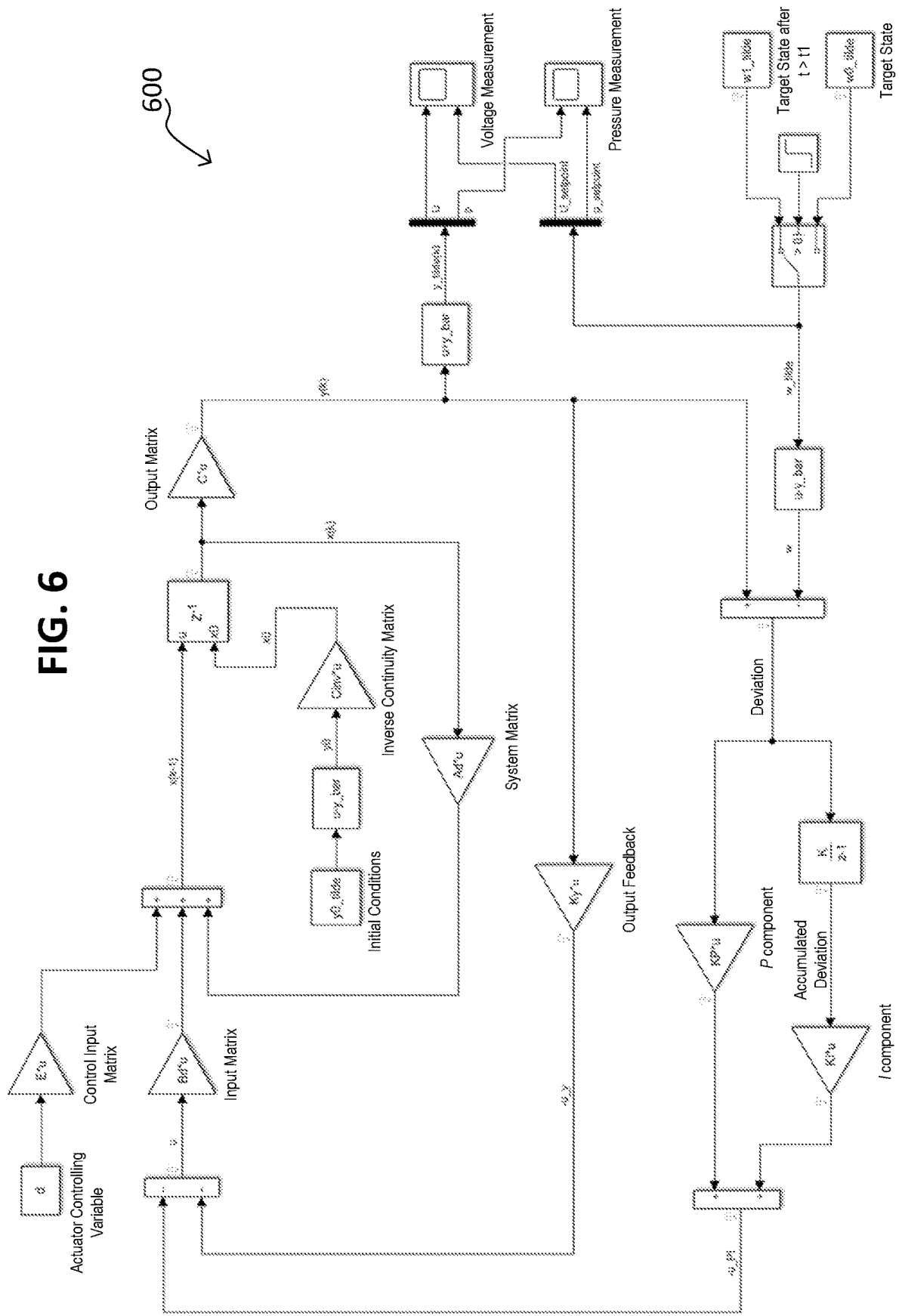
FIG. 6 shows an implementation of the process according to various embodiments in a detailed schematic diagram.

FIG. 6 illustrates an implementation 600 of the method according to various embodiments in a detailed schematic layout diagram, on the basis of which, among other things, the discretization is explained below (shown here as an example for a discrete PI output controller).

The discretization of the controller allows to take into account one or more sampling effects, e.g. to take into account that the actual states of the monitored process variables are determined discretely in time (i.e. are determined with a repetition frequency).

Here, the rectangular (sectionally constant) behavior of the input may be exploited to obtain a discrete mapping for the time evolution of the system state. The discretization may be done, for example, by taking the continuous-time vectors $\underline{\dot{x}}(t)$ and $\underline{y}(t)$ are transformed into discrete-time vectors $\underline{x}_k$ and $\underline{y}_k$, for example according to the following relationship:

$$\begin{array}{l} \underline{\dot{x}}(t) = A\underline{x}(t) + B\underline{u}(t) \\ \underline{y}(t) = C\underline{x}(t) \end{array} \xrightarrow{\text{sampling time } T, t=kT} \begin{array}{l} \underline{x}_{k+1} = A_d \underline{x}_k + B_d \underline{u}_k \\ \underline{y}_k = C\underline{x}_k \end{array}$$

where k is an integer.

The concrete transfer of the continuous-time vectors $\underline{\dot{x}}(t)$ and $\underline{y}(t)$ into the discrete-time vectors $\underline{x}_k$ and $\underline{y}_k$ is based on the value of the sampling time T. The sampling time T specifies the time interval of directly successive points in time at which one or more monitored process variables of the coating process is recorded, i.e. at which time the coating process is sampled.

From the analytical solution of the continuous DGL system, using a stepwise constant function of the drive vector $\underline{u}(t)$, what follows is the relationship between the model elements (e.g. in the form of model matrices) of the discrete-time dynamic controlled system, which may be written as:

$$A_d=e^{AT}, B_d=\int_0^T e^{A\tau} d\tau B$$

The calculation of the matrix exponential function may be done e.g. by means of the diagonalization of $A = S \text{ diag}(\lambda_1, \ldots, \lambda_n) S^{-1}$. The discrete-time model members (e.g. in the form of model matrices) may be expressed as:

$$A_d = e^{AT} =$$

$$e^{S \text{diag}(\lambda_1,\ldots,\lambda_n)S^{-1}T} = S e^{\text{diag}(\lambda_1,\ldots,\lambda_n)T} S^{-1} = S \text{ diag}(e^{\lambda_1 T}, \ldots, e^{\lambda_n T}) S^{-1},$$

$$B_d = \int_0^T e^{A\tau} d\tau B = \int_0^T S \text{ diag}(e^{\lambda_1 \tau}, \ldots, e^{\lambda_n \tau}) S^{-1} d\tau B =$$

$$S \text{ diag}\left(\int_0^T e^{\lambda_1 \tau} d\tau \ldots, \int_0^T e^{\lambda_n \tau} d\tau\right) S^{-1} B =$$

$$S \text{ diag}\left(\frac{1}{\lambda_1}(e^{\lambda_1 T} - 1) \ldots, \frac{1}{\lambda_n}(e^{\lambda_n T} - 1)\right) S^{-1} B.$$

Illustratively, the numerical implementation of the matrix exponentials and the integral is considerably easier in this form. For example, the expressions in the respective last lines may be implemented more easily (or at all) by software.

The extension to a discrete-time integral system may be expressed as:

$$\begin{pmatrix} x_{k+1} \\ x_{r,k+1} \end{pmatrix} = \begin{pmatrix} A_d & 0 \\ C & 1 \end{pmatrix} \begin{pmatrix} x_k \\ x_{r,k} \end{pmatrix} + \begin{pmatrix} B_d \\ 0 \end{pmatrix} \underline{u}_k + \begin{pmatrix} 0 \\ -1 \end{pmatrix} \underline{w}_k$$

where the control deviation $\underline{x}_{r,k+1} = \underline{x}_{r,k} + \underline{y}_k - \underline{w}_k$ is accumulated directly. The design of a state controller for a discrete-time sampling of the coating process (also called discrete-time controlled system) is identical to the continuous-time controlled system, because:

one or more pole presetting algorithms may be used for both the continuous-time controlled system and the discrete-time controlled system, since the poles of the sampling system are related to those of the continuous-time controlled system after $\lambda_d = e^{\lambda T}$; and one or more LQR algorithms for sampling systems are known, but do not have to be identical to those of a continuous-time controlled system.

With regard to the determination of a discrete-time PI output controller, it should be noted that $K_y$ differs from the PI output controller described above for the continuous-time controlled system, because it is:

$\underline{y}_\infty = C \underline{y}_\infty = \underline{w}$       a)

$\underline{x}_\infty = A_d \underline{x}_\infty + B_d \underline{u}_\infty = 0 \Rightarrow \underline{u}_\infty = -B_d^{-1}(A_d - 1)\underline{x}_\infty = -B_d^{-1}(A_d - 1)C^{-1}\underline{w}$    b)

$\underline{u}_\infty = -K_y \underline{y}_\infty - K_P(\underline{y}_\infty - \underline{w}) - K_I \underline{x}_{r,\infty} = -K_y \underline{w}$       c)

After comparing b) and c) and determining the remaining control elements with respect to $K_1$, $K_2$, the result is:

$K_y = B_d^{-1}(A_d - 1)C^{-1}$, $K_P = K_1 C^{-1} - K_y$, and $K_I = K_2$.

To apply the LQR algorithm it should be noted that there are differences in the solution of a continuous-time or a discrete-time Riccati equation, which may be considered in the numerical implementation or the use of appropriate libraries. In addition, the application of a given stability degree differs α in comparison to the continuous-time controlled system. The generalization to a discrete-time controlled system is explained below in analogy to the continuous-time controlled system.

New sizes are introduced, namely:

$\underline{\tilde{x}}_k = e^{\alpha kT} \underline{x}_k$, $\underline{\tilde{u}}_k = e^{\alpha kT} \underline{u}_k$ In order that the quality functional now takes a finite value, the original quantities $\underline{x}_k$ and $\underline{u}_k$ decrease faster than $e^{-\alpha t}$ decay. To do this, a suitable discrete-time sample for the newly introduced quantities is determined from the existing sample. Multiplying the discrete-time state vector $\underline{x}_{k+1} = A_d \underline{x}_k + B_d \underline{u}_k$ with $e^{\alpha kT}$ returns $$e^{\alpha kT} \underline{x}_{k+1} = e^{-\alpha T} e^{\alpha(k+1)T} \underline{x}_{k+1} = A_d e^{\alpha kT} \underline{x}_k + B_d e^{\alpha kT} \underline{u}_k$$
$$\underbrace{\hphantom{xxxx}}_{\underline{\tilde{x}}_{k+1}} \quad \underbrace{\hphantom{xxxx}}_{\underline{\tilde{x}}_k} \quad \underbrace{\hphantom{xxxx}}_{\underline{\tilde{u}}_k}$$

and leads to $$\underline{\tilde{x}}_{k+1} = \underbrace{A_d e^{\alpha T}}_{\tilde{A}_d} \underline{\tilde{x}}_k + \underbrace{B_d e^{\alpha T}}_{\tilde{B}_d} \underline{\tilde{u}}_k.$$

Calling the LQR function with LQR(Q, R, $A_d e^{\alpha T}$, $B_d e^{\alpha T}$) instead of LQR(Q, R, $A_d$, $B_d$) then takes into consideration the required degree of stability analogous to the time-continuous controlled system.

More generally, according to various embodiments, the method provides that a continuous-time controlled system is modeled which, for example, takes into account a predefined degree of stability. This achieves a much more robust controller.

Figure 7:
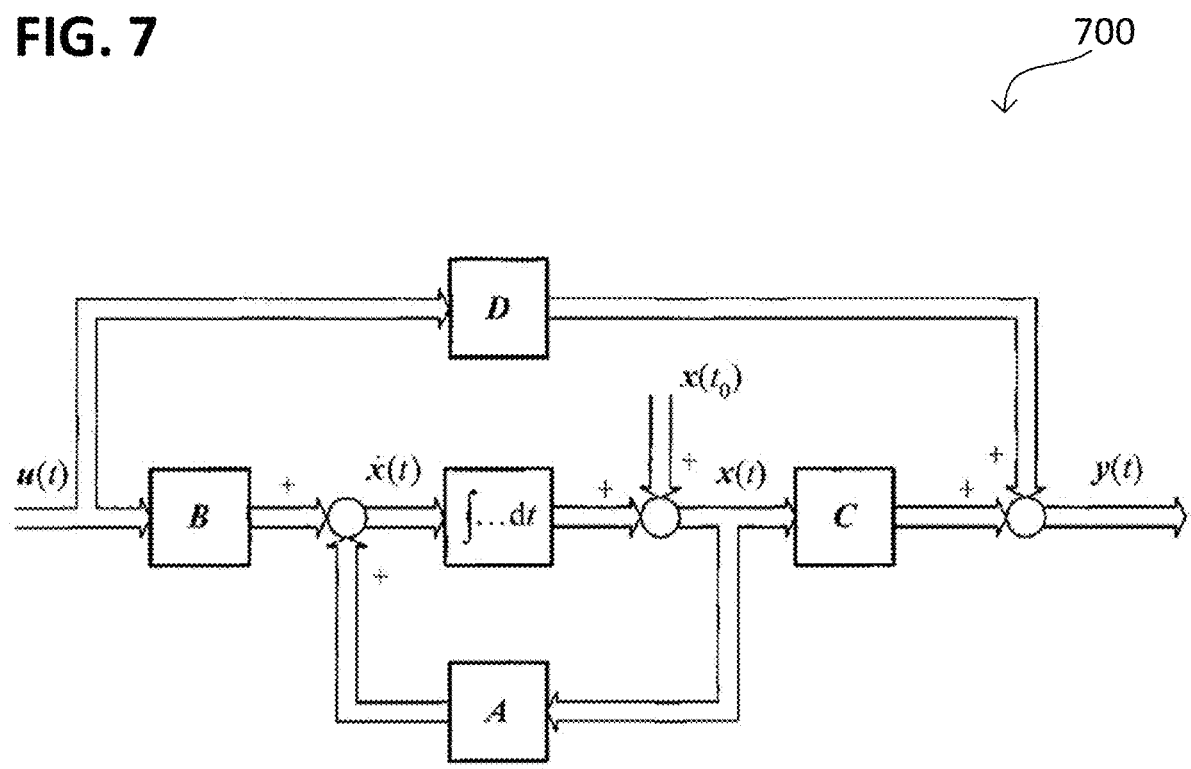
FIG. 7 shows the controlled system according to various embodiments in a detailed schematic diagram.

FIG. 7 illustrates the controlled system 700 according to various embodiments in a detailed schematic diagram, on the basis of which, among other things, an exemplary model of the controlled system (also referred to in simplified form as a process model) is explained below.

The exemplary process model may facilitate obtaining a starting point for determining one or more control members and/or performing numerical simulations. The exemplary process model is explained below using an exemplary coating process that includes a sputtering process.

The sputtering process may involve atomizing a material (also referred to as a target material) by means of a plasma (referred to as sputtering). A layer may be formed on a substrate by means of the atomized target material. In other words, the sputtering process includes that a material (target material) supplied to the layer formation is transferred from the solid phase to the gaseous phase by means of sputtering.

It should be understood that the sputtering process is only exemplary of a physical vapor deposition (PVD), and that what is described for the sputtering process may apply by analogy to a PVD of a different type, in which the solid material is transformed into a gaseous material in a different way. Examples include an electron beam evaporation, a thermal evaporation, an arc evaporation, a molecular beam epitaxy, and/or an ion plating.

For example, a plurality of coating processes may be performed, each coating process depositing at least one layer on the substrate, to be controlled in accordance with the method 100. For example, one or more coating processes of the plurality of coating processes may include the sputtering process. Immediately successive coating processes (also referred to as immediately adjacent coating processes) may optionally interact with each other, for example, by exchanging gas with each other.

The state vector $\underline{x}$, the input vector $\underline{u}$ and the output vector $\underline{y}$ are transformed into each other by means of the model elements (A, B, C), which represent the controlled system. Analogous to the vectors, the model elements (A, B, C) are notated as elements of a vector space for the following explanation. Of course, what is explained may apply by analogy to other notations.

The combination of state vector $\underline{x}$, input vector $\underline{u}$ and output vector $\underline{y}$ may have the following form (also called model form):

$$\dot{\underline{x}}(t) = A\underline{x}(t) + B\underline{u}(t), \text{ and}$$

$$\underline{y}(t) = C\underline{x}(t) + \{D\underline{u}(t)\}.$$

where A denotes the system matrix, B the input matrix, and C the output matrix. The operator D is omitted in this model form, but may optionally be considered.

The input vector $\underline{u}$ represents the actual state of the actuated variable of the coating process, the output vector $\underline{y}$ represents the actual state of the monitored process variable of the coating process, and the state vector $\underline{x}$ represents the actual state of the interaction chain of the coating process (i.e. the controlled system), which converts the input vector $\underline{u}$ into the output vector $\underline{y}$.

To simplify understanding, the vector components will be indexed with R and P in the following description. The indices R and P represent illustratively what the coating process is supplied with. For example, P may represent a first gas, e.g., its inflow rate (e.g., standard volume flow), with which the coating process is supplied. For example, the first gas may include or be formed from a working gas. The corresponding first actuator may then have, for example, a first valve by means of which the inflow rate of the first gas is influenced. The first setpoint control variable may then be transmitted by means of a first control signal supplied to the valve. The working gas may, for example, include or be formed from argon or another noble gas.

For example, R may represent a second gas, e.g., its inflow rate (e.g., standard volumetric flow rate) supplied to the coating process. For example, the second gas may include or be formed from a reactive gas. The corresponding second actuator may then have, for example, a second valve that influences the inflow rate of the second gas. The second setpoint control variable may then be transmitted by means of a second control signal supplied to the second valve. The reactive gas may, for example, include or be formed from molecular oxygen ($O_2$), molecular nitrogen ($N_2$) or a mixture of $O_2$ and $N_2$.

It should be understood that what is described may apply by analogy to more than two gases and/or another gaseous material supplied to the coating process. For example, the gaseous material may also include the atomized target material (for example, the target material transferred to the gaseous phase), so that the atomization rate is affected. The corresponding actuator may then have, for example, a voltage supply that supplies the plasma with electrical energy.

In the following, a gas volume model for the internal state vector and mutually decoupled gas reservoirs for each gas type is used as an approximation. It should be understood that the corresponding mathematical description is exemplary in nature and has been chosen with respect to a simplified understanding. Of course, it may be implemented using other mathematical descriptions for the approximation.

The state vector $\underline{x}$, input vector $\underline{u}$ and output vector $\underline{y}$ may be defined with respect to an operating point to be specified. The closer the operating point is to the target operating range (e.g. the reference state), the less the losses would be cancelled out of the approximation model. For a simplified illustration, an (N=1) model (also referred to as a single chamber model or single coating process model) is first explained below as an exemplary process model, which is then systematically extended to an N model, i.e. to N chambers or N coating processes, as an exemplary process model.

Figure 8:
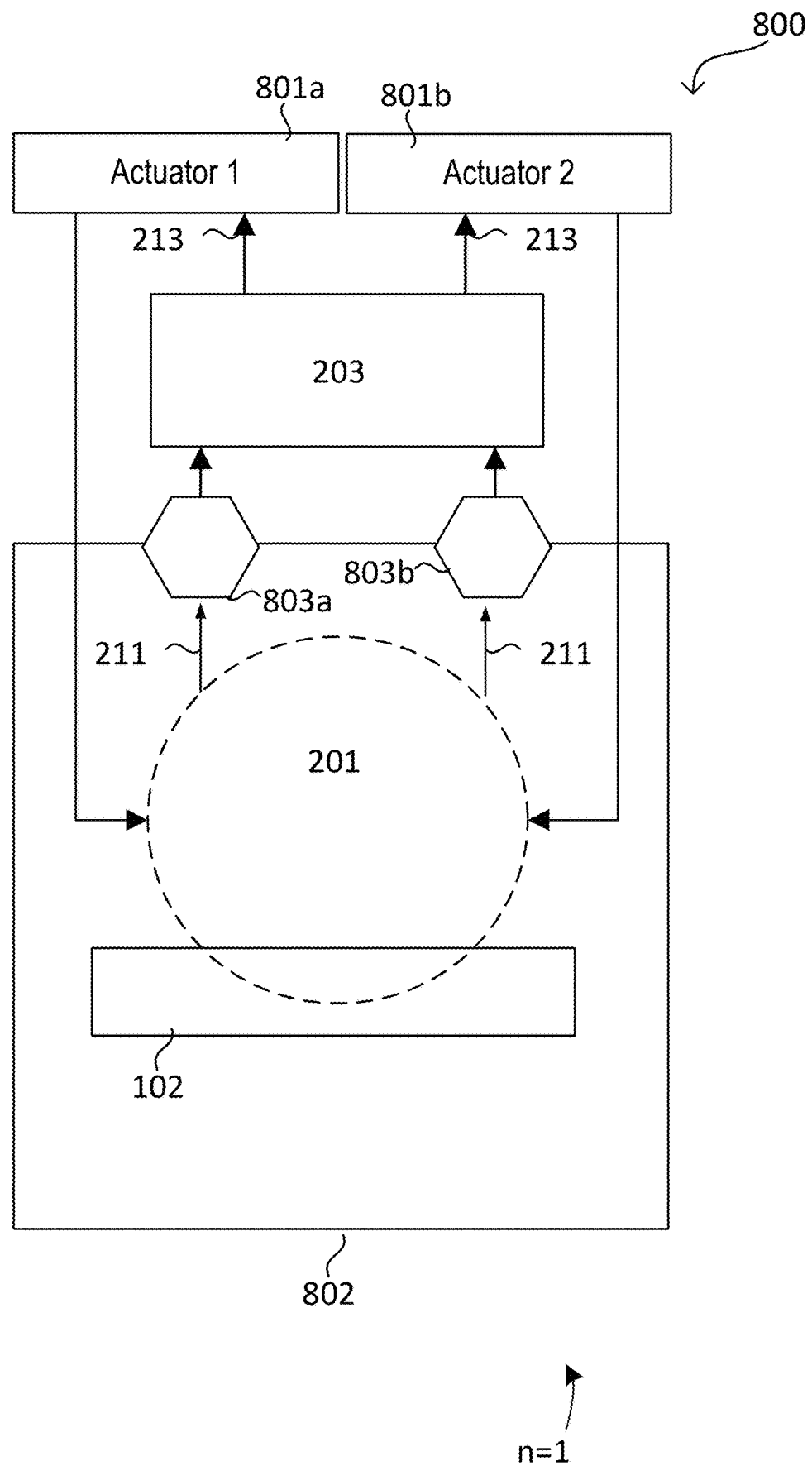
FIGS. 8 to 12 each show a model of different stages according to different embodiments in a detailed schematic diagram.

FIG. 8 illustrates the (N=1) model 800 as an exemplary process model according to various embodiments in a detailed schematic structure diagram. The (N=1) model 800 may accurately represent a coating process that is supplied by means of the first actuator 801a and the second actuator 801b, is performed within a vacuum chamber 802 (also referred to as a processing chamber), and coats a substrate 102. The actual state 211a of the first monitored process variable of the coating process may be detected by a first sensor 803a. The actual state 211b of the second monitored process variable of the coating process may be sensed by means of a second sensor 803b.

According to various embodiments, a vacuum system that performs the coating process may include a vacuum chamber housing in which a vacuum may be generated and/or maintained. According to various embodiments, the coating of the substrate 102 may be performed in the vacuum and/or the vacuum chamber housing. For example, the vacuum chamber housing may be or may be configured to be air-tight, dust-tight, and/or vacuum-tight for this purpose. The vacuum chamber housing may include one or more vacuum chambers, wherein each coating process may, but need not necessarily, be performed in a separate vacuum chamber. For example, two or more coating processes may also be performed in the same vacuum chamber, or at least be exposed to the same process atmosphere and/or pressure.

Further, the vacuum chamber 802 may be coupled to a pumping system (including at least one course vacuum pump and optionally at least one high vacuum pump) which may provide one or more (for example, the first and/or second) actuators with which to supply the coating process. The pumping system may be configured to extract gas from the vacuum chamber, e.g. the coating process carried out therein, so that a vacuum (i.e. a pressure lower than 0.3 bar) may be or may be provided therein, e.g. a pressure in a range of about 1 mbar to about $10^{-3}$ mbar (in other words fine vacuum) or less, e.g., a pressure in a range from about $10^{-3}$ mbar to about $10^{-3}$ mbar (in other words, high vacuum) or less, e.g., a pressure of less than a high vacuum, e.g., less than about $10^{-7}$ mbar (in other words, ultra-high vacuum).

Further, the vacuum chamber 802 may be coupled to a gas delivery system that may provide one or more (for example, the first and/or second) actuators used to supply the coating process. By means of the gas supply system, one or more gases may be supplied to the vacuum chamber 802, for example the coating process performed therein, for forming a process atmosphere therein. Depending on the coating process to be performed, the process atmosphere may have a corresponding composition and/or pressure. Examples of the gas to be supplied may include: a working gas (e.g., an inert gas) and a reactive gas. The pressure to which the coating process is subjected may be formed from a balance of gas supplied by means of the gas supply system and withdrawn by means of the pumping system, i.e., supplied to the coating process.

Further, a coating device may be disposed in the vacuum chamber 802, which may provide one or more (for example, the first and/or second) actuators used to supply the coating process. By means of the coating device, one or more target materials may be supplied to the vacuum chamber 802, for example the coating process performed therein, for forming a coating. For example, the coating device may include or be formed from a sputtering device.

In a first exemplary implementation, the (N=1) model 800 considers a process voltage, with which the coating process is supplied, as an exemplary first monitored process variable and a total pressure, to which the coating process is subjected, as an exemplary second monitored process variable. The process voltage may be used, for example, to supply electrical power to the coating apparatus. The process voltage may, for example, influence the rate at which the target material is converted to the gaseous state (e.g., vaporized or atomized).

In a second exemplary implementation, the (N=1) model 800 considers supplying working gas to the coating process as an exemplary first actuated variable and supplying reactive gas to the coating process as an exemplary second actuated variable.

In a third exemplary implementation, the (N=1) model 800 considers the parallel control of the process voltage U as first monitored process variable and the total pressure p as a second monitored process variable in a process chamber 802 and supplying the coating process with working gas and reactive gas as actuated variables.

In general, one or more additional monitored process variables may also be considered, e.g. by adding the state vector $\underline{x}$, the input vector $\underline{u}$ and the output vector $\underline{y}$ are extended by one dimension. Per monitored process variable, for example, one gas inlet valve (e.g., reactive gas inlet) may be used as an actuator and one or more sensors configured to determine the ratio between multiple gases (e.g., reactive gases) (e.g., with respect to their partial pressure and/or inflow rate).

The state vector $\underline{x}$ represents a difference in the amount of gas of the type used at an unknown operating point $\underline{n}_P$, $\underline{n}_R$, which may be written as:

$$\underline{x} = \begin{pmatrix} \Delta n_P \\ \Delta n_R \end{pmatrix}$$

The output vector $\underline{y}$ represents a deviation of the acquired process characteristics (also called monitored process variables) to a defined operating point, which may be written as:

$$\underline{y} = \begin{pmatrix} \Delta U \\ \Delta p \end{pmatrix} \text{ with}$$

Operating point $\overline{\underline{y}} = \begin{pmatrix} \overline{U} \\ \overline{p} \end{pmatrix}$ and Measured variables $\tilde{\underline{y}} = \begin{pmatrix} \tilde{U} \\ \tilde{p} \end{pmatrix} = \overline{\underline{y}} + \underline{y}$ In the following, an exemplary implementation of the initial matrix C in the (N=1) model is explained. The exemplary implementation is derived on an analytical level, although another approach could also be used, for example by using a different analytical method or by fitting model parameters.

The conversion of the gas quantities to partial pressures is carried out by means of a factor $c^p$ which is volume-dependent and temperature-dependent for an ideal gas. If the factor $c^p$ optionally gas type-dependent, individual factors and $c_P{}^p$ and $c_R{}^p$ may be used. The partial pressure differences add up to the total pressure difference, which may be written as:

$$\Delta p = \Delta p_A + \Delta p_R = c_P{}^p \Delta n_A + c_R{}^p \Delta n_R.$$

The approximation that the first order partial pressure change of a gas causes a proportional gas type dependent voltage change, which may be written as:

$$\Delta U = c_P{}^U \Delta p_A + c_R{}^U \Delta p_R = c_P{}^U c_P{}^p \Delta n_A + c_R{}^U c_R{}^p \Delta n_R$$

where $c_P{}^U$ and $c_R{}^U$ are proportional factors here. This may be summarized to:

$$\underline{y} = \begin{pmatrix} \Delta U \\ \Delta p \end{pmatrix} = \begin{pmatrix} c_P^U & c_R^U \\ 1 & 1 \end{pmatrix} \begin{pmatrix} \Delta p_P \\ \Delta p_R \end{pmatrix} = \begin{pmatrix} c_P^U c_P^p & c_R^U c_R^p \\ c_P^p & c_R^p \end{pmatrix} \begin{pmatrix} \Delta n_P \\ \Delta n_R \end{pmatrix} = C\underline{x}$$

The output matrix C may be expressed based on this as:

$$C = \begin{pmatrix} c_P^U c_P^p & c_R^U c_R^p \\ c_P^p & c_R^p \end{pmatrix}.$$

In the following, one possible implementation of the input vector $\underline{u}$ in the (N=1) model is explained. The input vector $\underline{u}$ represents, for example, the material flows (e.g. gas flows) into the vacuum chamber 802, i.e. the material flows which are supplied to the coating process, as differences to the corresponding initial flows (which may be the material flows in the reference state), which is expressed by:

$$\underline{u} = \tilde{\underline{u}} - \overline{\underline{u}} = \begin{pmatrix} \Delta v_P \\ \Delta v_R \end{pmatrix} = \begin{pmatrix} \text{Arbeitsgas } MFC - \text{Einlass in Kammer} \\ \text{Reaktivgas } MFC - \text{Einlass in Kammer} \end{pmatrix} - \begin{pmatrix} \text{Arbeitsgas } MFC - \text{Initialfluss} \\ \text{Reaktivgas } MFC - \text{Initialfluss} \end{pmatrix},$$

In the following, one possible implementation of the input matrix B in the (N=1) model is explained. The input vector $\underline{u}$ represents an amount of gas per time, so it may be written that $$B = \begin{pmatrix} b & 0 \\ 0 & b \end{pmatrix}.$$

which is a diagonal matrix. The use of standard units (e.g. in standard cubic centimeters per minute, i.e. in sccm) makes this implementation of B system-independent and internationally understandable. For one type of gas (e.g. the reactive gas or the working gas) it may then be written:

$$\frac{dx}{dt} = bv = b\frac{dn}{dt}$$

with the constant gas flow v. The coefficient b only considers the conversion of the time unit and may optionally be normalized or omitted. For example, in the context of the process model, time may be expressed in seconds (sccm become standard cubic centimeters per second, i.e., sccs), so that b=1/60. Then it may be written that:

$$B = \begin{pmatrix} b & 0 \\ 0 & b \end{pmatrix}$$

In the following, one possible implementation of the system matrix A in the (N=1) model is explained. The approximation that the gas reservoirs for working gas and reactive gas do not interact with each other in first order or at most negligibly may be expressed as a diagonal matrix, for example as:

$$A = \begin{pmatrix} -a_{loc}^P & 0 \\ 0 & -a_{loc}^R \end{pmatrix}$$

where the positive parameters $a_{loc}$ represent the decay of the gas volume due to the coating process and the pumping (i.e. the extraction of gas).

At this point, it should be noted that, alternatively or in addition to the material supplied to the coating process, the material withdrawn from the coating process may be considered. This is because the amount of material available to the coating process is formed based on the balance between supply and withdrawal. This balance is more generally referred to herein as supply. In other words, supplying material to the coating process may include supplying and/or withdrawing material from the coating process. The supply and/or withdrawal may be provided, for example, by means of a valve as an actuator.

The diagonal system matrix A leads to the decoupling into single differential equations, the DGL for each gas species may then be expressed as:

$\dot{x}(t) = -a_{loc}\underline{x}(t) + b\underline{u}(t)$, and is analytically solvable for a constant inflow u(t)=u which may then be written as:

$$x(t) = \left(\frac{u}{a_{loc}}\left(e^{a_{loc}^t} - 1\right) + x(0)\right)e^{-a_{loc}^t}.$$

From this follows directly the total dynamic pressure change Δp(t) with respect to a gas species, which may be expressed as: $\Delta p(t) = c^P x(t)$.

In order to determine the model members, the structure of this relationship may be exploited. A variation of the input vector results in a variation of the state of the coating process, which may be captured. An exemplary stepwise variation of the input vector may be expressed as:

$$u(t) = \begin{cases} 0, & t < 0 \\ \Delta u, & t \geq 0 \end{cases}.$$

With a steady-state solution at time t=0, $\Delta p(0) = c^P x(0) = 0$ a pressure difference Δp(∞) after the spiral deviation. The unknown decay coefficient $$a_{loc} = -\frac{\ln(1/2)}{\tau}$$

may be determined experimentally by means of the half-life determined from the pressure signal p(t)=p+Δp(t) the half-life τ with respect to Δp(∞). Based on the decay coefficient, $a_{loc}$, a conversion factor with respect to the pressure of the gas under consideration may be determined, for example according to the relationship:

$$c^P = \frac{\Delta p(\infty)}{\Delta u} a_{loc}$$

By analogy, a conversion factor with respect to the voltage may be determined based on the difference in the process voltage that occurs ΔU(∞) for example according to the relationship:

$$c^U = \frac{\Delta U(\infty)}{\Delta p(\infty)}$$

The (N=1) model is subsequently extended to an (N=2) model (also referred to as a two-chamber model or two-coating process model).

Figure 9:
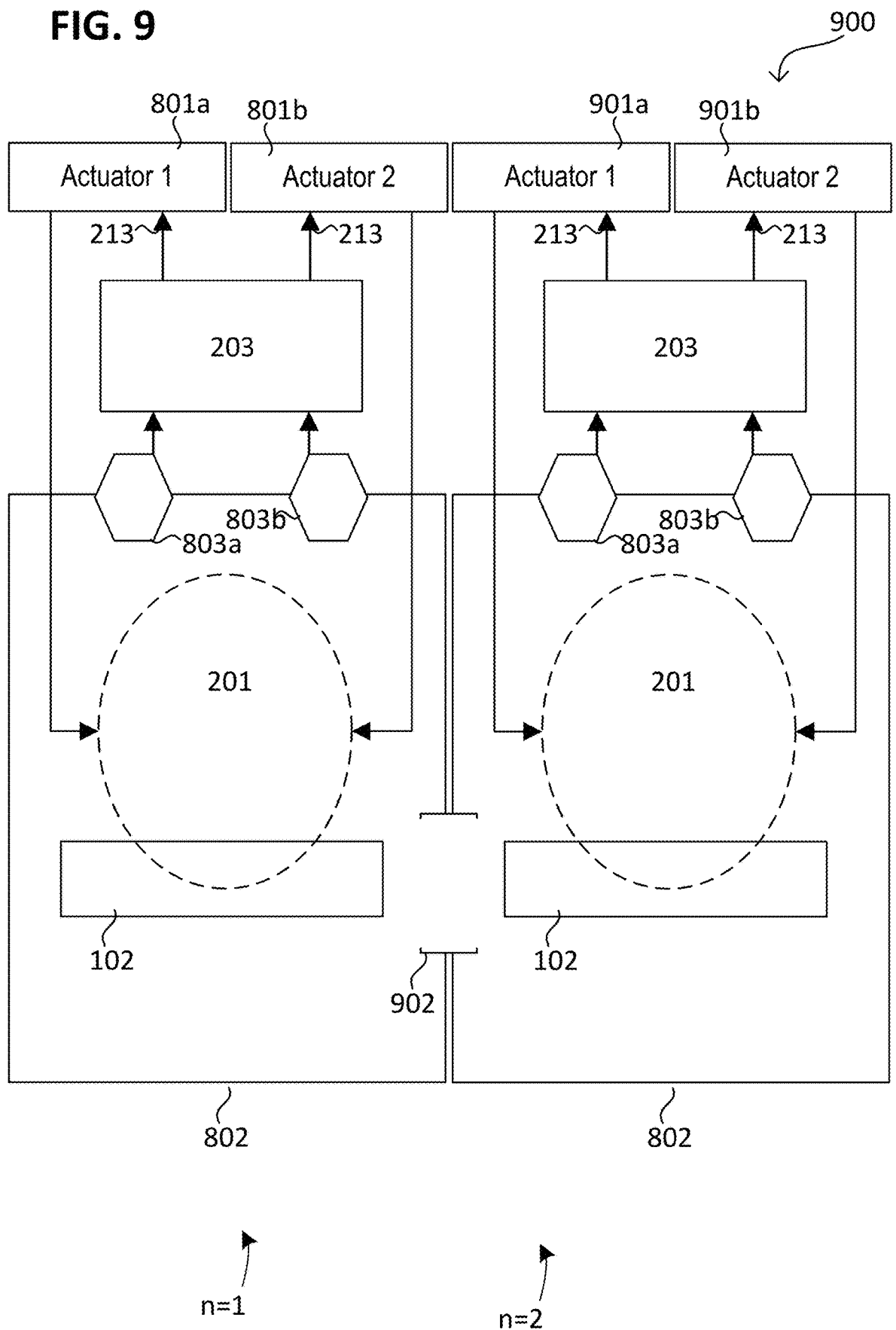

FIG. 9 illustrates in a detailed schematic diagram the (N=2) model 900 as an exemplary process model according to various embodiments. The (N=2) model 900 may represent multiple coating processes, each coating process (e.g., the nth coating process) of which is supplied by means of a first actuator 801a, 901a and a second actuator 801b, 901b, is performed within a vacuum chamber 802 (also referred to as a processing chamber), and coats a substrate 102.

Coating processes immediately adjacent to each other may interact with each other, for example, by exchanging gas through an opening 902 (also referred to as a substrate transfer opening) through which the substrate is transported between two vacuum chambers 802.

Subsequently, the index 1 references a first coating process or a first vacuum chamber in which the first coating process is carried out. Similarly, index 2 references a second coating process or a second vacuum chamber in which the second coating process is carried out.

The generalization of the (N=1) model into the (N=2) model indicates that the interaction between the two coating processes is reflected in the system matrix.

The state vector $\underline{x}$ may first be expressed as:

$$\underline{x} = \begin{pmatrix} \Delta n_{P_1} \\ \Delta n_{P_2} \\ \Delta n_{R_1} \\ \Delta n_{R_2} \end{pmatrix}.$$

By analogy, the output vector $\underline{y}$ may be expressed as:

$$\underline{y} = \begin{pmatrix} \Delta U_1 \\ \Delta U_2 \\ \Delta p_1 \\ \Delta p_2 \end{pmatrix}$$

with the operating point $\overline{\underline{y}} = \begin{pmatrix} \overline{U}_1 \\ \overline{U}_2 \\ \overline{p}_1 \\ \overline{p}_2 \end{pmatrix}$ and the measured variables $\tilde{y} = \begin{pmatrix} \tilde{U}_1 \\ \tilde{U}_2 \\ \tilde{p}_1 \\ \tilde{p}_2 \end{pmatrix} = \underline{y} + \underline{y}.$ The initial matrix C may then be expressed as:

$$\underline{y} = \begin{pmatrix} \Delta U_1 \\ \Delta U_2 \\ \Delta p_1 \\ \Delta p_2 \end{pmatrix} =$$

$$\begin{pmatrix} c^U_{P_1} \Delta p_{P_1} + c^U_{R_1} \Delta p_{R_1} \\ c^U_{P_2} \Delta p_{P_2} + c^U_{R_2} \Delta p_{R_2} \\ \Delta p_{P_1} + \Delta p_{R_1} \\ \Delta p_{P_2} + \Delta p_{R_2} \end{pmatrix} = \begin{pmatrix} c^U_{P_1} c^p_{P_1} & 0 & c^U_{R_1} c^p_{R_1} & 0 \\ 0 & c^U_{P_2} c^p_{P_2} & 0 & c^U_{R_2} c^p_{R_2} \\ c^p_{P_1} & 0 & c^p_{R_1} & 0 \\ 0 & c^p_{P_2} & 0 & c^p_{R_2} \end{pmatrix} \begin{pmatrix} \Delta n_{P_1} \\ \Delta n_{P_2} \\ \Delta n_{R_1} \\ \Delta n_{R_2} \end{pmatrix} = C\underline{x}$$

The entries of the output matrix C, which assume the value of zero, in the upper two rows illustratively represent that partial pressures or gas quantities within one vacuum chamber have no influence on the process stress in the immediately neighboring vacuum chamber(s). The entries, which assume the value of zero, in the lower two lines illustratively represent by analogy that partial pressures or gas quantities within the one vacuum chamber have no influence on the total pressures of the immediately neighboring vacuum chamber(s). Written together then is:

$$C = \begin{pmatrix} c^U_{P_1} c^p_{P_1} & 0 & c^U_{R_1} c^p_{R_1} & 0 \\ 0 & c^U_{P_2} c^p_{P_2} & 0 & c^U_{R_2} c^p_{R_2} \\ c^p_{P_1} & 0 & c^p_{R_1} & 0 \\ 0 & c^p_{P_2} & 0 & c^p_{R_2} \end{pmatrix}.$$

The input vector $\underline{u}$ may then be expressed as:

$$\underline{u} = \begin{pmatrix} \Delta v_{P_1} \\ \Delta v_{P_2} \\ \Delta v_{R_1} \\ \Delta v_{R_2} \end{pmatrix}.$$

The input matrix B may then be expressed as:

$$B = \begin{pmatrix} b & 0 & 0 & 0 \\ 0 & b & 0 & 0 \\ 0 & 0 & b & 0 \\ 0 & 0 & 0 & b \end{pmatrix}.$$

In the following, one possible implementation of the system matrix A in the (N=2) model is explained. The system matrix A represents as a first system component the dynamics of each of the two coating processes and, more specifically, of the inside of each of the two vacuum chambers 802. Additionally, the system matrix A represents as a second system component the interaction between the two coating processes and, more specifically, the vacuum chambers 802.

Basically, the two system components are superimposed on each other. As a first approximation, the first system component and the second system component may be superposed, which, in the case of linearization, may even be exact. This may be expressed as:

$$A = A_{local} + A_{exchange}$$

$A_{local}$ illustratively considers the interaction chain within the coating process, i.e. illustratively localized (within one chamber as in the single chamber model). The effective parameters $a_{loc}^{P_i}$ and $a_{loc}^{R_i}$ take into account in their entirety the pumping and the gas consumption by the exemplary and further-considered boundary effects from the adjacent coating processes.

$A_{local}$ may be expressed as:

$$A_{local} = \begin{pmatrix} -a_{loc}^{P_1} & 0 & 0 & 0 \\ 0 & -a_{loc}^{P_2} & 0 & 0 \\ 0 & 0 & -a_{loc}^{R_1} & 0 \\ 0 & 0 & 0 & -a_{loc}^{R_2} \end{pmatrix}.$$

$A_{exchange}$ takes into account the interaction between the two coating processes and more particularly between the two vacuum chambers. $A_{exchange}$ should be understood as an exemplary implementation of a consideration of the interaction, i.e. that this consideration of the interaction may also take place differently. Alternatively or additionally, the interaction between multiple coating processes may be considered in all control elements.

The exchange of gas (e.g. permanent gas flow) from the first coating process to the second coating process and vice versa may be expressed as:

$$A_{exchange} = \begin{pmatrix} -a_{12}^P & a_{21}^P & 0 & 0 \\ a_{12}^P & -a_{21}^P & 0 & 0 \\ 0 & 0 & -a_{12}^R & a_{21}^R \\ 0 & 0 & a_{12}^R & -a_{21}^R \end{pmatrix}$$

with the conductance values $a_{ij}^P$, $a_{ij}^R$. The conductances illustratively take into account how well the exchange of gas takes place and account for different gases as well as different directions. The entries, which assume zero, take into account illustratively that the flow of gas of one type (also called gas type) causes only a change in the partial pressure of gas of the same type and has no influence on the partial pressure of a gas of other type.

Written compactly, this may be expressed as:

$$A = \begin{pmatrix} -a_{loc}^{P_1} - a_{12}^P & a_{21}^P & 0 & 0 \\ a_{12}^P & -a_{loc}^{P_2} - a_{21}^P & 0 & 0 \\ 0 & 0 & -a_{loc}^{R_1} - a_{12}^R & a_{21}^R \\ 0 & 0 & a_{12}^R & -a_{loc}^{R_2} - a_{21}^R \end{pmatrix}$$

Figure 10:
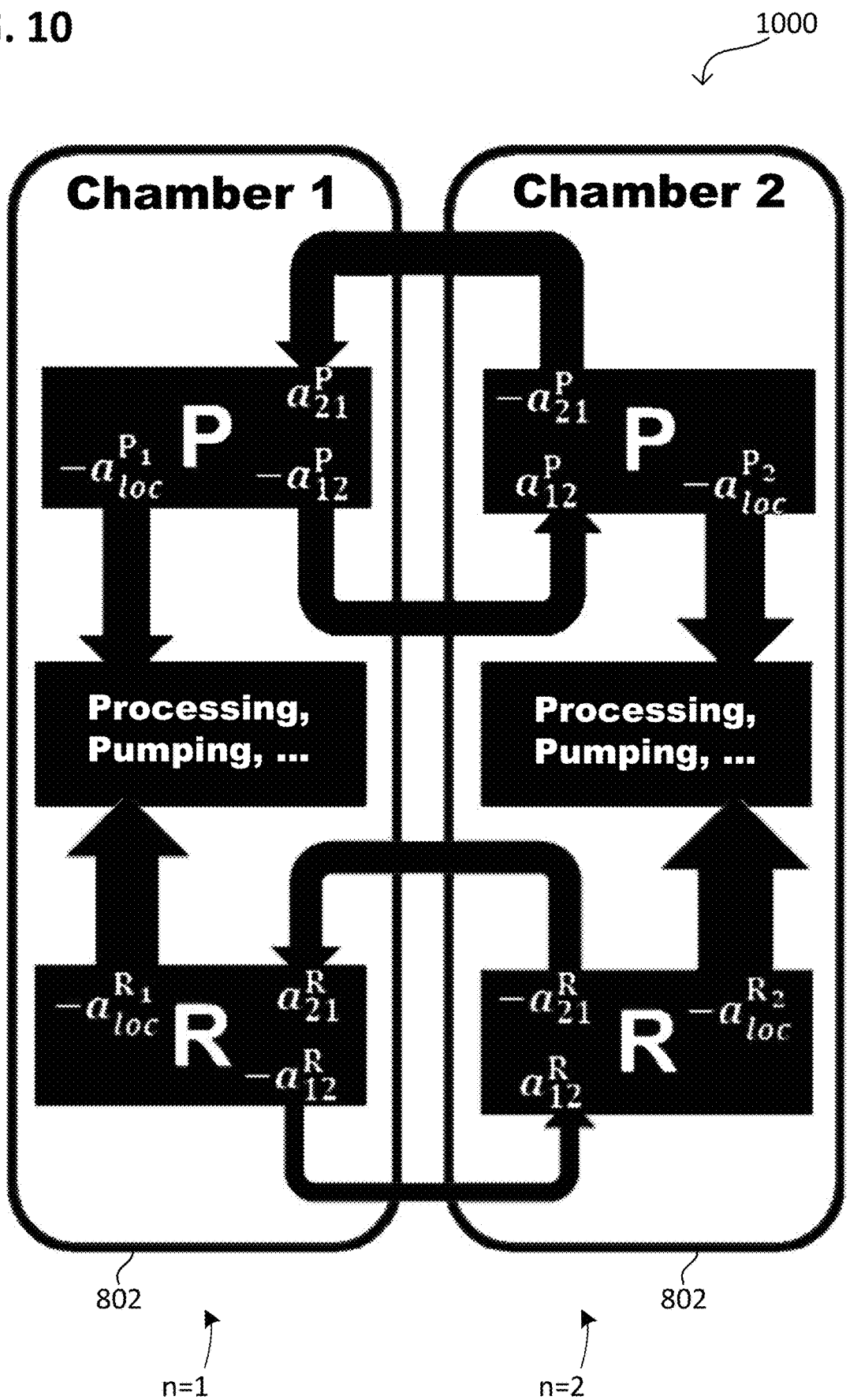

FIG. 10 illustrates the (N=2) model 900 according to various embodiments in a detailed schematic layout diagram 1000, in which the components of the system matrix A are shown. The (N=2) model is subsequently extended to an (N=3) model (also referred to as a three-chamber model or three-coating process model) in FIG. 11.

Figure 11:
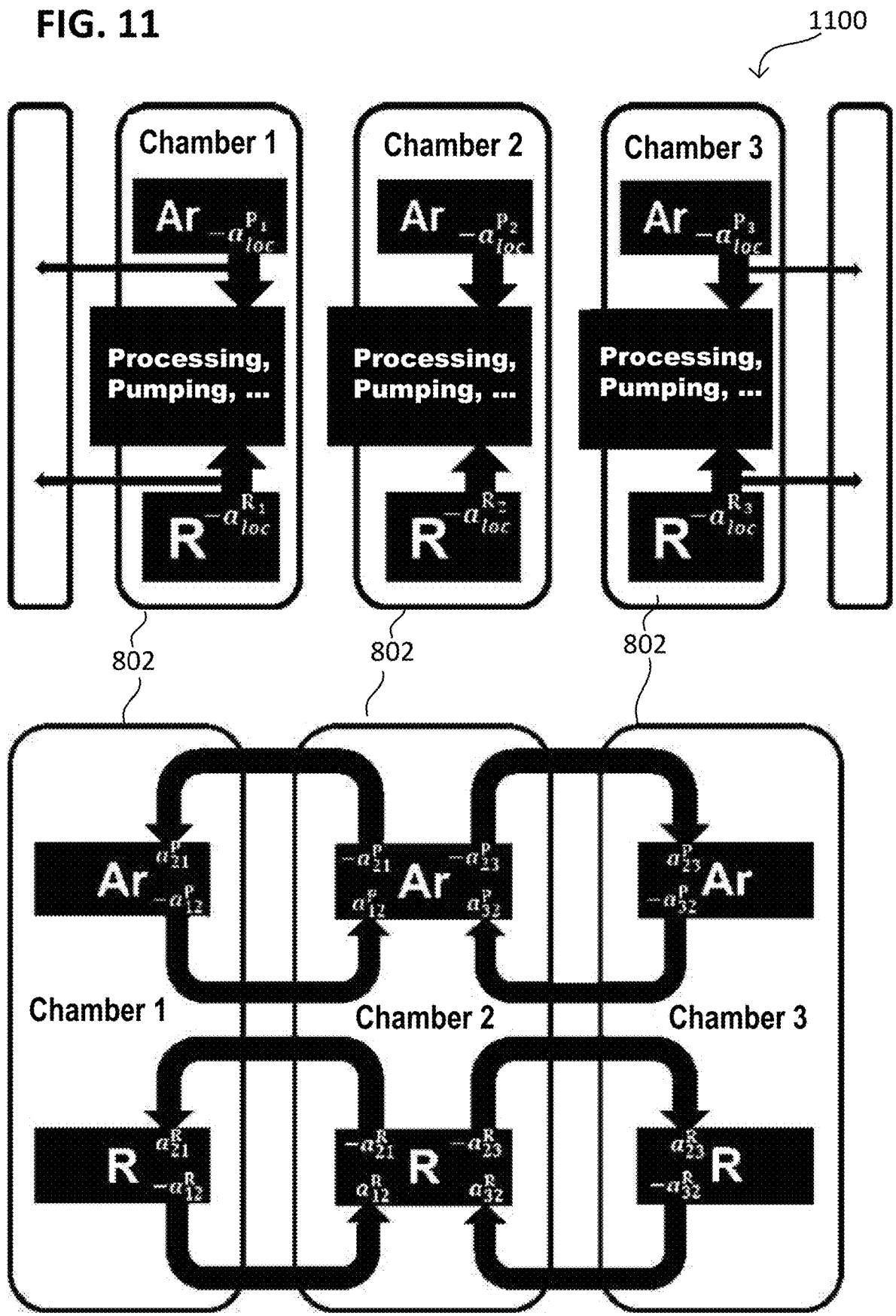

FIG. 11 illustrates an (N=3) model 1100 as an exemplary process model according to various embodiments in two detailed schematic diagrams, in which the components of the system matrix A are again shown.

When generalizing the (N=2) model into the (N=3) model, additional influences/interactions do not necessarily have to be considered. However, the shape of the system matrix changes slightly, since gas exchange with any of the two other coating processes may occur from that coating process which is adjacent to two other coating processes.

The corresponding expanded state vector, expanded output vector, expanded input vector, expanded input matrix, and expanded output matrix may then be expressed by analogy to the above as:

$$\underline{x} = \begin{pmatrix} \Delta n_{P_1} \\ \Delta n_{P_2} \\ \Delta n_{P_3} \\ \Delta n_{R_1} \\ \Delta n_{R_2} \\ \Delta n_{R_3} \end{pmatrix},$$

$$C = \begin{pmatrix} c^U_{P_1} c^p_{P_1} & 0 & 0 & c^U_{R_1} c^p_{R_1} & 0 & 0 \\ 0 & c^U_{P_2} c^p_{P_2} & 0 & 0 & c^U_{R_2} c^p_{R_2} & 0 \\ 0 & 0 & c^U_{P_3} c^p_{P_3} & 0 & 0 & c^U_{R_3} c^p_{R_3} \\ c^p_{P_1} & 0 & 0 & c^p_{R_1} & 0 & 0 \\ 0 & c^p_{P_2} & 0 & 0 & c^p_{R_2} & 0 \\ 0 & 0 & c^p_{P_3} & 0 & 0 & c^p_{R_3} \end{pmatrix},$$

$$\underline{y} = \begin{pmatrix} \Delta U_1 \\ \Delta U_2 \\ \Delta U_3 \\ \Delta p_1 \\ \Delta p_2 \\ \Delta p_3 \end{pmatrix} \text{ with Operation Point } \overline{\underline{y}} =$$

$$\begin{pmatrix} \overline{U}_1 \\ \overline{U}_2 \\ \overline{U}_3 \\ \overline{p}_1 \\ \overline{p}_2 \\ \overline{p}_3 \end{pmatrix} \text{ and Measurement Variable } \tilde{\underline{y}} = \begin{pmatrix} \tilde{U}_1 \\ \tilde{U}_2 \\ \tilde{U}_3 \\ \tilde{p}_1 \\ \tilde{p}_2 \\ \tilde{p}_3 \end{pmatrix}$$

where $\tilde{\underline{y}} = \overline{\underline{y}} + \underline{y}$, and $$\underline{u} = \begin{pmatrix} \Delta v_{P_1} \\ \Delta v_{P_2} \\ \Delta v_{P_3} \\ \Delta v_{R_1} \\ \Delta v_{R_2} \\ \Delta v_{R_3} \end{pmatrix},$$

$$B = \begin{pmatrix} b & 0 & 0 & 0 & 0 & 0 \\ 0 & b & 0 & 0 & 0 & 0 \\ 0 & 0 & b & 0 & 0 & 0 \\ 0 & 0 & 0 & b & 0 & 0 \\ 0 & 0 & 0 & 0 & b & 0 \\ 0 & 0 & 0 & 0 & 0 & b \end{pmatrix} \text{ is.}$$

In the following, an exemplary implementation of the system matrix A in the (N=3) model is explained, which takes into account the dynamics and the interaction between the coating processes. Again, this has the form:

$$A = A_{local} + A_{exchange}.$$

$A_{local}$ is also to be extended, which may be expressed as:

$$A_{local} = \begin{pmatrix} -a^{P_1}_{loc} & 0 & 0 & 0 & 0 & 0 \\ 0 & -a^{P_2}_{loc} & 0 & 0 & 0 & 0 \\ 0 & 0 & -a^{P_3}_{loc} & 0 & 0 & 0 \\ 0 & 0 & 0 & -a^{R_1}_{loc} & 0 & 0 \\ 0 & 0 & 0 & 0 & -a^{R_2}_{loc} & 0 \\ 0 & 0 & 0 & 0 & 0 & -a^{R_3}_{loc} \end{pmatrix}$$

The matrix components of $A_{local}$ are illustrated in the upper structure diagram.

$A_{exchange}$ considers gas flows from an i-th vacuum chamber (also called chamber i) into the neighboring vacuum chambers i−1 and i+1 and vice versa, $$A_{exchange} = \begin{pmatrix} -a_{12}^P & a_{21}^P & 0 & 0 & 0 & 0 \\ a_{12}^P & -a_{21}^P - a_{23}^P & a_{23}^P & 0 & 0 & 0 \\ 0 & a_{23}^P & -a_{32}^P & 0 & 0 & 0 \\ 0 & 0 & 0 & -a_{12}^R & a_{21}^R & 0 \\ 0 & 0 & 0 & a_{12}^R & -a_{21}^R - a_{23}^R & a_{32}^R \\ 0 & 0 & 0 & 0 & a_{23}^R & -a_{32}^R \end{pmatrix}.$$

Thereby $A_{exchange}$ may optionally take into account, as explained in the given example, that only one interaction of the coating processes immediately adjacent to each other takes place (also referred to as nearest neighbor interaction), i.e., illustratively, that the gas flow does not skip a vacuum chamber.

The matrix components of $A_{exchange}$ are shown in the diagram below.

Compactly, the system matrix A may then be expressed as:

$$\begin{pmatrix} -a_{loc}^{P_1} - a_{12}^P & a_{21}^P & 0 & 0 & 0 & 0 \\ a_{12}^P & -a_{loc}^{P_2} - a_{21}^P - a_{23}^P & a_{23}^P & 0 & 0 & 0 \\ 0 & a_{23}^P & -a_{loc}^{P_3} - a_{32}^P & 0 & 0 & 0 \\ 0 & 0 & 0 & -a_{loc}^{R_1} - a_{12}^R & a_{21}^R & 0 \\ 0 & 0 & 0 & a_{12}^R & -a_{loc}^{P_2} - a_{21}^R - a_{23}^R & a_{32}^R \\ 0 & 0 & 0 & 0 & a_{23}^R & -a_{loc}^{R_3} - a_{32}^R \end{pmatrix}$$

In the same way, the process model may be extended to an N-model, which considers more than three coating processes or more than three vacuum chambers, e.g. a number N of coating processes or vacuum chambers, as will be explained below.

Figure 12:
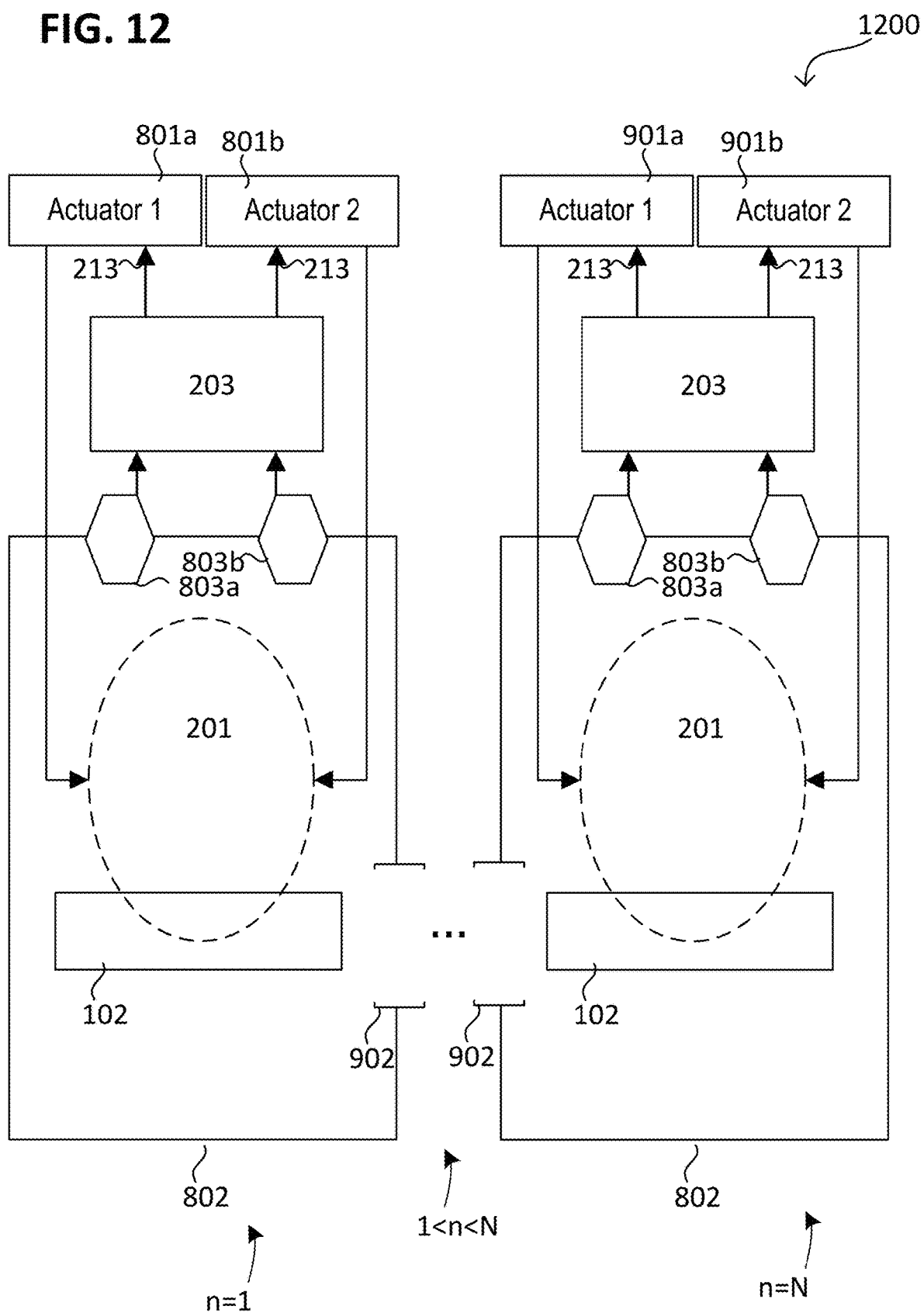

FIG. 12 illustrates the N-model 1200 as an exemplary process model according to various embodiments in a detailed schematic layout diagram.

For generalization of the (N=3) model, the following is a numbering of each coating process or vacuum chamber in which the coating process is performed. Illustratively, the substrate is coated using N (e.g., three, four, five, six, or more) coating processes, of which the nth coating process deposits the nth layer on the substrate (above the (n−1)th layer), where $1 \leq n \leq N$. The number N of coating processes may be four or more, e.g., five or more, e.g., ten or more, e.g., 20 or more, e.g., 30 or more, etc.

The above interactions may be considered, so that only the dimension of the matrices/vectors increases according to the number of coating processes.

The state vector, the output vector, the input vector, the input matrix, and the output matrix may then be expressed as:

$$\underline{x} = \begin{pmatrix} \Delta n_{P_1} \\ \dots \\ \Delta n_{P_N} \\ \Delta n_{R_1} \\ \dots \\ \Delta n_{R_N} \end{pmatrix},$$

$$C = \begin{pmatrix} \text{diag}(c_{P_1}^U c_{P_1}^P, \dots, c_{P_N}^U c_{P_N}^P) & \text{diag}(c_{R_1}^U c_{R_1}^P, \dots, c_{R_N}^U c_{R_N}^P) \\ \text{diag}(c_{P_1}^P, \dots, c_{P_N}^P) & \text{diag}(c_{R_1}^P, \dots, c_{R_N}^P) \end{pmatrix},$$

$$\underline{y} = \begin{pmatrix} \Delta U_1 \\ \dots \\ \Delta U_N \\ \Delta p_1 \\ \dots \\ \Delta p_N \end{pmatrix} \text{ mit Arbeitspunkt } \overline{y} = \begin{pmatrix} \overline{U}_1 \\ \dots \\ \overline{U}_N \\ \overline{p}_1 \\ \dots \\ \overline{p}_N \end{pmatrix} \text{ und Messgrößen } \tilde{y} = \begin{pmatrix} \tilde{U}_1 \\ \dots \\ \tilde{U}_N \\ \tilde{p}_1 \\ \dots \\ \tilde{p}_N \end{pmatrix}$$

-continued where $\tilde{y} = \overline{y} + \underline{y}$, and $$\underline{u} = \begin{pmatrix} \Delta v_{P_1} \\ \dots \\ \Delta v_{P_N} \\ \Delta v_{R_1} \\ \dots \\ \Delta v_{R_N} \end{pmatrix},$$

and $B = \text{diag}(b, \dots, b).$

In the following description, a possible implementation of the system matrix A in the N-model is discussed, which takes into account the dynamics and the interaction between the coating processes. In block notation, the system matrix may be A may be expressed as:

$$A = \begin{pmatrix} A^P & 0 \\ 0 & A^R \end{pmatrix}$$

where the matrix components of the block matrix $A^P$ may be expressed as:

$$(A^P_{i,j})_{\substack{i=1,\ldots,N; \\ j=1,\ldots,N}} = \left[-a^{P_i}_{loc} - (1-\delta_{i,1})a^P_{i,i-1} - (1-\delta_{i,N})a^P_{i,i+1}\right]\delta_{i,j} + a^P_{j,i}\delta_{i,j-1} + a^P_{j,i}\delta_{i,j+1}$$

and the matrix components of the block matrix $A^R$ may be expressed as:

$$(A^R_{i,j})_{\substack{i=1,\ldots,N; \\ j=1,\ldots,N}} = \left[-a^{R_i}_{loc} - (1-\delta_{i,1})a^R_{i,i-1} - (1-\delta_{i,N})a^R_{i,i+1}\right]\delta_{i,j} + a^R_{j,i}\delta_{i,j-1} + a^R_{j,i}\delta_{i,j+1}$$

The expression $\delta_{i,j}$ denotes the so-called Kronecker delta, which satisfies the following relationship:

$$\delta_{i,j} = \begin{cases} 1, & i = j \\ 0, & i \neq j \end{cases}$$

Figure 13:
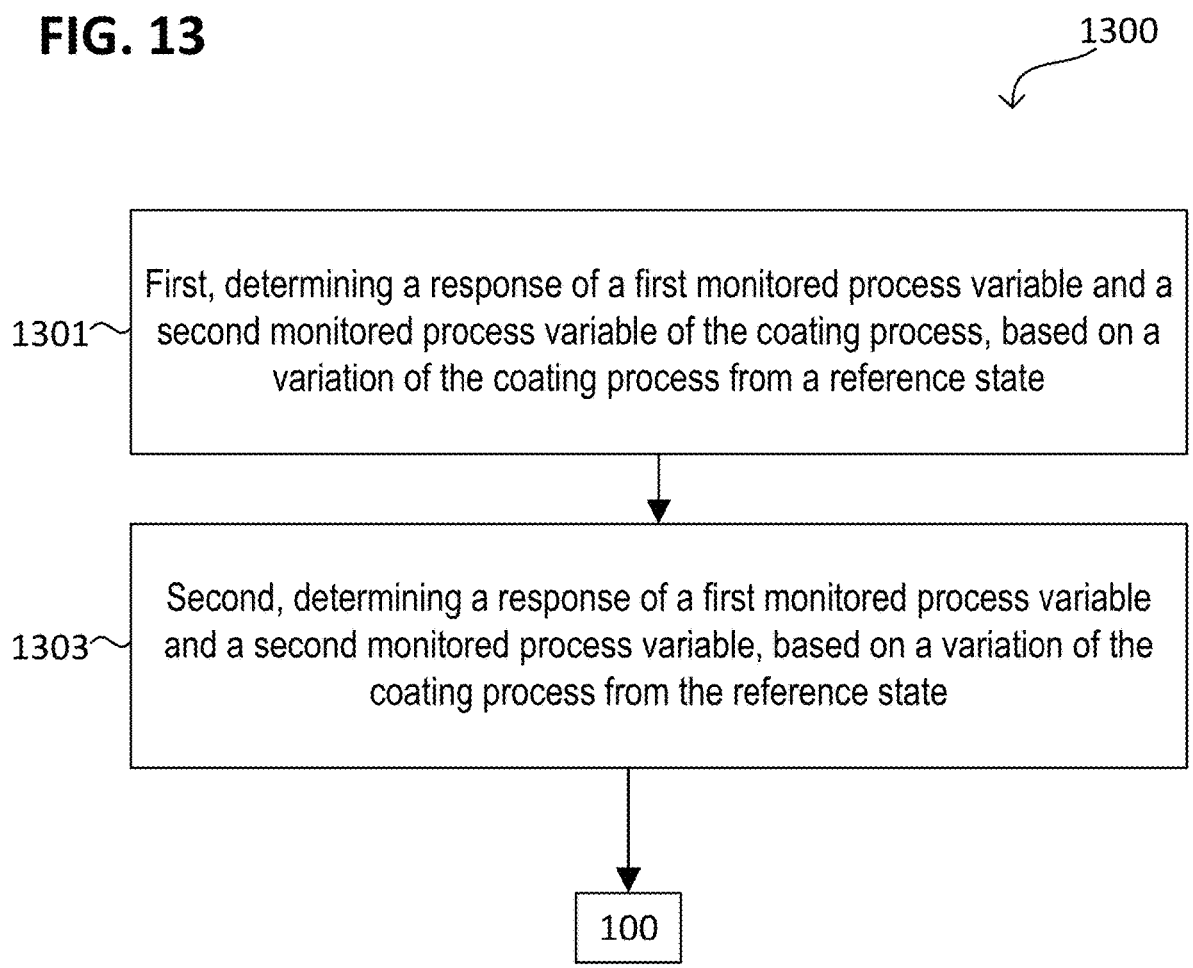
FIG. 13 shows a process according to various embodiments in a schematic flowchart.

FIG. 13 illustrates a method 1300 according to various embodiments in a schematic flowchart. The method 100 may be used to calibrate a (e.g., reactive) coating process. For example, the method 1300 may be used to calibrate a process group that performs one or more reactive coating processes.

The method 1300 includes, in 1301, when (e.g., accurately) driving a first actuator that powers the coating process, first determining a response of a first monitored process variable and a second monitored process variable of the coating process to a variation of the coating process from a reference state. In other words, as part of the first determination, the variation is effected by controlling the first actuator that supplies the coating process.

The method 1300 includes, in 1303, when (exactly) actuating a second actuator that supplies the coating process, second determining a response of the first monitored process variable and the second monitored process variable of the coating process to a variation of the coating process from the reference state. In other words, as part of the second determination, the variation is effected by controlling the second actuator that supplies the coating process.

The reference state may include that the first monitored process variable includes a first state and the second monitored process variable includes a second state. Illustratively, the variation of the coating process is determined from the same reference state. The variation of the coating process should be understood as the response of the coating process to external stimuli in the form of activating the first and/or second actuator.

For example, whether the coating process is in the reference state may be determined by sensing the first monitored process variable and the second monitored process variable. Similarly, the response of the first monitored process variable and the second monitored process variable may be determined by detecting the first monitored process variable and the second monitored process variable.

The variation of the coating process from the reference state may, for example, take place in a step-like manner (the response then being referred to as a step response). For this purpose, the first actuated variable and/or the second actuated variable may be changed in a step-wise manner. It should be understood that what is explained herein for the exemplary step response may also apply by analogy for another (e.g. less step-wise and/or cyclic) variation of the coating process from the reference state.

Illustratively, the step response represents two indicators of the coating process, namely the half-life of the response and the convergence value of the response.

The first detection and the second detection may, for example, take place one after the other. This makes it easier to detect the corresponding variation as a response, for example when the multiple monitored process variables interact with each other.

The method 1300 may optionally include determining the process model and/or the control model based on the response of the first monitored process variable and the response of the second monitored process variable. For example, the control model may be determined based on the process model or determined directly from the determined response.

The control model may in turn be used to perform the method 100. For example, the control model that is fed to the method 100 may be formed and/or updated by means of the method 1300.

The method 1300 facilitates determining the control model for one or more coating processes, e.g., one or more members of the control model (also referred to as a control member).

For example, the model elements (A, B, C), e.g., in the form of model matrices, may be determined in whole or in part experimentally, for example, if no accurate process model of the one or more coating processes are available. Alternatively or additionally, the process 1300 may be at least partially automated (e.g., semi-automated), such that highly skilled and/or experienced personnel need not necessarily be present. Illustratively, the process 1300 is very robust and therefore very user-friendly, even if the operator makes minor errors or inaccuracies or the operator has little knowledge of the underlying interactions of the one or more coating processes.

Of course, this also applies to highly qualified and/or experienced technical personnel, for example if the high complexity of the one or more coating processes make it difficult to guess parameters of the control model, or if a compensation calculation based on measurement data (e.g. using simplex algorithms) is very unstable and/or unreliable due to the high number of degrees of freedom/parameters.

The method 1300 achieves this with as little measured information as possible to estimate the process model (also called a (A, B, C)model), and more particularly, for an autotuning algorithm.

For example, the choice of the process model described herein means that B may be predefined from the outset and thus only A and C may be determined. A combination of the experimental determination of $K_s$ from measurement data and the existing model abstraction may be used to determine from the measurement data an approximation for C and from $K_s$ so that A may be directly determined, e.g. without the need for user intervention.

An exemplary implementation of method 1300 is explained below.

FIG. 14 illustrates a time sequence according to the method 1300 in a schematic diagram 1400, in which the components of the input vector $\underline{u}(t)$, e.g. their actual state, and the components of the output vector $\underline{y}$, e.g. their actual state, are shown over time, t.

For a simpler understanding, reference is made once again to the relationship explained above, which contains the control elements $K_y$, $K_P$, and $K_I$ in relation to each other and to the input vector:

$$\underline{u}(t) = -K_y \underline{y}(t) - K_P (\underline{y}(t) - \underline{w}) - K_I \underline{x}_r(t)$$

It should be understood that the three control elements $K_y$, $K_P$, and $K_I$ are exemplary, and the underlying relationships may also be formulated differently. For example, more or less than three control elements may be used. For example, two or more control elements may be combined, for example by means of a transformation into a higher-dimensional space. For example, one control element may be split, for example using a transformation to a lower dimensional space. For example, a state feedback K may be used alternatively or additionally to output feedback $K_y$.

The method 1300 includes, in each of the phases 1401, 1405, 1409, bringing the coating process to the reference state, e.g. by driving at least one actuator (e.g. the first actuator and/or the second actuator) that supplies the coating process. For example, control of the at least one actuator may be performed in a controlled manner, e.g. until the actual output vector y fulfills a predefined criterion.

For example, the predefined criterion may be fulfilled if the actual output vector $\underline{y}$ essentially corresponds to a target output vector (which corresponds to a target operating point as a reference state), i.e. deviates from it as little as possible.

The target operating point may, for example, be set by adjusting the feed rate $\underline{u}$ as an actuated variable of each material supplied to the coating process, so that the actual output vector is $\underline{y}$ is implicitly set. This may be done, for example, based on hysteresis data near the target operating point.

In the following, some parameters (also called calibration parameters) are explained, according to which the procedure 1300 may be performed. The parameters illustratively define the processing routine, e.g. measurement duration, measurement frequency, magnitude of variation, etc.

As an exemplary calibration parameter, a settling time $T_{meas}$ and a value for $\Delta t_{meas}$ may be predefined. $T_{meas}$ is used to reach final values within an experiment/time window or to return to the operating point, whereby the sensors are read out at clocked intervals of $\Delta t_{meas}$. In other words, the measurement data is provided with the frequency $1/\Delta t_{meas}$. Example values may include: $T_{meas}=90$ s, $\Delta t_{meas}=200$ ms.

An exemplary calibration parameter may be a percentage $p_{T_{meas}}^{avg}$ of the settling time $T_{meas}$, within which the acquired measurement data are averaged over the last part of the time window. Averaging is optional and may be done, for example, to compensate for systematically and/or randomly fluctuating measurement values (e.g., voltage during target rotation). Exemplary values may include: $p_{T_{meas}}^{avg}=25\%$, $p_{T_{meas}}^{avg}=55\%$.

As an exemplary calibration parameter, a step height S for the control values (e.g. for working gas $v_P$ and reactive gas $v_R$) with respect to the input u may be predefined. For example, the step height may be as small as possible (so that a good linear model may be determined) but cause a measurable change in the output vector (for example, to suppress measurement uncertainties, target rotation, etc.). Example values may include: $v_P=100$ sccm, $v_R=100$ sccm.

As an exemplary calibration parameter a weighting r for the inputs and weightings q for the outputs of the integrated system may be predefined. These may be used for the later determination of Q and R for the discrete-time LQR algorithm. Based on the recorded measurement data values obtained after the settling time has elapsed $T_{meas}$ or within $p_{T_{meas}}^{avg}$, the individual inputs and outputs may optionally be normalized. In that case, for multiple coating processes, essentially identical weighting factors r and q may be predefined. Exemplary values may include: $r_P=10$, $r_R=10$, $q_v=1$, $q_U^{Int}=0.001$, $q_P=1$, $q_p^{Int}=0.01$.

As an exemplary calibration parameter, a stability boundary a for the discrete-time LQR algorithm (if used) may be predefined. Example values may include: $\alpha=0.1$, $\alpha=0.2$.

The method 1300 includes, in phase 1403, moving the coating process from the reference state by controlling the first actuator that supplies the coating process; and in phase 1407, moving the coating process from the reference state by controlling the second actuator that supplies the coating process.

The method 1300 includes, in each of the phases 1403, 1407, detecting the response of the coating process to the variation, e.g., by detecting the change over time of the first monitored process variable and/or the second monitored process variable. Optionally, detecting the actual state of each coating process in the reference state, e.g., in each of the phases 1401, 1405, 1409. For example, one or more sensors may be used to detect in parallel the actual state of each of the monitored process variables.

For example, a measurement (e.g. automated) may be carried out, which has the function of acquiring measurement data in the specified cycle, $\Delta t_{meas}$, and subsequently storing it.

In the following, one exemplary implementation is explained that uses an inflow rate as an actuated variable. When the coating process is in the reference state, the actual inflow rate is $\underline{u}$ is recorded, e.g. for one or more materials (e.g. gas) supplied to the coating process. Optionally, the settling time may elapse before the measurement data is recorded. The measurement data may, for example, include a time stamp $t_k$ and represent the actual state of the input vector $\underline{u}_k$ and/or the actual state of the output vector $\underline{y}_k$. Capturing the final value (when the respective phase finishes) yields, as the output vector, the operating point $\underline{y}$ for the set actual inflow rate $\underline{u}$.

In each of the phases 1403, 1407 the input vector may be changed step-wise with respect to an inflow rate, and the process may wait for a settling time to elapse. After the settling time has elapsed, the measurement data may be recorded. Each of the phases 1403, 1407 corresponds illustratively to a single experiment on the corresponding vector component of the input vector $\underline{u}_k$.

In each of the phases 1405, 1409 the inflow rate may be $\underline{u}$ may be returned to the reference state (i.e. before phase 1405).

If multiple contiguous coating processes are to be calibrated, the sequence of phases 1401 to 1409 (also referred to as calibration sequence) may be performed for each of the coating processes. For example, the calibration sequence may include at least two phases per monitored process variable to be calibrated or per actuator to be calibrated, one phase of which includes the reference state and another phase of which includes the variation from the reference state.

Once the calibration sequence 1401 to 1409 is completed for a first coating process, the calibration sequence 1401 to 1409 may be performed for a second coating process (i.e., sequentially), then for an optional third coating process, and so on. For example, per coating process, the feed rate of the process gas may be changed, then the feed rate of the reactive gas may be changed, and then proceeding to the next coating process until the calibration sequence 1401 to 1409 has been performed for each of the coating processes. The measurement data may be stored, for example, in a file (such as a controller calibration file) or in a database. The measurement data (e.g., including the acquired time series) may, of course, also be stored in other ways, for example, for immediate or subsequent further use.

Based on the input matrix $U=(\underline{u}_1\ \underline{u}_2\ \ldots\ \underline{u}_n)$ and the output matrix $Y=(\underline{y}_1(\infty)\ \underline{y}_2(\infty)\ \ldots\ \underline{y}_n(\infty))$ as the response of the coating process, the system matrix may be determined, for example according to the relationship:

$$K_s = YU^{-1}$$

An exemplary implementation for determining the model of the controlled system is explained below. First the model element C may be determined (e.g. approximated). The determination of the model member C may include approximating pressure coefficients $c_P^P$, $c_R^P$ and stress coefficients $c_P^U$, $c_R^U$ for each coating process. The approximation may be done by taking advantage of the fact that only one inflow rate per coating process (e.g. the inflow rate to a respective vacuum chamber) is used with respect to the operating point (in the equilibrium state). In other words, neglecting the self-feedback (gas flowing into adjacent chambers and then back again), the (N=1) model may be used. The signal course of a single experiment may optionally be smoothed and/or interpolated. By means of a numerical method to search for nulls, the half-life may be determined with respect to the total pressure to which the respective coating process is subjected (e.g. in the vacuum chamber). According to the (N=1) model explained above, the coefficients may be determined specific to the input component.

The determination of the model member C may further include that the coefficients of the individual components are combined into the matrix C.

In the following, an exemplary implementation for determining the static element is explained. $K_s$ is explained. The determination of the static element $K_s$ may be determined as explained above for the experimental determination of the at least one control element. The static element may be determined directly from the individual experiments (for example with respect to the operating point approximation). It should be noted that the differences to the target operating point, i.e. $\bar{u}$, $\bar{y}$, may also be considered.

In the following, an exemplary implementation for the numerical determination of the model element A is explained. By construction, the model of the controlled system may provide the identical static element as explained above, i.e. the static element may be used directly to determine an approximation for the model element A, e.g. according to the relationship explained above:

$$K_s = -CA^{-1}B$$

If B is already determined independently of the system (as explained for the (N=1) model), the following may be determined directly $A=-BK_s^{-1}C$ may be determined directly. As a result, the model elements of the controlled system model (A, B, C) have now been determined for the operating point ($\bar{u}$, $\bar{y}$).

Optionally, the controlled system may be discretized based on the PLC cycle time. As explained above for discretization (see FIG. 6), a discrete-time model ($A_d$, $B_d$, C) from one cycle to an immediately following cycle may be determined. Instructions for determining the matrix exponential function and the integral by means of a diagonalization are also explained for the above discretization.

An exemplary implementation for determining the at least one control element is explained below.

Determining the at least one control member may include determining the weighting matrices Q and R for the discrete-time LQR algorithm. Normalization may be used to compensate for differences in numerical magnitudes of pressure and stress and differences between different coating processes. If the output weighting factors explained above are combined into a vector $q$ a weighting matrix is obtained from the measurement data by means of normalization, which may be written as:

$$Q_y = \text{diag}\left(\frac{q}{\max_k(\underline{y}_k) - \min_k(\underline{y}_k)}\right).$$

From the diagonal weighting matrix $Q_y$, $Q=C^T Q_y C$ may now be selected for the LQR algorithm. From the weighting factors for the inputs explained above and the inflow rates (also called flows) set for the individual experiments, a diagonal matrix may be constructed:

$$P = \text{diag}\left(\frac{r}{\max_k(u_k) - \min_k(u_k)}\right).$$

The determination of the at least one control element may include that the control element $K_{Integral}$ is determined by means of the LQR algorithm. For example, a numerical solution of a discrete-time matrix Riccati equation, which is accessible via numerical libraries, may be used for this purpose.

The determination of the at least one control element may include a decomposition of the control element $K_{Integral}$ into a plurality of control elements. The plurality of control elements may include:

$$K_y = B_d^{-1}(A_d - 1)C^{-1},$$

$$K_P = K_1 C^{-1} - K_y,$$

$$K_I = K_2.$$

The decomposition of $K_{Integral} = (K_1\ K_2)$ into the multiple control elements may be done as explained above with respect to diagram 400 and with respect to discretization.

The plurality of control elements determined in this manner may, for example, be supplied to and processed by a PLC. The PLC may then perform the method 100 based on the plurality of control elements. For example, the group of multiple control variables acquired in parallel may be mapped to the first actuator controlling variable and to the second actuator controlling variable.

The following describes other aspects that may be optionally used.

A first aspect may include limiting the individual inputs by means of at least one limit (i.e., including an upper limit and/or a lower limit):

$$u_i \in [u_i^{min}, u_i^{max}]$$

This compensates for complications that may occur due to numerical problems, operating errors, or errors in the measurement technology, and, at a minimum, their effects may be reduced.

Should a flow be determined that lies outside the interval $[u_i^{min}, u_i^{max}]$, the corresponding component $u_i$ may be set to the limit which is closest. Using such a limit ensures that the coating process is not operated under very unfavorable conditions or in a way that fails. Based on the at least one boundary, it may also be determined, for example, whether a so-called "integrator windup" (or integral windup or reset windup) should be reduced when controlling the coating process, for example if the component $u_i$ has been set to the limit over a longer period of time. The removal of the integrator windup is explained below.

In the case that the controller has been given a non-achievable target operating point and has built up a significant integral of the control deviation (the so-called windup), this may only be reduced again when an achievable operating point (e.g. having one or more targets) has been specified again. The desired controller behavior is then restored much later. The following two exemplary implementations explain the suppression of these effects.

The first implementation to suppress these effects may include pausing the accumulation of the setpoint deviation. If the controller receives as a target an unreachable operating point, it may hit one or more limits of the calculated input components $u_i$. Assuming that an input has a dominant effect on an output assigned to it (e.g., working gas on the total pressure or reactive gas on the process voltage of a coating process), the integration/accumulation of the associated setpoint deviation may be suspended. As soon as the controller detects an input in the valid interval again, the integration may resume, in which case no windup has to be removed.

The second implementation to suppress these effects may include performing a reset of the accumulated setpoint deviation. This action does not require any further information about the coating process. The second implementation may include determining a suitable criterion that defines the time for the reset. Since the significant portion of the calculated input (compare to diagram 400) is determined by the output feedback using $K_y$, the accumulated control deviations may simply be set to zero at a defined time (also called a reset). Since the accumulated control deviations are essentially to suppress model variations and disturbance variables, the method simply readjusts after this reset without having a strong influence on the course of the input $\underline{u}$.

A second aspect may include that the coating process is an unstable coating process (e.g., when depositing $SiO_x$). An unstable coating process exhibits hysteresis in the monitored process variable's response to a change in an actuated variable, making it difficult to determine the response of the coating process to a variation from the reference state. For example, the unstable coating process may tend to leave the reference operating point on its own and/or oscillate between two self-regulated (stable) operating points (also referred to as bistable). For example, the coating process may tend towards and get stuck in one of the two bistable working points.

The bistable behavior is mostly brought about by a positive feedback within the reaction dynamics, which itself stabilizes some of the operating points. For example, in reactive sputtering, the sputtering cathode may react with oxygen as a reactive gas, which makes its surface more resistant to the plasma, thereby inhibiting sputtering (also known as target poisoning). This means that less oxygen will be consumed, resulting in excess oxygen, which in turn oxidizes the surface of the coating material even more. A reduction of the reactive gas reduces the excess such that the oxidation of the sputtering cathode decreases. This accelerates the sputtering of the coating material and thus also increases the consumption of reactive gas until its excess is reduced and the reaction dynamics automatically tip towards a metallic surface of the sputter cathode. However, if a not completely reacted reaction product is required, it may be necessary to operate the sputtering process at an unstable operating point between the stable operating points (also referred to as balance control).

If the coating process is an unstable coating process, the process model may be determined based on two hysteresis curves recorded at different process gas flows. This may include that C is determined from a plurality of hystereses. The primary information is then embedded in the pressure curves by recording step responses for the individual experiments. The stresses may be generated synthetically by estimating them from the pressures and the coefficients from C. The recorded pressures and artificially generated stress readings may then be processed in the manner described above.

A second aspect may include that an approximation of the control model is determined by means of a machine learning (e.g. multi-layer learning or the so-called "deep learning"), as will be described in more detail later. Simulated measurement data of the coating process may be used as input variables of the machine learning, and the process model underlying the simulation may be used as output variables of the machine learning. Optionally, the simulated measurement data may be made noisy, which makes the result of the machine learning more robust. The noise of the measurement data is to be understood as an example, which simulates one or more real disturbance variables (illustratively a disturbing environmental influence) in a comparatively simple way. For example, disturbance variables such as noise of the measurement equipment or voltage fluctuations due to the rotating target may be emulated.

More generally, one or more disturbance elements, each representing (e.g., modeling) a (e.g., internal and/or external) disturbance variable of the coating process, may be superimposed on the simulated measurement data. The model is thus induced to suppress and/or ignore such disturbance variable(s) so that it becomes more robust The following illustrates an exemplary process group to which the process 100 and/or the process 1300 may be applied.

Figure 15A:
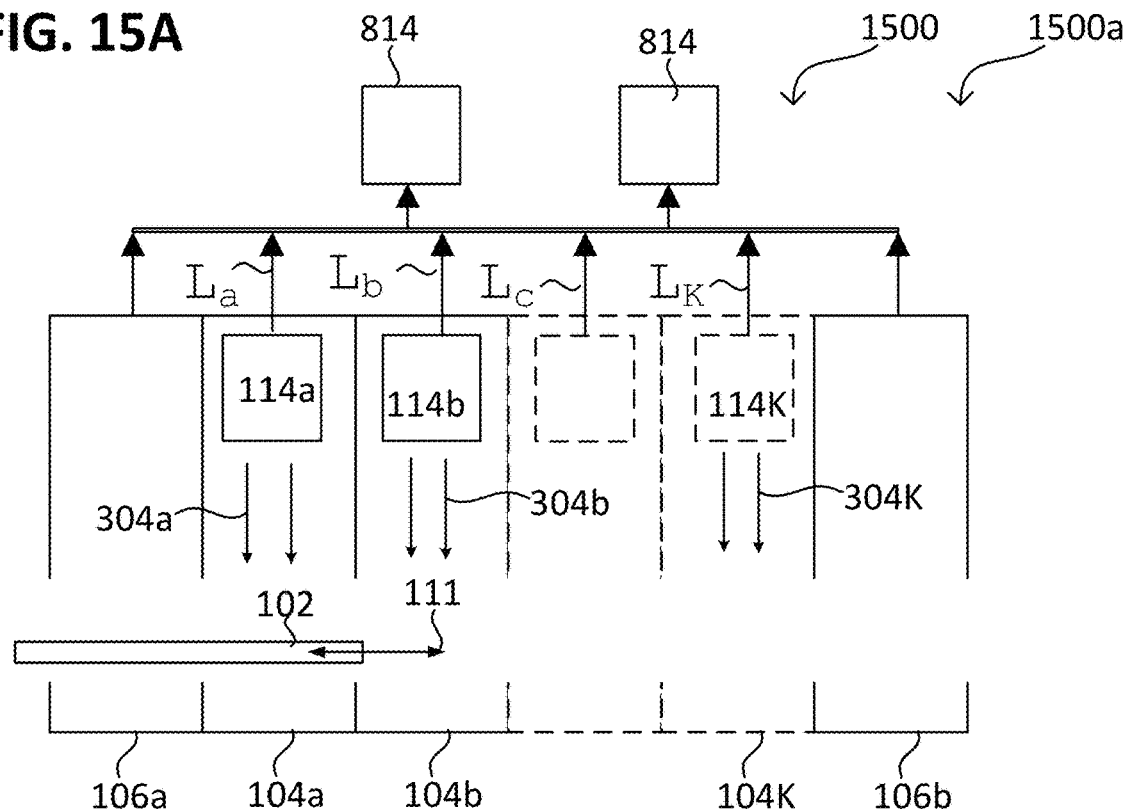
FIGS. 15A and 15B each illustrate a process group according to different embodiments in different layout diagrams.
Figure 15B:
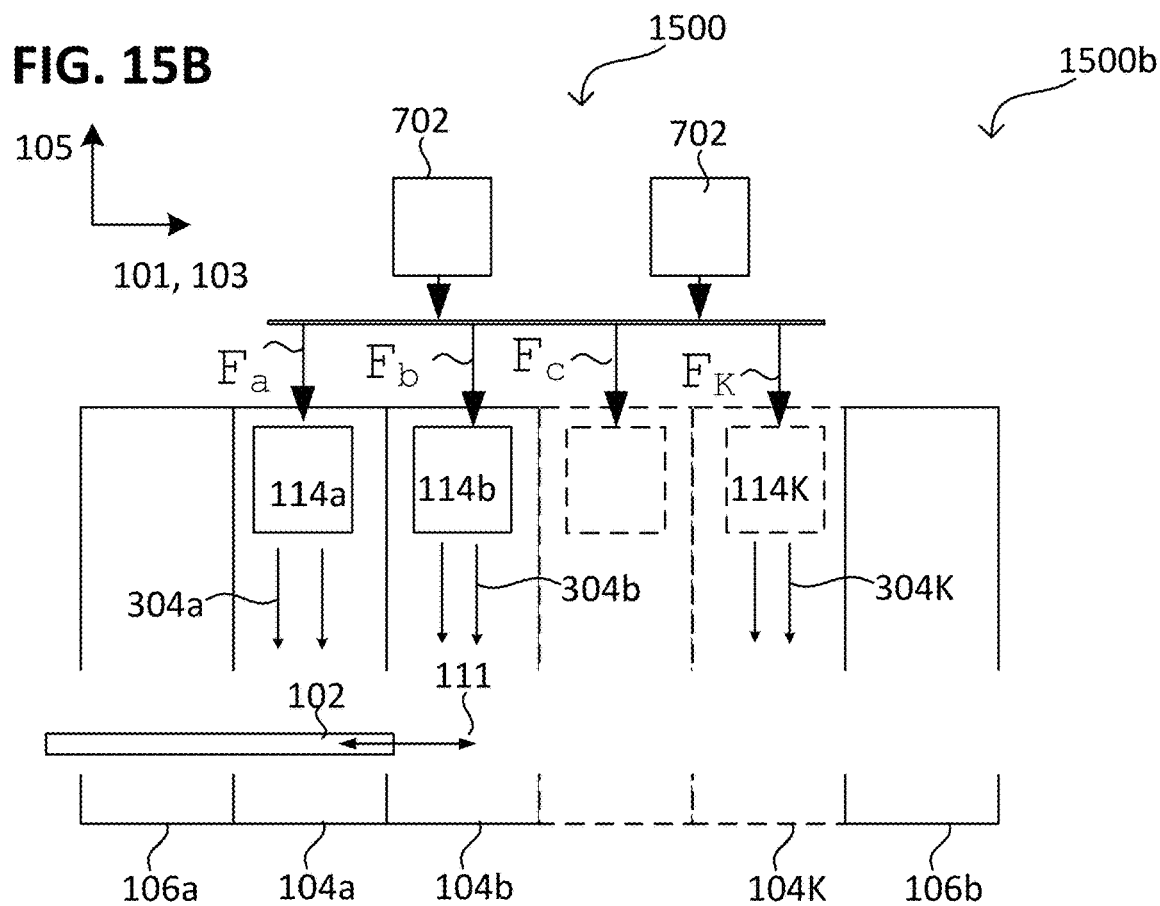

FIG. 15A and FIG. 15B each illustrate a process group 1500 according to different embodiments in different build-up diagrams 1500a, 1500b.

The process group 1500 may perform multiple (e.g., reactive) coating processes, e.g., two or more coating processes (e.g., three, four, five, six, or more). To this end, the process group 1500 may include multiple coating regions 104a, 104b, . . . , 104K, wherein exactly one coating process 304a, 304b, . . . , 304K (a coating process 201 to be controlled) may occur in each of the coating regions 104a, 104b, . . . , 104K.

Each of the coating regions 104a, 104b, . . . , 104K may have a respective coating apparatus 114a, 114b, . . . , 114K for performing the respective coating process therein. Each of the coating regions 104a, 104b, . . . , 104K may be or may be provided by means of (e.g., exactly) one vacuum chamber. One or more vacuum chambers may be or become provided by means of a chamber housing. Multiple vacuum chambers in a chamber housing may also be referred to as compartments.

The vacuum chambers may be separated from each other, e.g. by means of so-called chamber walls, so that they are at least partially (albeit slightly), e.g. partially or completely, gas-separated from each other in terms of the vacuum. For example, multiple coating processes may be controlled that are independent of each other or not coupled to each other, e.g., to save controller hardware. However, the gas separation may be so small that the multiple coating processes exchange a gas with each other (also referred to as gas exchange). For example, a gas flow may occur from a second coating region 104b through a first coating region 104a toward a first pumping region 106a.

Each coating device 114a, 114b, . . . , 114K may be adapted according to various embodiments for coating at least one substrate 102 (i.e., one or more substrates 102) that is transported 111 through the respective coating region, for example. For example, the coating device may be adapted to provide a gaseous coating material (material vapor) that may be deposited, for example, on the at least one substrate 102 to form a layer. A coating device may include at least one of: a sputtering device or a thermal evaporation device (e.g., a laser beam evaporator, an arc evaporator, an electron beam evaporator, and/or a thermal evaporator). A sputtering device may be configured to sputter the coating material using a plasma (also referred to as sputtering). A thermal evaporation device may be configured to evaporate the coating material using thermal energy.

At least one reactive gas may be supplied to a reactive coating process, with which the emitted (e.g., atomized) coating material chemically reacts so that the reaction product is deposited on the substrate 102.

For example, more than one (e.g., each) coating process of process group 1500 may be supplied with the same working gas and/or reactive gas. Alternatively or additionally, more than one (e.g., each) coating process may use the same coating material.

The process assembly 1500 may further include two pumping regions 106a, 106b between which the plurality of coating regions 104a, 104b, . . . , 104K are disposed. Gas may be extracted from each of the two pumping regions 106a, 106b, for example, more than each of the coating regions 104a, 104b, . . . , 104K. According to various embodiments, the process group 1500 may include a pump arrangement 814 (including at least one high vacuum pump). The pump arrangement 814 may be configured to withdraw a gas (e.g., the process gas depleted of reactive gas by reaction) from at least the two pumping regions 106a, 106b, and optionally from at least one (e.g., each) coating region 104a, 104b, . . . , 104K, such that in each of the regions a vacuum (e.g. a pressure lower than 0.3 bar) and/or a pressure in a range from about $10^{-3}$ millibar (mbar) to about $10^{-7}$ mbar (in other words, high vacuum) or a pressure lower than high vacuum, e.g., lower than about $10^{-7}$ mbar (in other words, ultra-high vacuum) may be or be provided in each of the regions.

By means of the pump arrangement 814, one or more gases may be extracted from each of the coating processes, e.g. a part of the process atmosphere. For this purpose, a corresponding suction power $L_a, L_b, \ldots, L_K$ may be applied to each of the coating processes 304a, 304b, . . . , 304K with which the extraction takes place.

Further, the process group 1500 may be configured such that the vacuum conditions (the process conditions) within each of the plurality of coating regions 104a, 104b, . . . , 104K (e.g., process pressure, process temperature, chemical composition of the process gas, etc.) may be set or controlled, e.g., while performing the coating process (e.g., according to the target operating point) by means of corresponding two or more actuators (first and second actuators) per coating process.

According to various embodiments, the process group 1500 may include a gas supply 702. By means of the gas supply 702, the working gas may be supplied to at least one (e.g., each) coating region 104a, 104b, . . . , 104K to form a process atmosphere in the regions. The process pressure may be formed from a balance of process gas supplied by means of the gas supply 702 and withdrawn by means of the pump arrangement 814.

By means of the gas supply 702, one or more gases may be supplied to each of the coating processes, e.g., to the process atmosphere in which the coating process takes place. For this purpose, each of the coating processes 304a, 304b, . . . , 304K may have a corresponding feed rate (e.g. a standard volume flow) $F_a, F_b, \ldots, F_K$ applied to it with which the feeding takes place.

To make the process group 1500 as compact as possible, the coating regions 104a, 104b, . . . , 104K may optionally be provided directly adjacent to each other or without any intervening pumping regions 106a, 106b. This may result in the coating regions 104a, 104b, . . . , 104K exchanging more gas with each other.

For example, less (or no) pumping power may be applied between two immediately adjacent coating areas than at each of the two immediately adjacent coating areas.

Thus, the coating of the substrate 102 may include a plurality of layers, each layer formed by one of the plurality of coating processes 304a, 304b. For example, each of the layers may include the coating material and optionally a component of the reactive gas, such as a reaction product thereof.

Controlling the process group 1500, e.g., any coating process performed using the process group 1500, may be performed using the method 100, for example.

Figure 16A:
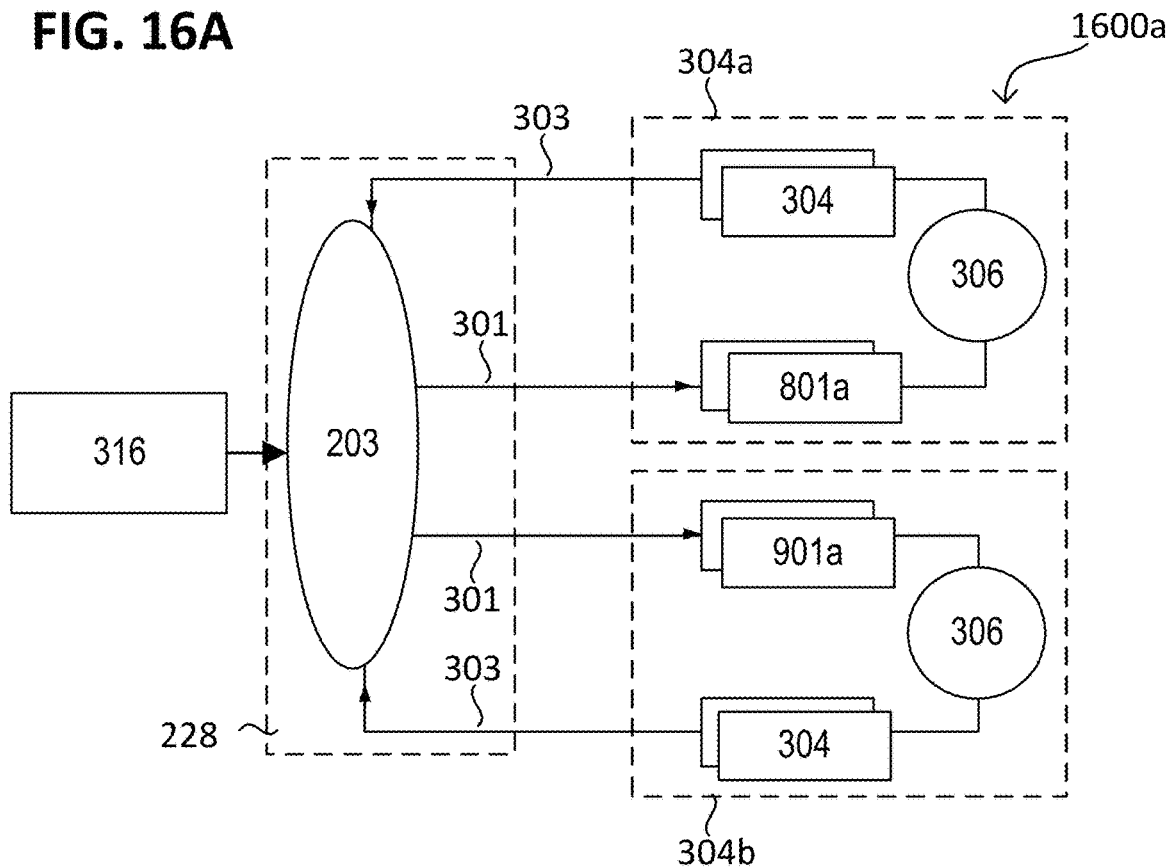
FIGS. 16A and 16B respectively illustrate the control of the process group according to different embodiments in different control diagrams.
Figure 16B:
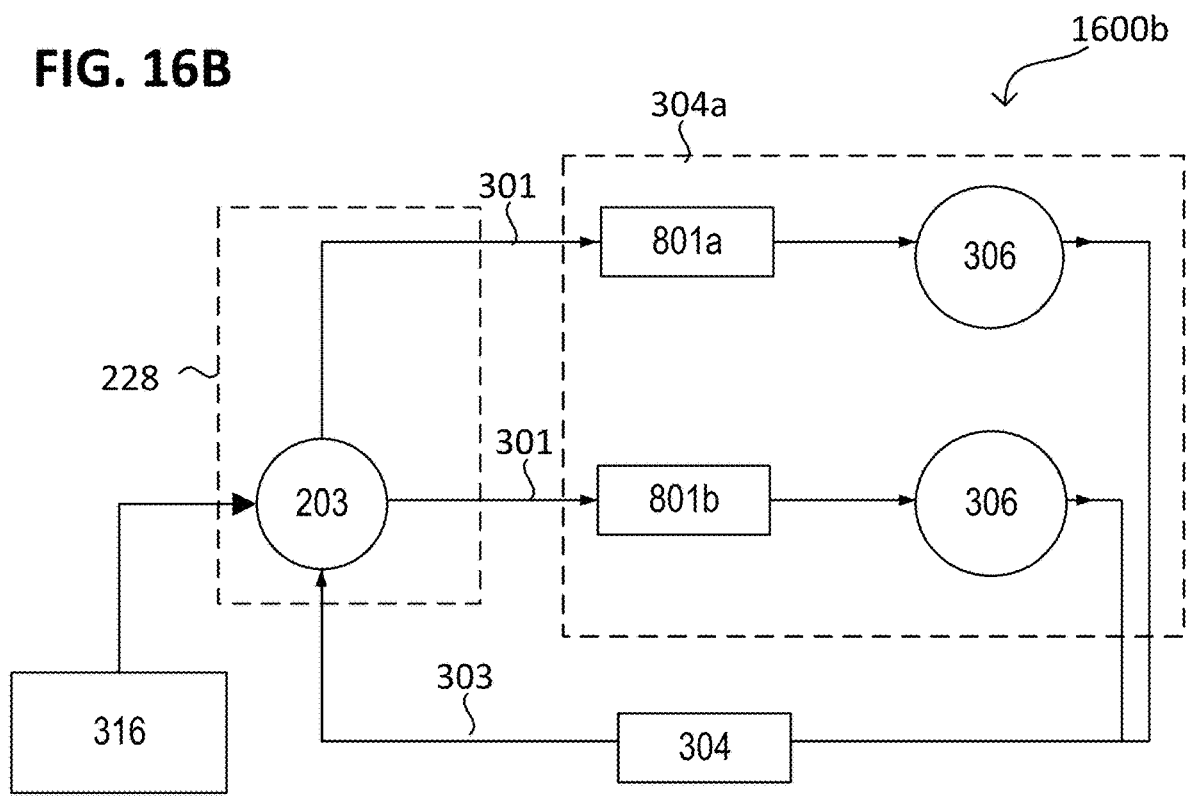

FIG. 16A and FIG. 16B respectively illustrate controlling a process group 1600a, 1600b according to different embodiments in different control diagrams. The variable 306 to be controlled or regulated (also referred to as a monitored process variable) of the coating process may be, for example, a pressure and/or a gas composition used by the respective coating process, for example, within the coating area 104a, 104b in which a coating process occurs.

According to various embodiments, a quantity may be understood as a physical quantity that represents (e.g., describes and/or correlates to) a quantitatively detectable property of a physical entity (e.g., an object, process, or state). Its state may optionally depend on time, t, and/or location, and as additional examples the composition and/or pressure of the process gas.

The monitored process variable 306 may have an actual state that is sensed by a sensing element 304. The sensing element 304 may supply (also referred to as feedback 303) the sensed actual state to the controller 203 as a first input variable 303. More generally, the feedback variable 303 may also be a vector, depending on the number of control variables sensed. Further, a target state 316 may be supplied to the controller 203 as a second input variable (also referred to as a preset variable 316), such as a target pressure. More generally, the preset variable 316 may also be a vector, depending on the number of presets.

The controller 203 may compare the feedback variable with the preset variable 316 and control an actuator 302 based on a result of the comparison 301. The actuator 801a, 801b may be, for example, the actuator of a valve of the gas supply 702 and/or the pump arrangement 814 that drives a standard volume flow including the reactive gas. The actuator 801a, 801b may be controlled so as to minimize the variation of the desired state from the actual state of the monitored process variable 306 (also referred to as a control deviation).

The actuated variable is the variable that is changed in order to influence the monitored process variable. The current value of the actuated variable is the control value (for example, the position of a valve).

In general, different actuated variables may be used to influence the same monitored process variable. For example, the pressure of a gas may be influenced as a monitored process variable by changing the standard volume flow of gas that is supplied and/or withdrawn, or by changing a temperature of the gas. The standard volume flow may in turn be changed by opening or closing a valve at least partially (i.e., partially or completely). Similarly, the gas may be compressed and/or expanded to change its pressure. With respect to a valve, the actuated variable may be, for example, the position of the actuator or a voltage and/or frequency supplied thereto. Another example of the actuated variable is the opening state of a valve. In the case of a pneumatic actuator, for example, the pneumatic pressure on the actuator is used as the actuated variable.

For example, the process group 1600a may perform multiple coating processes, each coating process of which is controlled by the controller 203, as illustrated in the control diagram. Similarly, the process group 1600a may include a control device 228 that implements the controller 203.

For example, for each of the plurality of coating processes 304a, 304b, an actual operating point (also referred to as a group actual operating point ($IA_G$)) may be recorded, from which the individual control values to be set are determined.

Figure 17:
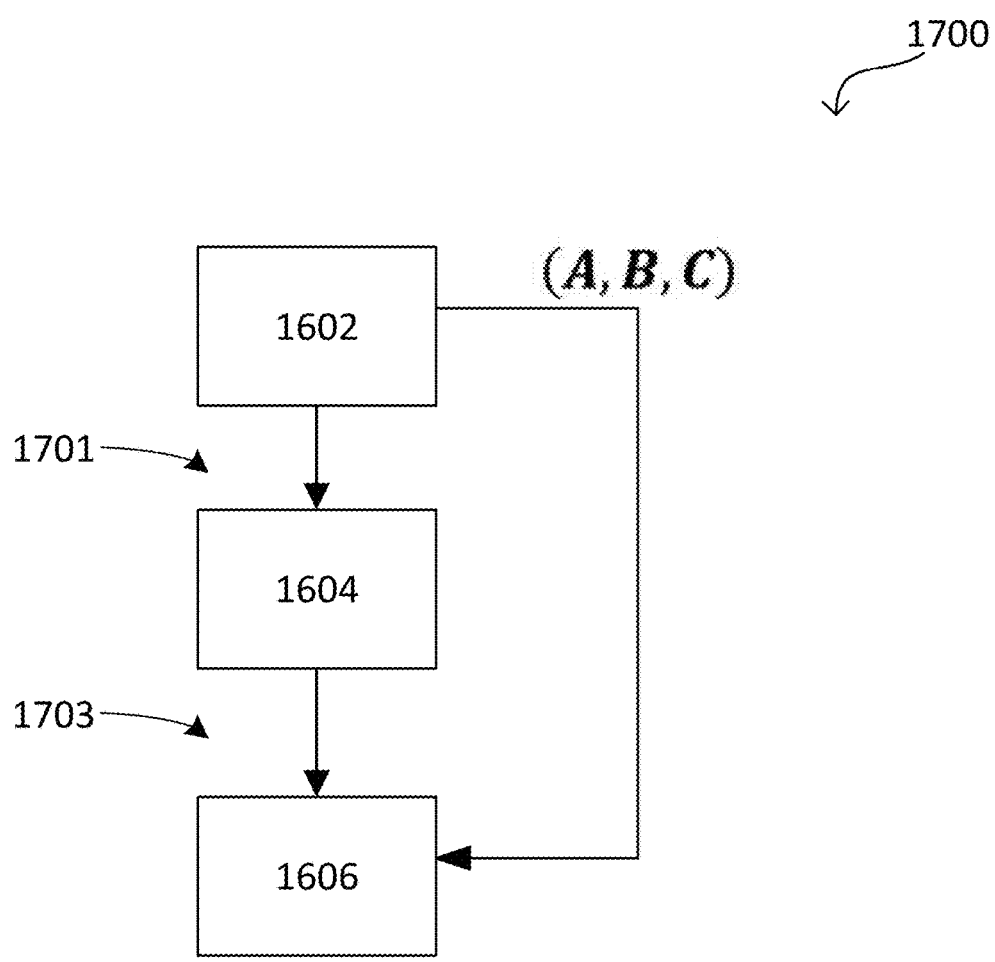
FIG. 17 shows a process according to different embodiments in a schematic flowchart.

FIG. 17 illustrates a process 1700 according to various embodiments in a schematic flowchart.

The method 1700 may include, in 1701, simulating at least one (i.e., one or more) coating process. Simulating coating process 1701 may be performed, for example, using a model 1602 of the one or more coating processes (also referred to as a simulation model). The simulation model 1602 may represent the at least one coating process, for example, the process group and/or the equipment (also referred to as process equipment or vacuum equipment) that performs the at least one coating process.

The method 1700 may include, for example, providing the simulation model 1602, e.g., determined based on a physical layout of the system. For example, the simulation model 1602 may account for one or more of the following:

physical information (i.e., the physical architecture, i.e., its structure) of the equipment or its components that carry out the at least one coating process, e.g., vacuum chambers (e.g., their volume), actuators, coating devices, sensors, kinematic chain of the equipment, and so on;

Information on the characteristic diagram (or one or more characteristic curves) of the system or its components, e.g. degrees of freedom, dependencies between current, voltage and/or pressure;

the logical architecture of the plant or its components, e.g. the interaction and/or logical coupling of the individual components (e.g. actuators) of the plant with each other;

the concrete or potentially available configuration of the plant (e.g. which components are active or inactive or may be switched in between);

Parameters of the controlled system, e.g. actuator controlling variables or monitored process variables, input variables of the individual actuators or output variables of the individual sensors;

the coordinate system of the system, e.g. in each case the partial coordinate systems of the individual actuators of the system embedded into each other, origin of the individual partial coordinate systems, end positions of the partial coordinate systems;

permissible operating parameters of the system or their limits, such as the operating temperature, inflow rate, pressure, suction capacity, etc.

The simulation model may be, for example, an object-based model or otherwise explicitly formulated model. The simulation model may, for example, have a formal representation of the at least one coating process, or the components by means of which the at least one coating process is performed, e.g., supplied. The simulation model may have a plurality of links between a coating process and the corresponding spatial information of the coating process, and optionally assign to the coating process corresponding variables that are supplied to and/or taken from, which condition, hinder, improve, or terminate the coating process. Furthermore, the simulation model may have a process logic, which logically links multiple coating processes with each other, and/or which implements a sequence (e.g. a flow chart) that is followed or executed for each coating process.

For example, the simulation model may be formed based on the explicit information about the at least one coating process. The explicit information may, for example, have what the coating process is controlled by and/or how it interacts. For example, the simulation model may have at least the same input variables and output variables as the process model, or likewise represent the controlled system.

In contrast to the process model, however, the simulation model is not necessarily based on a purely mathematical description but may be based on a hierarchical description, e.g. a hierarchical database model. The hierarchically ordered objects may then be used as model members. However, it is also possible to use a simulation model which has one or more of the above described model members (A, B, C), e.g. the system matrix A the input matrix B the output matrix C and/or the continuity matrix D. However, it is equally possible to use a simulation model that has one or more of the control elements described above as a model element, e.g. $K_y$, $K_P$, and/or $K_I$.

As another exemplary possibility, the simulation model or a simulated result trajectory of the simulation model may represent characteristic additional effects from practical problems, e.g. signal noise of the measurement technology or sinusoidal fluctuations in the process voltage due to a rotating target of the coating process. For example, the simulation model may have a mathematically nonlinear description (e.g., a hysteresis model), which is linearized around a point of interest (corresponding, for example, to a suitable operating point) to obtain a controlled system model (e.g., the (A, B, C) model).

Accordingly, the result of simulating 1701 (also referred to as the simulation result) may include simulation data 1604 of the at least one coating process. For example, the simulation data may include descriptively synthetically generated measurement data representing the behavior of the at least one coating process.

The simulation data may have the output variables and/or the input variables of the simulation model. For example, the simulation data may assign values of the input variables and output variables to each other, which are converted into each other by the simulation model.

The input variables of the simulation model may, for example, have actuator controlling variables and/or actuated variables. The output variables of the simulation model may, for example, have (e.g. measurable) physical variables of the at least one coating process, e.g. at least the monitored process variables of the at least one coating process described herein.

The method 1700 may include, in 1703, training a model generator 1606 based on the simulation result, e.g., based on the simulation data 1604. In other words, the training data may include at least the simulation data 1604. Training the model generator may be done, for example, using an artificial neural network (kNN).

The artificial neural network (kNN) may be trained using conventional training methods, for example the so-called backpropagation method. Alternatively or additionally, the training data may be optimized using mathematical optimization and/or machine learning methods. In training, the training vectors are selected according to the respective desired input parameters, such as the simulation data, the associated configuration of the simulation model, etc. It should be noted that both the parameters contained in the input data to the kNN and the parameters contained in the output vector of the kNN are strongly application-dependent or process-dependent and are selected accordingly.

The artificial neural network (kNN) is described below, among other places. What is described may apply by analogy, alternatively or in addition to the kNN, when another trainable algorithm is used as a model generator, e.g., a support vector machine or a long short term memory (LSTM). The kNN may have a large number of nodes (descriptively artificial neurons) and a connection network (the assignment of connections to nodes). Illustratively, a kNN replicates the processes of information acquisition and information processing in a manner analogous to biological neurons. This is realized by a number of layers of hidden neurons depending on the circumstances and the activation functions transmitting signals.

The topology of the model generator describes the structure of the connection network, i.e. how many nodes are distributed over how many layers, and how these are connected to each other. For example, multiple nodes may be configured in layers one behind the other, whose first layer forms the input of the model generator and whose last layer forms the output of the model generator. The last layer whose output is visible outside the interconnection network is called the output layer. Layers before the output layer are correspondingly called hidden layers. Using a graph, the artificial neurons may be represented as nodes and their connections as edges. The model generator in this case is exemplarily a directed graph with typed nodes.

After the model generator has been constructed, it is first trained (also referred to as the training phase or training), in which the model generator is adapted to the mode of operation to be trained (illustratively, "learns"). For this purpose, the model generator is fed data (the training data), based on which the model generator learns to emulate the desired mode of operation. A correct output of the model generator strengthens the learned signal path (i.e. a certain signal path through the interconnection network), whereas an incorrect output weakens the signal path. In this way, those paths through the connection network are gradually formed which best describe the desired mode of operation.

In the training phase, one or more of the following operations may be performed: Modifying the connection network (e.g., forming or deleting connections); changing the weights of nodes; modifying the properties (e.g., thresholds) of nodes; modifying the number of nodes; modifying activation, propagation, and/or output functions.

In the training of the model generator (e.g., the kNN), the training data is selected according to the respective desired input parameters. In one example, the incoming training data (also referred to as input data) has simulation data 1604 for which the simulation model, e.g., its architecture, is known. In that case, the model generator 1606 is trained to determine the simulation model by generating it based on a set of simulation data.

Optionally, as an alternative or in addition to the simulation data, the training data may have filtered simulation data. For this purpose, a filter may be used through which the simulation data is fed and which outputs the filtered simulation data. Examples of a filter include: a noise filter (configured to add noise to the data fed to it) or a frequency filter (configured to filter the data fed to it according to its frequency).

Adding noise may be done, for example, by mapping each data point p of the simulation data to a data point p' of the filtered simulation data, e.g. according to the relationship $p'=f(p, z_R)$, where $z_R$ denotes a random number, e.g. from the interval [0,1]. For example, the random number may be determined using a random number generator, e.g., for each data point individually. For example, $f(p, z_R)$ may be determined according to the relationship $f(p, z_R)=p+0.1\cdot p\cdot(z_R-0.5)$. This relationship graphically produces a 10% spread of data points.

More generally, the filter may be configured to increase a variance (e.g. standard deviation) of the simulation data, e.g. to make it illustratively noisy. This means that the simulation data becomes more similar to real measured data and therefore improves the robustness of the trained model generator.

Figure 18:
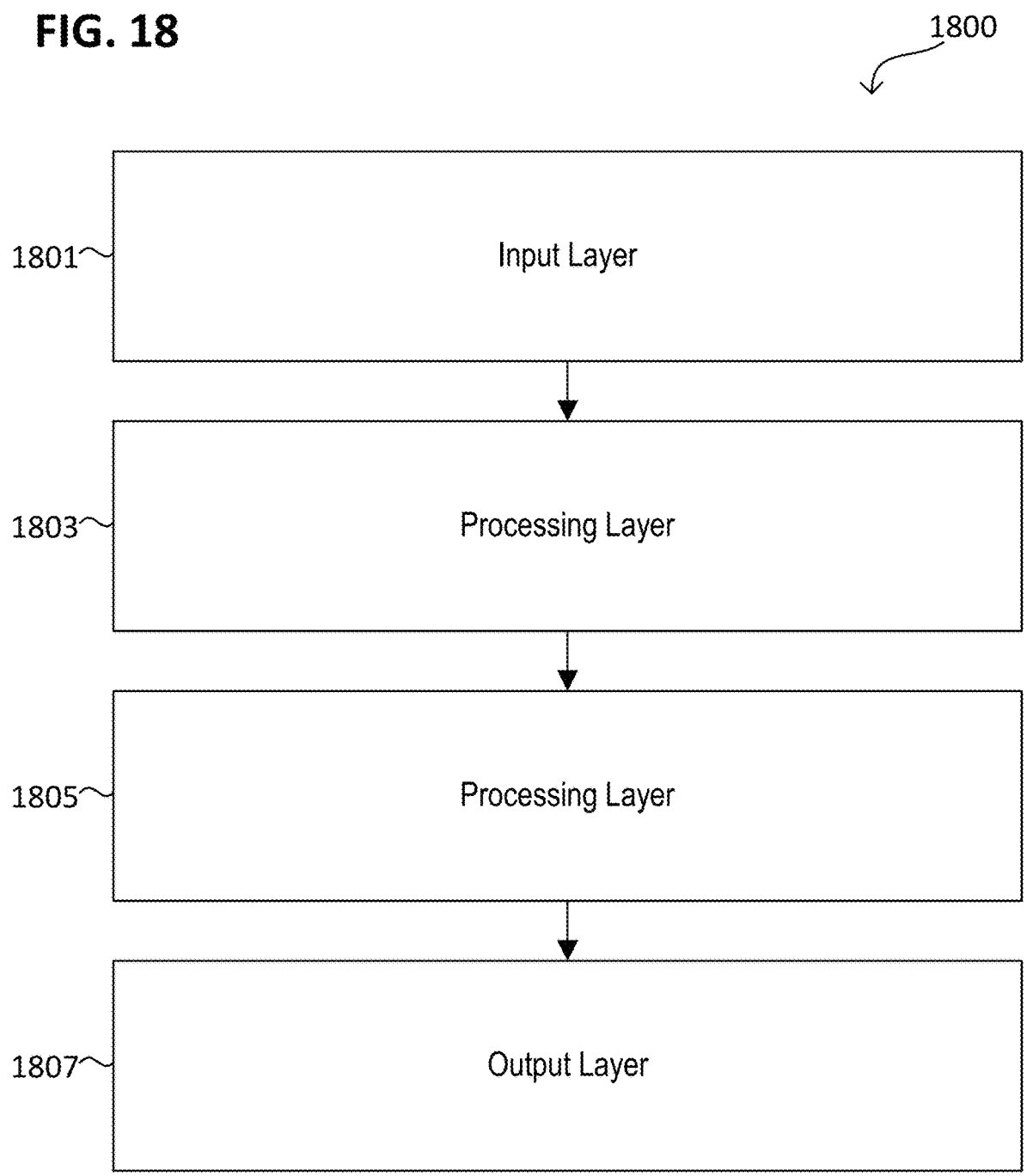
FIG. 18 shows a model generator according to various embodiments in a schematic diagram.

FIG. 18 illustrates the model generator 1606 according to various embodiments in a schematic setup diagram 1800, for example formed according to the method 1700 and/or implemented by means of the control device. The model generator 1606 may be configured using an artificial neural network (kNN). The kNN may be configured, for example, as a convolutional neural network or feedback neural network. Of course, a differently configured model generator 1606 may also be used, which provides the appropriate functions.

The model generator 1606 to be trained, e.g., its kNN, may have a plurality of layers ("layer"), e.g., at least one input layer 1801 ("input layer"), at least one output layer 1807 ("regression layer," also referred to as a termination layer), and between them one or more processing layers 1803, 1805. The input layer 1801 may include, for example, dimensions of a time sequence of simulation data or measurement data. For example, a time sequence may have a dimension for the time indices and a dimension for the property(ies) of a point (or signal sample). Exemplary implementations exhibit that the property(ies) of a point include a timestamp, flows that are set for the time, and/or measurement values collected at the time. Exemplary implementations include that property(ies) of a point may include a time/time stamp (or at the time difference to the last recorded point), the currently set inputs of the actuators, and/or the currently measured values.

When a convolutional neural network is used as a model generator 1606, the one or more processing layers may include at least one convolutional layer 1803 and/or at least one intermediate layer 1805 (also called a "fully connected layer"). Optionally, a pooling layer may be connected between the at least one convolutional layer 1803 and the at least one intermediate layer 1805 (also called the fully connected layer) (not shown).

The activity of each node of a convolution layer 1803 may be calculated using a discrete convolution. The discrete convolution of each node may be converted from an activation function to an output of the node. For example, a rectifier function (also noted as a ReLU function, for short) may be used as the activation function. In the context of artificial neural networks or training methods, a ReLU function is an activation function that is essentially defined as the positive part of its argument.

Several parameters may control the amount of output (also referred to as output volume) of each convolution layer 1803, such as the filter count ("depth"), step size ("stride"), and padding ("padding," "zero padding," or "null padding") parameters.

If a feedback neural network is used as a model generator 1606, the nodes of multiple processing layers may be coupled to each other, e.g. in the direction of the same or a previous processing layer. Direct feedback uses a neuron's own output as another input. Indirect feedback connects the output of a neuron to a neuron one or more previous processing layers. Lateral feedback connects the output of a neuron to another neuron of the same processing layer. Examples of a feedback neural network may include: an Elman network, a Jordan network, a Hopfield network, and a fully interconnected neural network. The feedback neural network may be trained using, for example, error backpropagation or another supervised learning procedure. This provides feedback to the neural network based on the target data that is known to the incoming training data.

Accordingly, the training data, e.g., the target data of the training data, may have one or more indications about the simulation model, e.g., its model members and/or its configuration. For example, the training data, e.g., the target data of the training data, may have the model members of the simulation model, e.g., their configuration.

The backpropagation may include: supplying the input data to the model generator 1606; comparing the associated output data of the model generator 1606 with the target data, for example, to determine the deviation of the output data from the target data; or supplying the model generator 1606 with an indication of the result of the comparison, for example, the deviation of the output data from the target data. In doing so, the weights of the neuron connections are changed depending on their influence on the deviation, e.g., such that feeding the input data again causes the output data to approximate the desired target data.

The simulation data as incoming training data may be multi-dimensional, for example, represented by means of a corresponding tensor. The tensor may, for example, reference a first actuator controlling variable per coating process in a first dimension, reference a second actuator controlling variable per coating process in a second dimension, reference a first monitored process variable per coating process in a third dimension, reference a second monitored process variable per coating process in a fourth dimension, and so on.

According to the dimension of the incoming training data, the nodes of each processing layer 1803, 1805 may also be arranged multi-dimensionally.

An exemplary implementation of the network structure of the kNN includes preprocessing that may be performed by means of one or more convolutional layers, where the convolutional representations of the input time sequence are fed to one or more stacked layers, which are, for example, configured to process arbitrary time sequences, such as LSTM layers or temporal convolutional network (TCN) layers. Following the time sequence processing layers, one or more dense layers may be added, resulting in one or more so-called regression layers, which are configured for the estimation of corresponding model parameters. The last dense layers at the end of the kNN may optionally be provided with no activation function and serve as so-called regression layers.

For example, the last dense layer may be or become branched into multiple dense layers for this purpose, in order to be able to provide different outputs of the kNN. Exemplary implementations show that the output of the kNN contains a working point ($\overline{u}$, $\underline{y}$) and associated model matrices (A, B, C) or their equivalents for a sampling system. The model generator may optionally have multiple kNNs that determine only a portion of the model (e.g., only one operating point or a portion of the model matrices or one kNN per model matrix).

Alternatively or additionally, the processing of time series may be done by means of a commercially available kNN or an open-source kNN, e.g. by means of a so-called Transformer Network (TCN) from Google. A TCN layer may already have integrated procedures that prevent overfitting.

Figure 22:
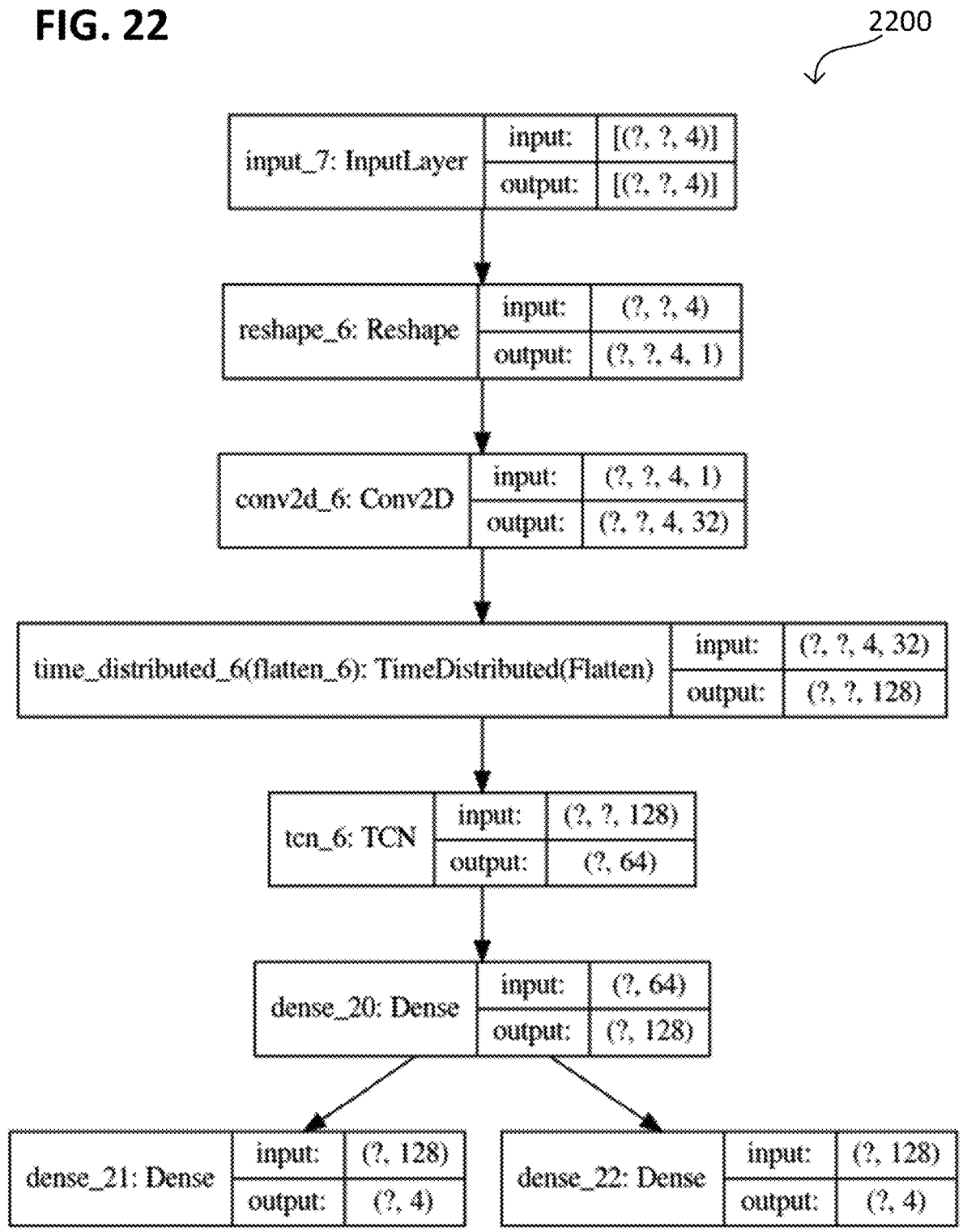
FIGS. 22 and 23 each show a model generator according to different embodiments in a schematic network diagram.
Figure 23:
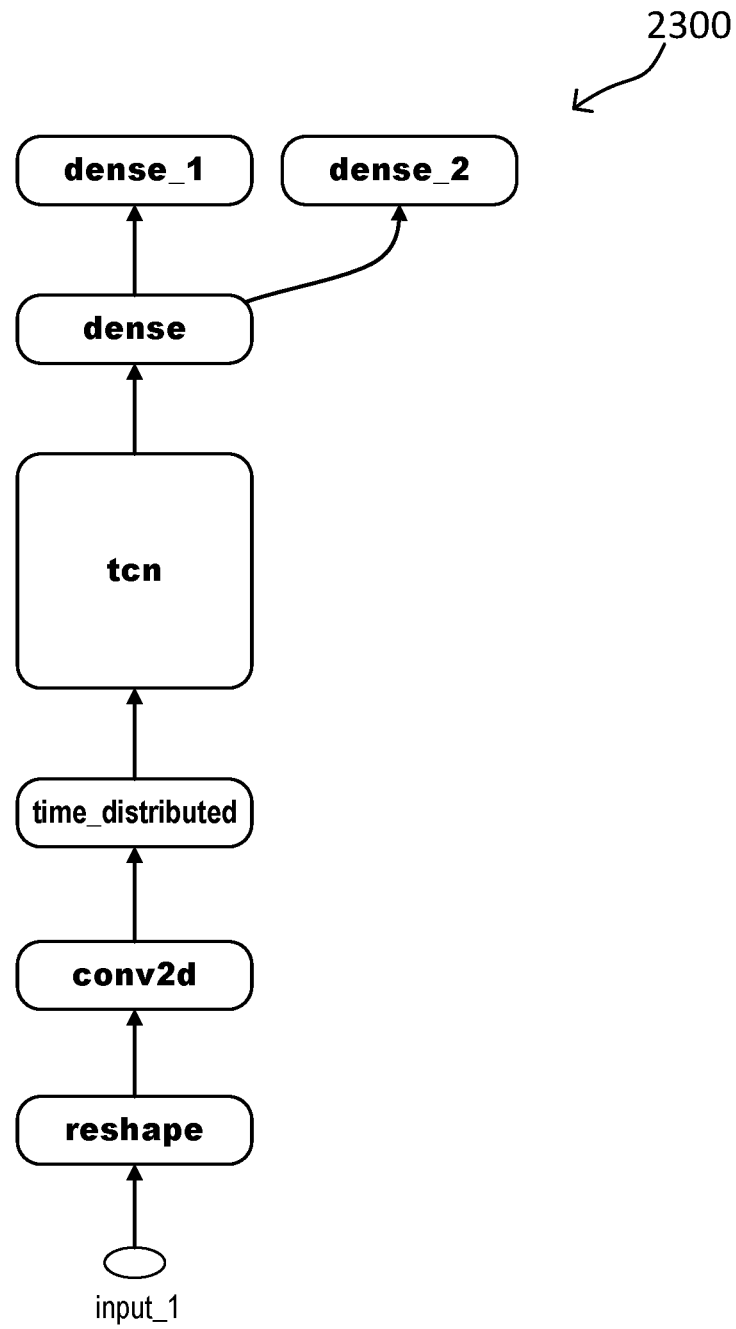

Exemplary implementations of the model generator according to different embodiments 2200, 2300 by means of a kNN are shown in FIG. 22 and FIG. 23, respectively. The respective first question mark stands for the index of the data set, the respective second question mark stands for the length of the time sequence. For example, the kNN is configured to process time sequences of any length, e.g. 100 points or even 200 points per time sequence.

FIG. 19 illustrates a method 1900 according to various embodiments in a schematic flowchart. As described above, simulating and training may be performed, with the difference being that simulation may be repeated, e.g. $W_D$ times (where $W_D$ is a natural number). The particular run of the repeating simulation is indexed by w, i.e. index w=1 indicates a first run of the simulation, index w=2 indicates a second run of the simulation, etc.

The successive runs (w=1 to w=$W_D$) differ from each other in the configuration of the simulation model 1602. In other words, a reconfiguration 1901 of the simulation model 1602 may occur after each pass of the simulation 1701, e.g., by changing one or more model members of the simulation model 1602. The configuration of the simulation model 1602 in the first pass is then a first configuration (A, B, C)$_1$, the configuration of the simulation model 1602 in the second pass is then a second configuration (A, B, C)$_2$, etc.

The simulation data 1604 per run thus obtained may be added 1903 to a data set $SD_w$. The result of all (w=1 to w=$W_D$) runs may have a data set $SD_w$ indicating the configuration (A, B, C)w of the simulation model 1602 in the wth run and the simulation data 1604 of the wth run. The configuration (A, B, C)w of the simulation model 1602 in the wth run may, for example, indicate the set of model members of the simulation model 1602 in the wth run, e.g., their configuration. Of course, some other indication of what configuration the simulation model 1602 is in in the wth pass may also be used.

Each data set $SD_w$ may then be added 1905 to the training data 1902. The training data 1902 then has a number of $W_D$ records $SD_w$, each record $SD_w$ of which may be used to train the model generator 1606.

Basically, the model generator 1606 may improve as the number of runs $W_D$ increases. For example, the number $W_D$ may be 2 or greater, for example 5 or greater, for example 10 or greater, for example 20 or greater, for example 50 or greater, for example 100 or greater, for example 200 or greater.

Figure 20:
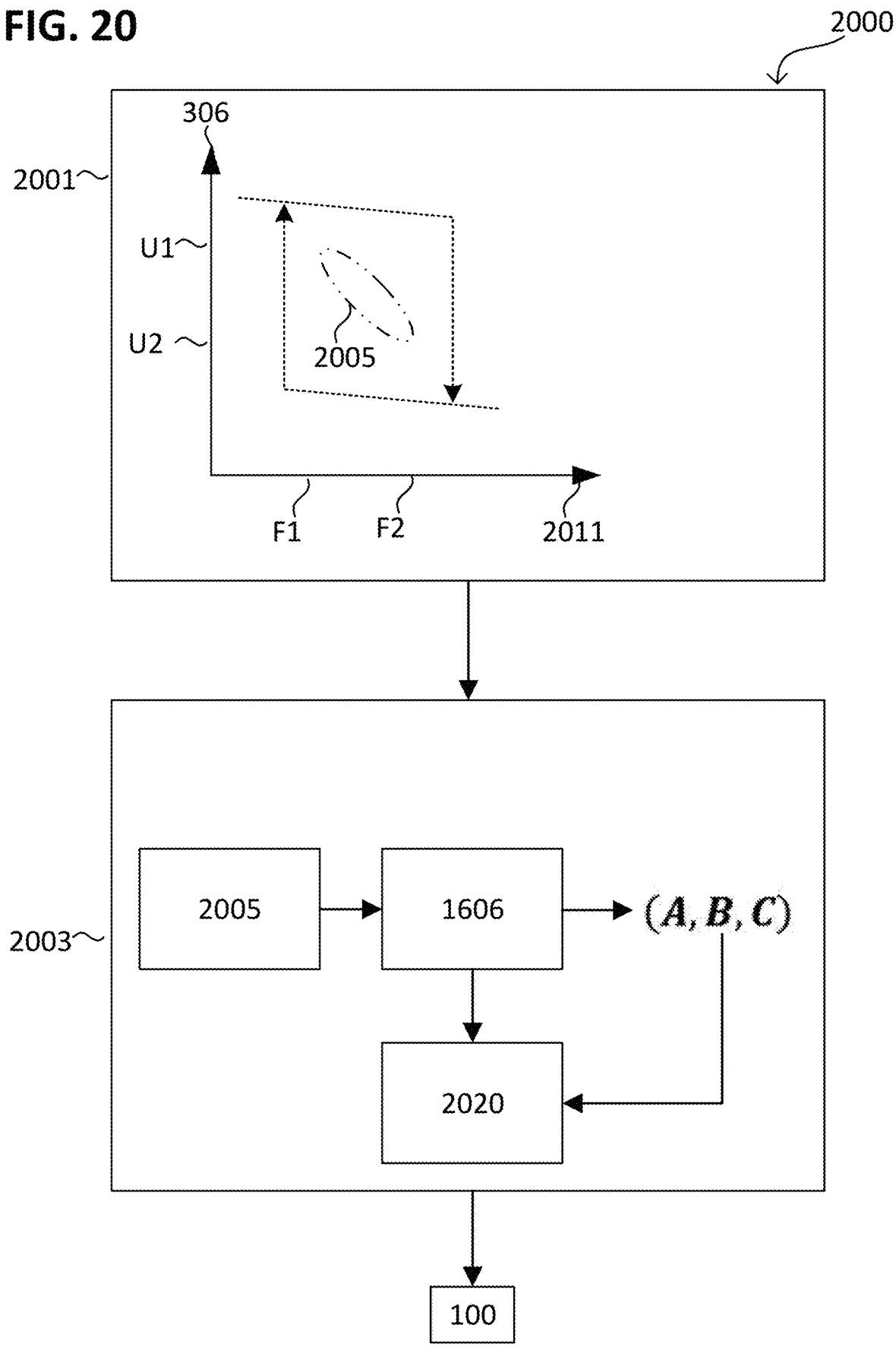

FIG. 20 illustrates a method 2000 according to various embodiments in a schematic flowchart. Once training is complete, i.e. once the model generator 1606 has been trained, the controller may be provided based on the model generator 1606.

The fully trained model generator 1606 is then configured to convert measurement data into the target data that was used during training, i.e. to determine the target data that was trained to the model generator 1602. The following example is where the model generator 1606 has been trained with the model elements (A, B, C) described above as target data. In this case, the trained model generator 1606 is configured to determine the process model or at least components of the process model, namely in this case the model elements. It should be understood that what has been explained with respect to the model elements (A, B, C) as target data may apply by analogy to other target data, for example when the controller or its components, e.g. the control elements, are used as target data.

The method 2000 may include, in 2001, determining a response (e.g., a first monitored process variable and/or a second monitored process variable) per coating process to vary the coating process from a reference state. The variation may be performed by controlling (e.g., accurately) the first actuator that supplies the coating process, and/or by controlling (e.g., accurately) the second actuator that supplies the coating process.

In principle, the response may be determined as described above, e.g. by means of a step response. The step response may, for example, provide a good result for a stable coating process. The step response of the coating process represents illustratively two indications of the stable coating process, namely the half-life of the response and the convergence value of the response.

In the case of an unstable coating process, however, the step response may be less meaningful. This is illustratively due to the fact that the response of the coating process is not only or only slightly dependent on the reference state or the variation, or due to the instability that is already required of the finished controller, in order to reliably set the reference state or to vary from it. This applies, for example, to a reactive sputtering process with hysteresis, as exemplified in diagram showing 2011, 306. In the diagram, a monitored process variable 306 (e.g. voltage) is plotted above the actuated variable 2011 (e.g. a gas inflow). In the following, reference will be made to the exemplary hysteresis as representative of the unstable behavior, it being understood that what has been explained may also apply to other types of unstable coating processes.

If the existing controller is insufficient during calibration (e.g. during the very first operation of the system) or simply not available, it may be replaced by a discontinuously operating controller (also called a multi-point controller), e.g. a two-point controller. The multi-point controller may switch between multiple setpoint states of the actuated variable (discrete values) as soon as a criterion is fulfilled. For example, the criterion may be fulfilled when the actual state of the monitored process variable meets a predefined criterion, e.g. when the actual state of the process control leaves a predefined interval [F1, F2], i.e. exceeds the threshold F1 or falls below the threshold F2. Instead of the interval, of course, only a threshold value may be used, for example, if the rate of change is so large that the amplitude of the actual state of the monitored process variable is sufficiently within the response time of the controller.

Stated more generally, the multipoint controller is implemented so that the desired state of the actuated variable is a discontinuous function of the position of the actual state of the actuated variable relative to one or more thresholds, e.g., taking into account which threshold the actual state of the actuated variable reaches, or more particularly, passes (e.g., exceeds/falls below).

This should be understood as a step response, but the return to the reference state is not triggered by the rate of change falling below a predefined threshold. Rather, it is independent of the rate of change and dependent on the position of the actual state of the monitored process variable relative to one or more thresholds.

For example, the two-point controller may be configured in such a way that the setpoint state of the actuated variable is increased, for example to a first setpoint reference state U1, if the actual state of the monitored process variable is smaller than the predefined interval [F1, F2], and that the setpoint state of the actuated variable is decreased, for example to a second setpoint reference state U2, if the actual state of the monitored process variable is larger than the predefined interval [F1, F2].

This means that the setpoint state of the actuated variable is repeatedly switched between the first setpoint reference state U1 and the second setpoint reference state U2.

In response, the actual state of the monitored process variable may oscillate between the limits F1 and F2 of the interval [F1, F2]. The respective pairs of the actual state of the monitored process variable and the actual state of the actuated variable may lie on a trajectory 2005.

If the target operating point for the later operation of the coating process is within the hysteresis, the first target reference state U1 and the second target reference state U2 may be located, for example, in the area enclosed by the hysteresis. This means that the respective trajectory 2005 is located in the unstable area (also referred to as the transition area) of the coating process, in which the coating process is to be kept in the later operation.

According to various embodiments, the above-described repeated deflection of the coating process, e.g. from the reference state at F1 to the varied state at F2, may be performed by controlling only one actuator. If multiple actuators are to be controlled in parallel, each actuator may be controlled individually by means of a discontinuously operating controller, which has the actual state of one of the monitored process variables as input variable. For example, a first actuator may be controlled based on the actual state of a first monitored process variable and a second actuator based on the actual state of a second monitored process variable. A chaotic trajectory 2005 may be traversed in a multi-dimensional subspace of the state space.

Alternatively, the state space may be traversed section by section (illustratively "slice by slice") by performing multiple passes in succession, with only the first actuator being controlled in each of the passes while the second actuator remains unchanged and the second actuator is changed step-wise between the passes.

The result of determining the response may include one or more series 2005 of determined actual states of the coating process (as data points), each actual state of the coating process including, for example, a pair of an actual state of the actuated variable and an actual state of the monitored process variable.

In principle, in this way, the state space of each coating process may be run successively. If multiple coating processes are run in parallel to one other, this means that each series 2005 of actual states of the coating process may not only be a function of the interaction chain of the coating process itself (see $A_{local}$) but may also be a function of the interaction between the coating processes (see $A_{exchange}$).

The method 2000 may include, in 2003, determining a control model 2020 using the model generator 1606 based on measurement data (i.e., captured data) of the one or more coating processes. For example, the measurement data may have one or more series 2005 of captured actual states of the coating process and may be fed to the model generator 1606. Each captured actual state of the coating process may have, for example, a respective pair of captured actual states of the actuated variable (actual value of the actuated variable) and captured actual state of the monitored process variable (actual value of the monitored process variable).

For example, the model generator 1606 may be configured to output the process model (e.g., the (N=1) model, (N=2) model, (N=3) model, or more generally, the N-model) or at least the model elements thereof (A, B, C) based on the measurement data. In that case, the control model 2020 or at least its control elements $K_y$, $K_P$, and/or $K_I$ may be determined based on the model elements (A, B, C), e.g. as described above, e.g. according to the relationships:

$$K_y = B^{-1}AC^{-1}$$

$$K_P = K_1 C^{-1} - K_y$$

$$K_I = K_2$$

It should be understood that what has been explained with respect to the model elements (A, B, C) as target data may apply by analogy to other target data, for example, if the control elements $K_y$, $K_P$, and/or $K_I$ or other control elements are used as target data. For example, if the model generator 1606 is configured to generate the control model or at least its control elements $K_y$, $K_P$, and/or $K_I$, the intermediate step via the process model may not necessarily be required.

In the following, an exemplary implementation is explained, which includes simulation. To train a suitable machine learning algorithm, known pairs of measurement series and controlled system models may be used (e.g. supervised learning). The measurement series are obtained synthetically by means of numerical simulations. For this purpose, e.g. suitable simulation models (e.g. linear models or known models for sputter processes with hysteresis) may be generated by means of random data, and suitable measurement series (e.g. based on two-point controllers) may be calculated. As a result of the simulation, the synthetically generated measurement series may be noisy with further random data or effects known from practice, thereby better imitating real measurement series and improving the robustness of the machine learning algorithm against measurement noise, target rotations, or the like.

In the case of multiple coupled sputter processes (multi-variable system), in total, one two-point controller per process may be operated simultaneously in order to obtain suitable measurement series. To better capture crosstalk effects, the setpoints of the two-point controllers may be systematically varied per process. The simulation models may be extended accordingly in order to be able to train a suitable machine learning algorithm.

In the case of additional input variables (e.g. process gas for total pressure control) per coating process, these may be varied during operation of the two-point controller in order to capture their influence as well. Here, too, the simulation models and the machine learning algorithm may be adapted accordingly.

Figure 21:
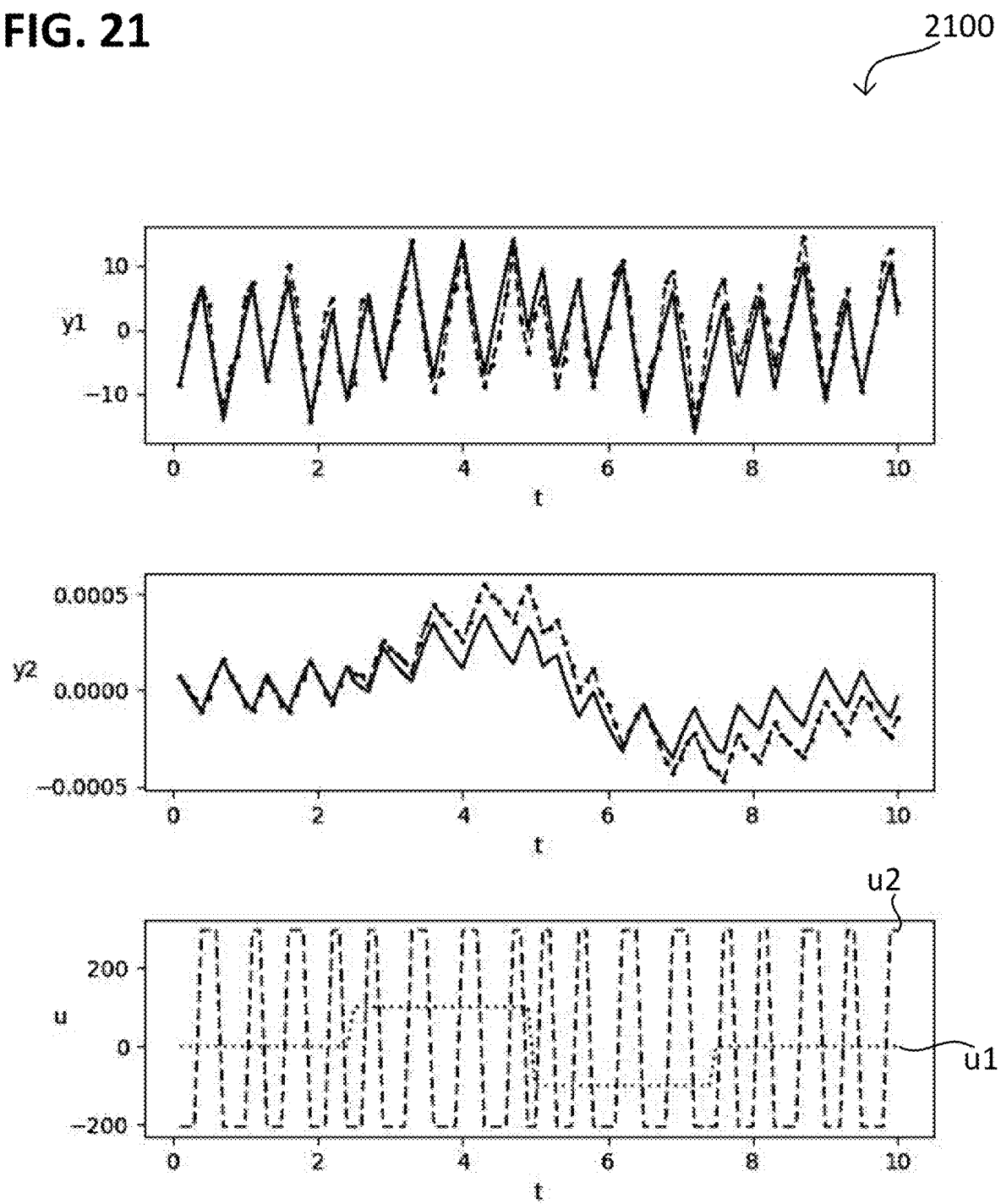
FIG. 21 shows multiple quantities of a coating process controlled by means of the disclosed method according to different embodiments in different schematic diagrams.

FIG. 21 illustrates multiple variables of a coating process controlled by means of the method 100 according to various embodiments 2100 in different schematic diagrams, in which the respective variable is shown over time t. Each diagram shows a respective variable. The output variables of the coating process (e.g., measured variables) are represented by y1 and y2. The input variables of the coating process (e.g. its actuator controlling variable) are represented by u1 and u2. The output variables of the coating process are represented once as the measurement series (dotted line) controlled by means of a two-point controller (also called two-point-controlled) as well as the after-simulated trajectory of an estimated model (solid line).

For example, y1 may represent a process voltage and y2 a pressure. Shown are the variations in the output variables (i.e. their values) as compared to their respective mean value (here, set to zero), which are the total recorded measurement series. The first output variable y1 of the coating process is two-point controlled by means of the first input variable u2 of the coating process, as explained above for the two-point controller. The second input variable u1 of the coating process was varied three times systematically in a step-wise manner.

By means of the method 100, for example, an automated controller setting may be implemented.

In an exemplary implementation, the method 1300 described herein may include: controlling one or more sputtering processes by means of a two-point controller; time-resolved acquisition of measurement data/series of measurements after the initial settling of the two-point controller(s), optionally systematically varying setpoints or additional inputs of the one or more sputtering processes; processing the series of measurements by means of a machine learning algorithm that outputs a process model (also referred to as a controlled system model) in state space representation; determining the controller parameters (also referred to as control elements) based on the process model.

Various implementations of the 2020 control model (e.g., including a model of one or more coating processes) have been explained herein. It should be understood that the control model 2020 need not necessarily include the process model. For example, the control model 2020 may include or be formed from the specific controller parameters as an alternative or in addition to the process model. For example, the model generator may be trained to determine (e.g., estimate) the controller parameters as a model of the one or more coating processes.

Various implementations of methods have been explained herein. It should be understood that the methods may also be configured to control each coating process by means of only one actuator per coating process, for example, or to control a group of coating processes by means of one actuator per coating process.

In the following, various examples are described that relate to what has been described above and what is shown in the figures.

Example 1 is a method for controlling a (e.g. reactive) coating process by means of which a substrate is coated, the method including: driving a first actuator that supplies the coating process, based on a group of multiple monitored process variables of the (e.g. reactive) coating process detected in parallel with each other, each monitored process variable being considered when driving the first actuator, and optionally based on a control model; driving a second actuator that supplies the coating process, based on a group of multiple monitored process variables of a (e.g., reactive) coating process, each monitored process variable being considered when driving the second actuator, and optionally based on a control model.

Example 2 is a method for controlling a (e.g. reactive) coating process by means of which a substrate is coated, the method including: driving a first actuator that supplies the coating process, based on a group of a plurality of monitored process variables of the (e.g. reactive) coating process detected in parallel with one another and optionally based on a control model; driving a second actuator that supplies the coating process, based on a group of a plurality of detected monitored process variables of the (e.g. reactive) coating process and optionally based on the control model; wherein optionally the monitored process variables of the group of the plurality of monitored process variables detected in parallel interact with one another.

Example 3 is the method according to example 1 or 2, wherein the first actuator is configured to provide the coating process (e.g. supply with and/or extract from) a first material (e.g. that is supplied and/or extracted), wherein the second actuator is configured to provide the coating process (e.g. supply with and/or extract from) a second material (e.g. gas or atomized material) different from the first material.

Example 4 is the method according to any one of examples 1 to 3, wherein the first actuator and/or the second actuator are configured to provide (e.g. supply with and/or extract from) the coating process a material (e.g. reactive gas flow or atomization rate) that is consumed by the coating process (e.g. incorporated in a layer), e.g. by means of a reaction of the coating process.

Example 5 is the method according to any one of examples 1 to 4, wherein the monitored process variables of the group of multiple monitored process variables detected in parallel differ from each other, for example in a material (e.g. gas or atomized material) which they represent.

Example 6 is the method according to any one of examples 1 to 5, wherein, of the group of a plurality of monitored process variables sensed in parallel with each other: a first monitored process variable represents a first gas pressure (e.g., first gas partial pressure) of the coating process; and/or a second monitored process variable represents a second gas pressure (e.g., second gas partial pressure) of the coating process or an electrical variable of the coating process.

Example 7 is the method according to any one of examples 1 to 6, wherein the monitored process variables of the group of multiple monitored process variables acquired in parallel interact with each other.

Example 8 is the process according to any one of examples 1 to 7, wherein the coating process is carried out in a vacuum.

Example 9 is the method according to any one of examples 1 to 8, wherein driving a first actuator and driving the second actuator are linked together (e.g., implemented by means of the control model), e.g., as a function of the set of a plurality of measured monitored process variables of the (e.g., reactive) coating process (i.e., that their linkage together is a function of the set of a plurality of measured monitored process variables of the (e.g., reactive) coating process).

Example 10 is the method according to any one of examples 1 to 9, wherein driving the first actuator implements an influence on each monitored process variable of the group of a plurality of monitored process variables detected in parallel with each other (e.g., fed back by means of the control model); and/or wherein driving the second actuator implements and influence on each monitored process variable of the group of a plurality of monitored process variables detected in parallel with each other (e.g., fed back by means of the control model).

Example 11 is the method according to any one of examples 1 to 10, wherein controlling the first actuator and the second actuator is performed using one or more control elements (e.g. implemented by means of the control model), each control element implementing one or more of: influencing each monitored process variable of the group of a plurality of monitored process variables measured in parallel with each other on an actuator controlling variable of the first actuator; and/or (optionally) influencing each monitored process variable of the group of a plurality of monitored process variables sensed in parallel with each other based on an actuator controlling variable of the second actuator (for example, the influence may disappear even if it is taken into account); and/or linking the actuator controlling variable of the first actuator and the actuator controlling variable of the second actuator.

Example 12 is the method according to any one of examples 1 to 11, wherein driving the first actuator and the second actuator is performed using one or more control elements (e.g. $K_I$, $K_P$, $K_Y$) that takes into account an interaction (e.g. $A_{exchange}$) of the coating process with an additional coating process that coats the substrate (e.g. adjacent to the coating process) and/or is upstream or downstream to the coating process.

Example 13 is the method according to any one of examples 1 to 12, wherein driving the first actuator and the second actuator is performed in parallel.

Example 14 is a method according to any one of examples 1 to 13, further including: determining one or more control elements (e.g. implemented by means of the control model), each control element performing one or more of: influencing each monitored process variable of the group of a plurality of monitored process variables sensed in parallel with each other based on an actuator controlling variable of the first actuator; and/or (optionally) influencing each monitored process variable of the group of a plurality of monitored process variables sensed in parallel with each other based on a actuator controlling variable of the second actuator (for example, the influence may disappear even if taken into account); and/or linking the actuator controlling variable of the first actuator and the actuator controlling variable of the second actuator.

Example 15 is a method of controlling a plurality of coating processes, each coating process being configured to deposit a layer on a substrate, the method including: controlling each coating process of the plurality of coating processes by means of the method according to any one of examples 1 to 14, the plurality of coating processes optionally including three or more coating processes, wherein optionally the controlling of each coating process of the plurality of coating processes is interconnected (e.g., implemented by means of the control member).

Example 16 is a method of calibrating a (e.g. reactive) coating process by means of which a substrate is coated, the method including determining a first response of a first monitored process variable and a second monitored process variable of the coating process as compared to a variation of the coating process from a reference state, when (e.g. exactly) a first actuator that supplies the coating process is actuated (in other words, the variation is effected by actuating a first actuator that supplies the coating process); determining a second response of the first monitored process variable and the second monitored process variable of the coating process as compared to a variation of the coating process from the reference state when (exactly) a second actuator that supplies the coating process is actuated; wherein the determining the first response and determining the second response optionally take place one after the other; wherein optionally the plurality of monitored process variables interact with each other; the method optionally further including: determining a control model (e.g. according to the method of any one of examples 1 to 15) based on said response of said first monitored process variable and/or said response of said second monitored process variable, e.g. said control model being configured to determine an input (e.g. the actuator controlling variable) for driving the method according to any one of examples 1 to 15; the method optionally further including: storing a result of said determining the first response and/or said determining the second response.

Example 17 is the method according to example 16, further including: determining one or more control elements (e.g. implemented by the control model), each control element implementing one or more of: an influence on each monitored process variable of the plurality of monitored process variables over an actuator controlling variable of the first actuator; and/or (optionally) an influence on each monitored process variable of the plurality of monitored process variables on an actuator controlling variable of the second actuator (e.g., the influence may disappear even if taken into account); and/or linking the actuator controlling variable of the first actuator and the actuator controlling variable of the second actuator.

Example 18 is a method of providing a model generator, the method including: simulating one or more coating processes (e.g., based on a model of the one or more coating processes); training a model generator based on a result of the simulating (e.g., using the model generator as input data for training); and/or wherein, for example, the model generator is trained to map the result of the simulating to information of the one or more coating processes or of the model as input data for training), wherein, for example, the model generator is trained to map the result of the simulating to indications of the one or more coating processes or of the model; and/or wherein, for example, the model generator is trained to determine a model (e.g. for controlling) of the one or more coating processes.

Example 19 is the method of Example 18, wherein training the model generator is further based on information about the model of the one or more coating processes (which is used, for example, as target data for the training).

Example 20 is the method of example 18 or 19, wherein the model includes one or more model elements, wherein training the model generator is further based on the one or more model elements (e.g., used as target data for the training).

Example 21 is the method according to any one of examples 18 to 20, wherein the result of simulating includes simulated indications of driving the one or more coating processes and/or simulated indications of a response of driving the one or more coating processes.

Example 22 is the method according to any of Examples 18 to 21, wherein the result of the simulating indicates a configuration of the model of the one or more coating processes.

Example 23 is the method according to any of examples 18 to 22, wherein simulating includes: reconfiguring the model (e.g., one or more model elements thereof) from a first configuration to a second configuration; wherein training the model generator is based on the result of simulating at the first configuration and at the second configuration.

Example 24 is the method according to any one of examples 18 to 23, wherein simulating includes: reconfiguring the model into a plurality of different configurations one or more times; wherein training the model generator is based on the result of simulating at each configuration of the plurality of configurations.

Example 25 is the method according to any one of examples 18 to 24, wherein the reconfiguring includes: adding or removing a coating process that the model represents; changing an interaction between at least two coating processes that the model represents; changing a material that the coating process is supplied with; and/or changing an operating point of the one or more coating processes.

Example 26 is the method according to any of examples 18 to 25, further including: filtering (e.g., using a noise filter) the result of simulating; wherein training the model generator is based on the result of filtering; wherein, for example, the filter increases a variance (e.g., standard deviation) of the result of simulating and/or implements a random number generator.

Example 27 is the method according to any of examples 18 to 26, wherein simulating includes simulating a response of the one or more coating processes to an actuation of the one or more coating processes, for example when actuating one or more simulated actuators of the one or more coating processes.

Example 28 is the method according to any one of examples 18 to 27, wherein the model generator is configured to determine a process model of one or more coating processes, or at least components of the process model, based on a response of the one or more coating processes to actuation (e.g., considering one or more actuated variables and/or one or more monitored process variables) of the one or more coating processes, for example when one or more simulated actuators of the one or more coating processes is actuated.

Example 29 is the method according to any one of examples 18 to 28, further including: determining a process model and/or a control model (e.g., according to the method of any one of examples 1 to 15) of the one or more coating processes by means of the model generator based on acquired data (also referred to as measurement data) of the one or more coating processes; wherein optionally the measurement data represents a (e.g., repetitive) variation from a reference state; wherein optionally, for example, the control model is configured to determine indications for driving the method according to any one of examples 1 to 15; wherein optionally the measurement data represents indications of an actual state of the one or more coating processes, e.g. when it is driven.

Example 30 is the method according to Example 29, further including: controlling one or more coating processes using the control model, for example, of the method according to any one of Examples 1 to 15.

Example 31 is a method for calibrating a coating process by means of which a substrate is coated, the method including determining a response (e.g., a first monitored process variable and/or a second monitored process variable) of the coating process to at least one variation of the coating process from a reference state, when at least one (i.e. one or more than one) actuator that supplies the coating process is actuated; determining a control model based on the response and based on a trained model generator (to which, for example, the response is supplied or which is configured to process the response, respectively); optionally the plurality of monitored process variables interacting with each other; optionally the at least one variation including a plurality of variations from the reference state which are performed in succession.

Example 32 is the method according to any of Examples 1 to 31, which is computer-assisted.

Example 33 is a control device configured (e.g., having its processor configured) to perform the method according to any one of examples 1 to 32.

Example 34 is the control device according to example 33, wherein the control device is configured to control at least one actuator (e.g. the first actuator and the second actuator) that supplies a coating process, using the one or more control elements (e.g. its actual state).

Example 35 are code segments including instructions that are configured to, when performed by a processor, cause the processor to perform the method according to any of Examples 1 to 32.

Example 36 is a non-volatile data memory including the code segments according to example 35 and/or by means of which the control device according to example 33 is configured.

Example 37 is using simulation data of at least one (e.g., modeled) coating process to train a model generator to determine a model of the at least one coating process.

The invention claimed is:

1. A method for controlling a coating process for coating a substrate, the method comprising:
measuring in parallel with each other during the coating process a plurality of monitored process variables of the coating process, wherein the coating process comprises a chemical vapor deposition-based coating process or a physical vapor deposition-based coating process;
driving a first actuator that influences supplying the coating process with a first material based on the plurality of monitored process variables measured in parallel with each other during the coating process; and
driving a second actuator that influences supplying the coating process with a second material based on the plurality of monitored process variables measured in parallel with each other during the coating process, wherein at least one of the first material or the second material comprises a gaseous material.

2. The method of to claim 1, wherein the first material comprises the gaseous material and the second material comprises an other gaseous material that is different from the gaseous material.

3. The method of claim 1, wherein each monitored process variable of the plurality of monitored process variables differs from each other monitored process variable of the plurality of monitored process variables.

4. The method of claim 1, wherein at least one of the plurality of monitored process variables represents a gas pressure of the coating process.

5. The method of claim 1, wherein at least one of the plurality of monitored process variables represents an electrical variable of the coating process.

6. The method of claim 1, wherein at least one of the plurality of monitored process variables interacts with at least another one of the plurality of monitored process variables.

7. The method of claim 1, wherein the coating process is performed in a vacuum.

8. The method of claim 1, wherein driving the first actuator is configured to influence each monitored process variable of the plurality of monitored process variables; and
wherein driving the second actuator is configured to influence each monitored process variable of the plurality of monitored process variables.

9. The method of claim 1, wherein driving the first actuator and the second actuator comprises using a control element to implement an influence of each monitored process variable of the plurality of monitored process variables on an actuator-controlling variable of the first actuator.

10. The method of claim 1, wherein driving the first actuator and the second actuator comprises using a control element to implement an influence of each monitored process variable of the plurality of monitored process variables on an actuator-controlling variable of the second actuator.

11. The method of claim 1, wherein driving the first actuator comprises using a first control element to implement an influence of the plurality of monitored process variables on a first actuator-controlling variable of the first actuator, wherein driving the second actuator comprises using a second control element to implement an influence of the plurality of monitored process variables on a second actuator-controlling variable of the second actuator, wherein driving the first actuator and driving the second actuator comprises using a third control element that links the first actuator-controlling variable and the second actuator-controlling variable.

12. The method of claim 1, wherein driving the first actuator and the second actuator comprises using a control element that is based on an interaction between the coating process and a second coating process for coating the substrate.

13. The method of claim 1, further comprising:
simulating the coating processes to generate a simulation result; and
training a model generator based on the simulation result, wherein the model generator is trained to determine a model of the coating process.

14. The method of claim 13, wherein the simulating comprises generating a plurality of simulation results after reconfiguring the model with a plurality of different configurations and using the plurality of different configurations to generate the plurality of simulation results, wherein each simulation result of the plurality of simulation results corresponds to one of the plurality of different configurations, and wherein training the model generator is based on the plurality of simulation results.

15. The method of claim 14, wherein the coating process comprises a plurality of coating processes that the model represents, and wherein reconfiguring comprises adding or removing at least one of the plurality of coating processes that the model represents, changing an interaction between at least two of the plurality of coating processes that the model represents, changing a material that is supplied to at least one of the plurality of coating processes, and/or changing an operating point of at least one of the plurality of coating processes.

16. The method of claim 13, further comprising: filtering the simulation result with a noise filter to obtain a filtered result, wherein the training is based on the filtered result, and wherein the filtering comprises increasing a variance of the simulation result and/or implementing a random number generator.

17. A method for controlling a coating process for coating a substrate, the method comprising:
   controlling a first actuator that supplies the coating process based on a plurality of monitored process variables of the coating process detected in parallel with one another; and
   controlling a second actuator that supplies the coating process based on the plurality of monitored process variables, wherein at least one of the plurality of monitored process variables interacts with at least another of the plurality of monitored process variables, wherein controlling the first actuator comprises using a first control element to influence at least one of the plurality of monitored process variables based on a first actuator-controlling variable associated with the first actuator wherein controlling the second actuator comprises using a second control element to influence at least one of the plurality of monitored process variables based on a second actuator-controlling variable associated with the second actuator, wherein the first actuator-controlling variable is linked to the second actuator-controlling variable.

18. A method for calibrating a coating process for coating a substrate, the method comprising:
   measuring in parallel with each other during the coating process a first monitored process variable and a second monitored process variable, wherein the coating process comprises a chemical vapor deposition-based coating process or a physical vapor deposition-based coating process;
   determining a first response of the first monitored process variable and the second monitored process variable of the coating process, wherein the first response results from actuating a first actuator that supplies the coating process with a gaseous material and is based on a first variation of the coating process from a reference state; and
   determining a second response of the first monitored process variable and the second monitored process variable, wherein the second response results from actuation of a second actuator that supplies the coating process with an other gaseous material and is based on a second variation of the coating process from the reference state,
   wherein determining the second response is performed after determining the first response.

19. The method of claim 18, further comprising:
   determining a control model based on the first response and based on a trained model generator.

* * * * *